United States Patent
Wang et al.

(10) Patent No.: US 12,512,424 B2
(45) Date of Patent: Dec. 30, 2025

(54) PACKAGE, PACKAGE STRUCTURE AND METHOD OF MANUFACTURING THE SAME

(71) Applicant: Taiwan Semiconductor Manufacturing Company, Ltd., Hsinchu (TW)

(72) Inventors: Chuei-Tang Wang, Taichung (TW); Chung-Hao Tsai, Changhua County (TW); Chen-Hua Yu, Hsinchu (TW); Chun-Lin Lu, Hsinchu (TW); Han-Ping Pu, Taichung (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 639 days.

(21) Appl. No.: 17/853,894

(22) Filed: Jun. 29, 2022

(65) Prior Publication Data
US 2022/0336385 A1 Oct. 20, 2022

Related U.S. Application Data

(63) Continuation of application No. 16/421,497, filed on May 24, 2019, now Pat. No. 11,424,197.

(60) Provisional application No. 62/717,003, filed on Aug. 10, 2018, provisional application No. 62/703,895, filed on Jul. 27, 2018.

(51) Int. Cl.
*H01L 23/66* (2006.01)
*H01L 21/48* (2006.01)
*H01L 21/56* (2006.01)
*H01L 23/00* (2006.01)
*H01L 23/31* (2006.01)
(Continued)

(52) U.S. Cl.
CPC .......... *H01L 23/66* (2013.01); *H01L 21/4853* (2013.01); *H01L 21/56* (2013.01); *H01L 23/3128* (2013.01); *H01L 23/3135* (2013.01); *H01L 23/49822* (2013.01); *H01L 23/49827* (2013.01); *H01L 23/49838* (2013.01); *H01L 23/552* (2013.01); *H01L 24/08* (2013.01); *H01L 24/16* (2013.01); *H01L 2223/6677* (2013.01); *H01L 2224/08225* (2013.01); *H01L 2224/16225* (2013.01)

(58) Field of Classification Search
None
See application file for complete search history.

(56) References Cited

U.S. PATENT DOCUMENTS 8,993,380 B2 3/2015 Hou et al.
9,000,584 B2 4/2015 Lin et al.
(Continued)

*Primary Examiner* — Jay C Chang
(74) *Attorney, Agent, or Firm* — JCIPRNET

(57) ABSTRACT

A package includes a semiconductor package including a semiconductor die and a first insulating encapsulation, a substrate, and a second insulating encapsulation. The first insulating encapsulation encapsulates the semiconductor die. The substrate includes a redistribution circuitry, wherein the substrate is electrically coupled to the semiconductor package through the redistribution circuitry. The second insulating encapsulation is disposed on and partially covers the substrate, wherein the substrate is sandwiched between the semiconductor package and the second insulating encapsulation.

20 Claims, 39 Drawing Sheets

(51) Int. Cl.
*H01L 23/498* (2006.01)
*H01L 23/552* (2006.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0333505 A1* | 11/2014 | Beard ................ H01Q 1/242 343/904 |
| 2019/0067219 A1* | 2/2019 | Lasiter ................ H01L 23/66 |
| 2019/0288382 A1* | 9/2019 | Kamgaing ........... H01L 23/66 |

\* cited by examiner

PACKAGE, PACKAGE STRUCTURE AND METHOD OF MANUFACTURING THE SAME

CROSS-REFERENCE TO RELATED APPLICATION

This application is a continuation application of and claims the priority benefit of a prior application Ser. No. 16/421,497, filed on May 24, 2019, now allowed, which claims the priority benefits of U.S. provisional application Ser. No. 62/703,895, filed on Jul. 27, 2018, and U.S. provisional application Ser. No. 62/717,003, filed on Aug. 10, 2018. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging. In addition, such packages may further be integrated to a semiconductor substrate or carrier after dicing.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
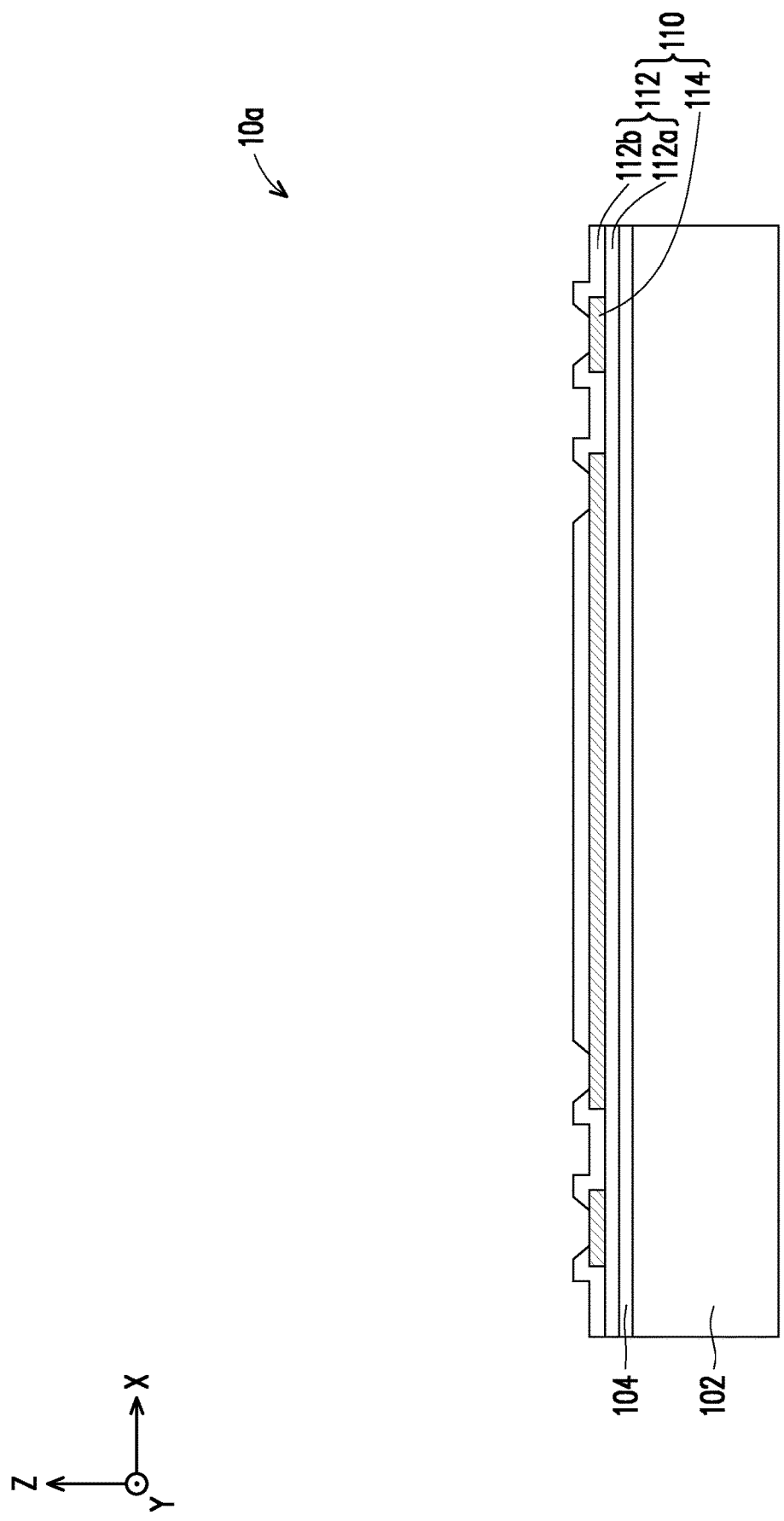
FIG. 1 to FIG. 11 are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 12:
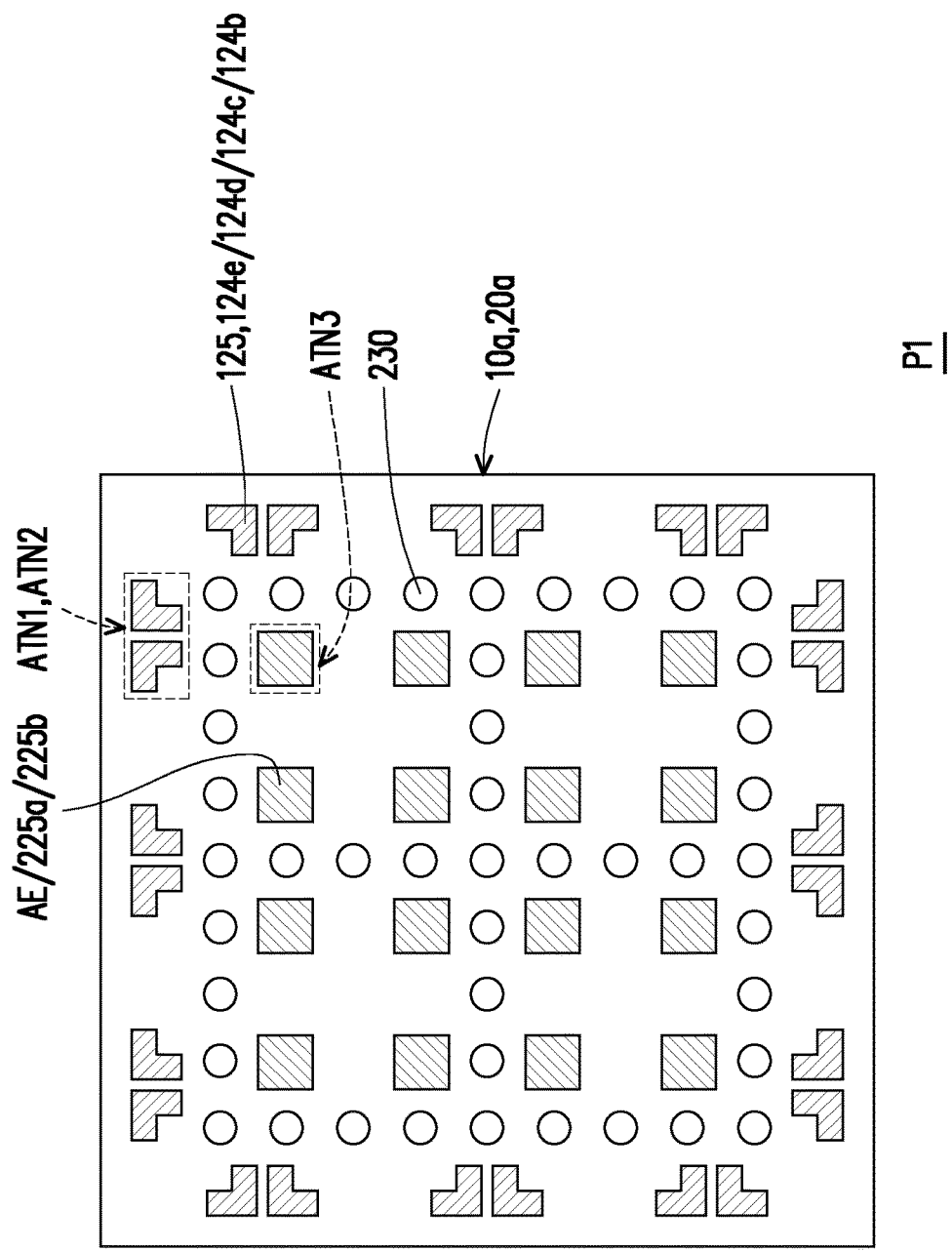
FIG. 12 is a schematic top view illustrating a relative position between antennas and conductive joints depicted in FIG. 10.
Figure 13:
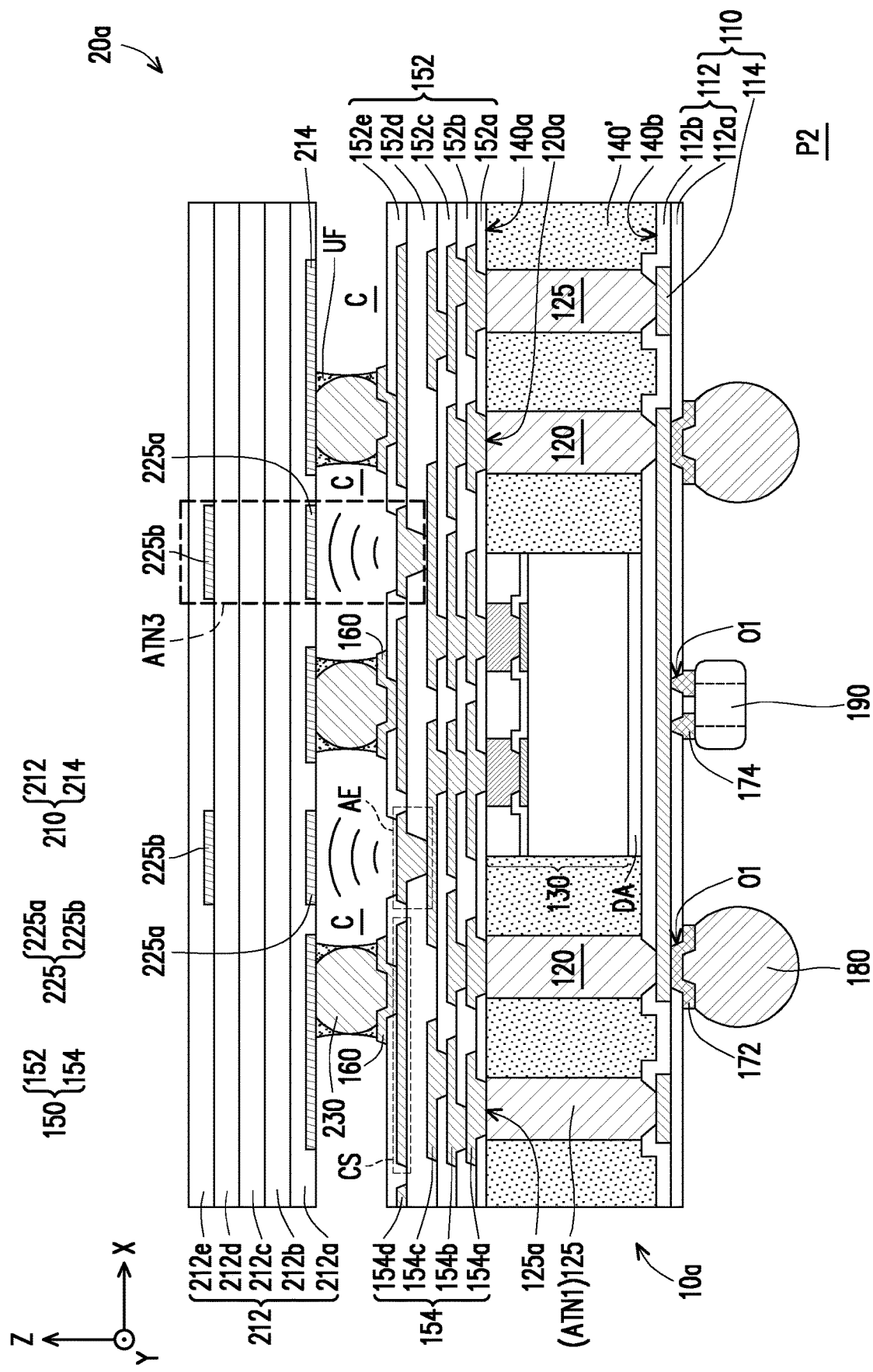
FIG. 13 is a schematic cross sectional view of a package structure according to some exemplary embodiments of the present disclosure.

FIG. 1 to FIG. 11 are schematic cross sectional views of various stages in a manufacturing method of a package structure in accordance with some embodiments of the disclosure. FIG. 12 is a schematic top view illustrating a relative position between antennas and conductive joints depicted in FIG. 10 and FIG. 11. FIG. 13 is a schematic cross sectional view of a package structure according to some exemplary embodiments of the present disclosure. In exemplary embodiments, the manufacturing method is part of a packaging process. In FIG. 1 to FIG. 11 and FIG. 13, one (semiconductor) chip or die is shown to represent plural (semiconductor) chips or dies of the wafer, and a first package 10a and a second package 20a are shown to represent a package structure P1 obtained following the manufacturing method, for example. In other embodiments, two (semiconductor) chips or dies are shown to represent plural (semiconductor) chips or dies of the wafer, and one or more first and second packages 10a, 20a are shown to represent plural (semiconductor) package structures P1 obtained following the (semiconductor) manufacturing method, the disclosure is not limited thereto.

Referring to FIG. 1, in some embodiments, a carrier 102 with a debond layer 104 coated thereon is provided. In one embodiment, the carrier 102 may be a glass carrier or any suitable carrier for carrying a semiconductor wafer or a reconstituted wafer for the manufacturing method of the semiconductor package.

In some embodiments, the debond layer 104 is disposed on the carrier 102, and the material of the debond layer 104 may be any material suitable for bonding and debonding the carrier 102 from the above layer(s) or any wafer(s) disposed thereon. In some embodiments, the debond layer 104 may include a release layer (such as a light-to-heat conversion ("LTHC") layer) or an adhesive layer (such as an ultra-violet curable adhesive or a heat curable adhesive layer).

Continued on FIG. 1, in some embodiments, a redistribution circuit structure 110 is formed over the carrier 102. For example, in FIG. 1, the redistribution circuit structure 110 is formed on the debond layer 104, and the formation of the redistribution circuit structure 110 includes sequentially forming one or more dielectric layers 112 and one or more metallization layers 114 in alternation. In some embodiments, the redistribution circuit structure 110 includes two dielectric layers 112 (e.g. a dielectric layer 112a and a dielectric layer 112b) and one metallization layer 114 as shown in FIG. 1, where the metallization layer 114 is sandwiched between the dielectric layer 112a and the dielectric layer 112b of the dielectric layers 112, and portions of a top surface of the metallization layer 114 are respectively exposed by the openings of a topmost layer (e.g. the dielectric layer 112b) of the dielectric layers 112. However, the disclosure is not limited thereto. The numbers of the metallization layers and the dielectric layers included in the redistribution circuit structure 110 is not limited thereto, and may be designated and selected based on the demand. For example, the numbers of the metallization layers and the dielectric layers may be one or more than one.

In certain embodiments, the material of the dielectric layers 112 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 112 is formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 114 may be made of conductive materials formed by electroplating or deposition, such as aluminum, titanium, copper, nickel, tungsten, and/or alloys thereof, which may be patterned using a photolithography and etching process. In some embodiments, the metallization layer 114 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
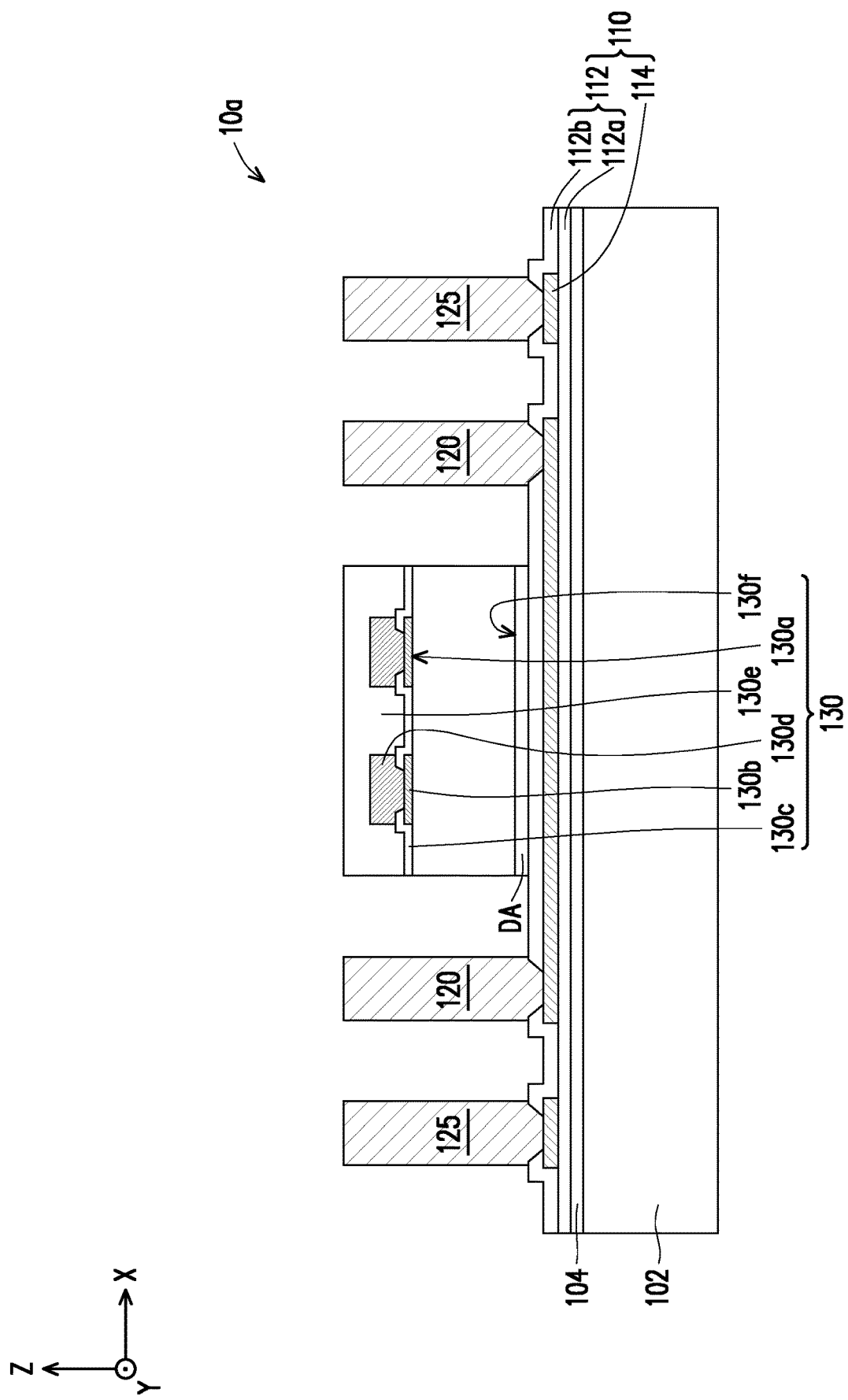

Referring to FIG. 2, in some embodiments, conductive pillars 120 are formed on the redistribution circuit structure 110. In some embodiments, the conductive pillars 120 may be through vias, such as through integrated fan-out (InFO) vias. For simplification, only two conductive pillars 120 are presented in FIG. 2 for illustrative purposes, however it should be noted that the number of the conductive pillars 120 may be less than two or more than two; the disclosure is not limited thereto. The number of the conductive pillars 120 to be formed can be selected based on the demand.

In some embodiments, the conductive pillars 120 are formed by photolithography, plating, photoresist stripping processes or any other suitable method. In one embodiment, the conductive pillars 120 may be formed by forming a mask pattern (not shown) covering the redistribution circuit structure 110 with openings exposing the top surface of the metallization layer 114 exposed by the topmost layer (e.g. the dielectric layer 112b) of the dielectric layers 112, forming a metallic material filling the openings to form the conductive pillars 120 by electroplating or deposition and then removing the mask pattern. In one embodiment, the material of the conductive pillars 120 may include a metal material such as copper or copper alloys, or the like. However, the disclosure is not limited thereto.

Continued on FIG. 2, in some embodiments, at least one semiconductor die 130 with a connecting film DA disposed thereon is provided, where the semiconductor die 130 has an active surface 130a and a backside surface 130f opposite to the active surface 130a. As shown in FIG. 2, the semiconductor die 130 is disposed on the redistribution circuit structure 110 and over the carrier 102 through the connecting film DA. In some embodiments, the connecting film DA is located between the semiconductor die 130 and the redistribution circuit structure 110, and the connecting film DA is physically contacts the backside surface 130f of the semiconductor die 130 and the redistribution circuit structure 110 (e.g. the topmost layer (e.g. the dielectric layer 112b) of the dielectric layers 112 of the redistribution circuit structure 110). In some embodiments, due to the connecting film DA provided between the semiconductor die 130 and the redistribution circuit structure 110, the semiconductor die 130 and the redistribution circuit structure 110 are stably adhered to each other. In some embodiments, the connecting film DA may be, for example, a semiconductor die attach film, a layer made of adhesives or epoxy resin, or the like. In some embodiments, the redistribution circuit structure 110 is referred to as a back-side redistribution layer of the semiconductor die 130 for providing routing function.

In some embodiments, as shown in FIG. 2, the semiconductor die 130 includes the active surface 130a, a plurality of pads 130b distributed on the active surface 130a, a passivation layer 130c covering the active surface 130a exposed by the pads 130b and a portion of the pads 130b, a plurality of conductive vias 130d connected to the portion of the pads 130b exposed by the passivation layer 130c and a portion of the passivation layer 130c, a protection layer 130e covering the conductive vias 130d and the passivation layer 130c exposed by the conductive vias 130d, and the backside surface 130f opposite to the active surface 130a. The pads 130b are partially covered by the passivation layer 130c, the conductive vias 130d are directly disposed on and electrically connected to the pads 130b, and the protection layer 130e covers the passivation layer 130c and the conductive vias 130d.

In some embodiments, the pads 130b may be aluminum pads or other suitable metal pads. In some embodiments, the conductive vias 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the conductive vias 130d and the protection layer 130e may be omitted; that is, the semiconductor die 130 may include the pads 130b distributed on the active surface 130a, the passivation layer 130c covering the active surface 130a and the pads 130b, and the backside surface 130f opposite to the active surface 130a. The disclosure is not limited thereto.

In some embodiments, only one semiconductor die 130 is presented for illustrative purposes, however it should be noted that one or more semiconductor dies may be provided. In some embodiments, the semiconductor die 130 described herein may be referred to as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred to as a chip or a IC of combination-type, and the semiconductor die 130 may be a WiFi chip simultaneously including both of a RF chip and a digital chip. The disclosure is not limited thereto.

As shown in FIG. 2, in some embodiments, the conductive pillars 120 are located aside of a location of the semiconductor die 130, and are mechanically and electrically connected to the metallization layer 114 of the redistribution circuit structure 110. In FIG. 2, a height of the conductive pillars 120 is greater than a height of the at least one semiconductor die 130, for example; however, the disclosure is not limited thereto. In an alternative embodiment, the height of the conductive pillars 120 may be less than or substantially equal to the height of the at least one semiconductor die 130. In one embodiment, the conductive pillars 120 may be formed prior to the formation of the semiconductor die 130. In an alternative embodiment, the conductive pillars 120 may be formed after the formation of the semiconductor die 130. The disclosure is not limited to the disclosure.

In some embodiments, antenna elements 125 are formed on the redistribution circuit structure 110. In one embodiment, the conductive pillars 120 and the antenna elements 125 may be formed in the same step with the same method and material. In an alternative embodiment, the conductive pillars 120 and the antenna elements 125 may be formed in a different step with the same or different methods and materials. The disclosure is not limited thereto. For example, the formation and the material of the antenna elements 125 may be the same or different form the formation and the material of the conductive pillars 120. For simplification, only two antenna elements 125 are presented in FIG. 2 for illustrative purposes, however it should be noted that the number of the antenna elements 125 may be less than two or more than two; the disclosure is not limited thereto. The number of the antenna elements 125 to be formed can be selected based on the demand.

In some embodiments, the antenna elements 125 are located aside of the positioning locations of the semiconductor die 130 and the conductive pillars 120. In some embodiments, the antenna elements 125 may be dipole antennas. For example, a pair of two adjacent antenna elements 125 constitute an end-fire radiation antenna with horizontal polarization (e.g. polarizing in a direction X or a direction Y) or end-fire radiation antenna with vertical polarization (e.g. polarizing in a direction Z), which is also referred to as an antenna ATN1. In one embodiment, one of the pair antenna elements 125 is electrically connected to a portion of the redistribution circuit structure 110 (serving as a feed line); and the other one of the antenna elements 125 is electrically connected to another portion of the redistribution circuit structure 110 (serving as a ground plate/line).

The disclosure is not limited thereto. In an alternative embodiment, with a later-formed redistribution circuit structure on the semiconductor die 130, the conductive pillars 120 and the antenna elements 125, a pair of two adjacent antenna elements 125 constitutes an end-fire radiation antenna, where one of the antenna elements 125 is electrically connected to a portion of the later-formed redistribution circuit structure (serving as a feed line); and the other one of the antenna elements 125 is electrically connected to another portion of the later-formed redistribution circuit structure (serving as a ground plate/line). In a further alternative embodiment, with a later-formed redistribution circuit structure on the semiconductor die 130, the conductive pillars 120 and the antenna elements 125, a pair of two adjacent antenna elements 125 constitutes an end-fire radiation antenna, where one of the antenna elements 125 is electrically connected to a portion of one of the redistribution circuit structure 110 and the later-formed redistribution circuit structure (serving as a feed line); and the other one of the antenna elements 125 is electrically connected to another portion of other one of the redistribution circuit structure 110 and the later-formed redistribution circuit structure (serving as a ground plate/line). As shown in FIG. 2, for example, each pair of the antenna elements 125 (e.g. the antennas ATN1) are arranged along the edges of the first package 10a (see FIG. 12). In some embodiments, the antennas ATN1 are electrically connected to the semiconductor die 130 through the redistribution circuit structure 110 and later-formed redistribution circuit structure (e.g. a redistribution circuit structure 150 described in FIG. 5), where the signal transmission between the semiconductor die 130 and the antennas ATN1 is ensured.

However, in certain embodiments, the antenna elements 125 (e.g. the antenna ATN1) may be omitted from the first package 10a. The disclosure is not limited thereto.

Figure 3:
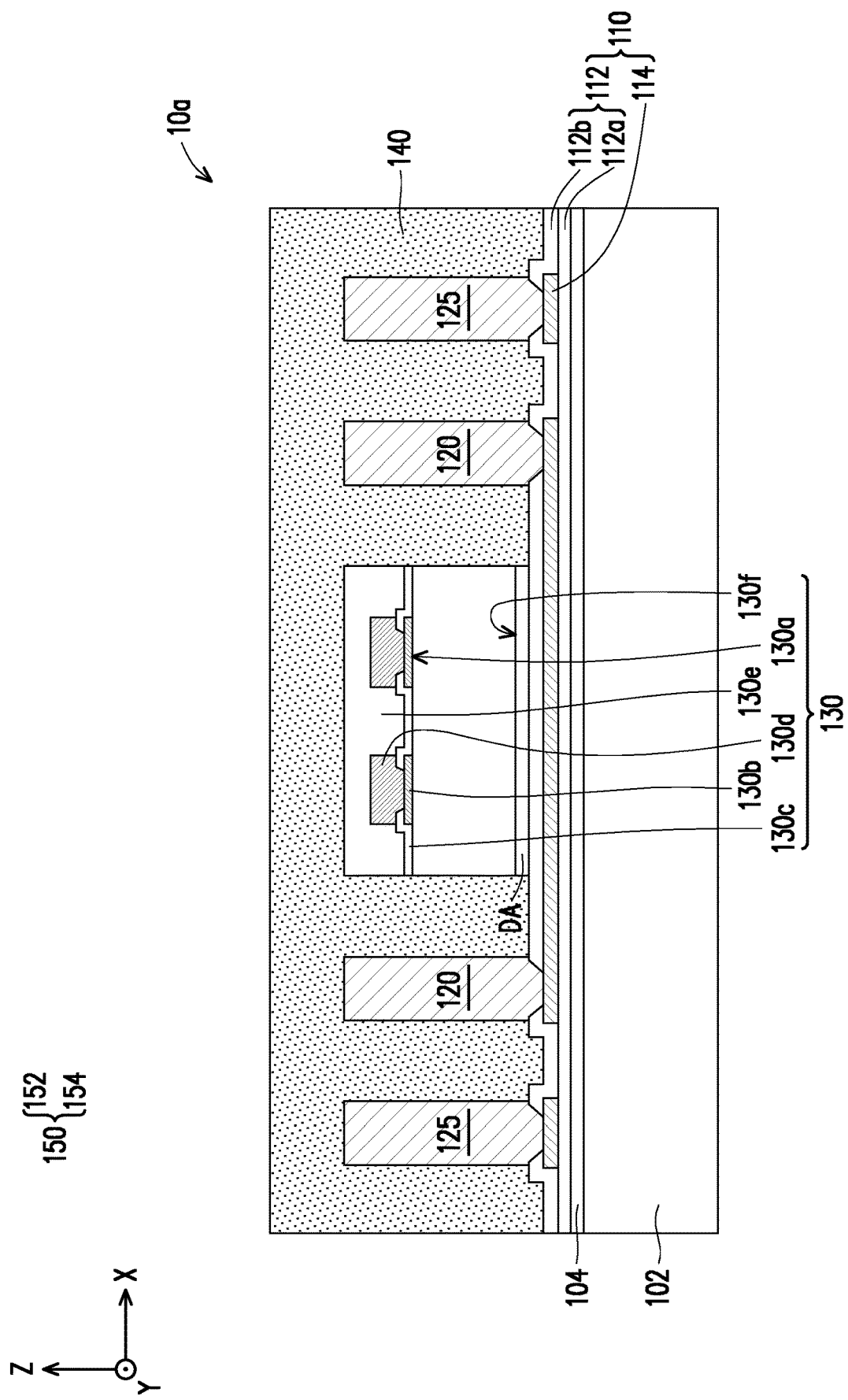

Referring to FIG. 3, in some embodiments, the conductive pillars 120, the antenna elements 125 and the semiconductor die 130 are encapsulated in an insulating encapsulation 140. In some embodiments, the insulating encapsulation 140 is formed on the redistribution circuit structure 110 and over the carrier 102. As shown in FIG. 3, the insulating encapsulation 140 at least fills up the gaps between the conductive pillars 120 and between the antenna elements 125 and the gaps between the conductive pillars 120, the antenna elements 125, the semiconductor die 130, and the connecting film DA. In some embodiments, the insulating encapsulation 140 covers the conductive pillars 120, the antenna elements 125, the redistribution circuit structure 110 and the connecting film DA. In certain embodiments, as shown in FIG. 3, the conductive pillars 120, the antenna elements 125, and the semiconductor die 130 are not accessibly revealed by and embedded in the insulating encapsulation 140.

In some embodiments, the insulating encapsulation 140 covers the conductive pillars 120, the antenna elements 125, the semiconductor die 130, and the redistribution circuit structure 110 exposed from the conductive pillars 120, the antenna elements 125, and the semiconductor die 130. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity (Dk) and low loss tangent (Df) properties, or other suitable materials. For example, a value of low Dk is less than 4, and a value of low Df is less than 0.009. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 4:
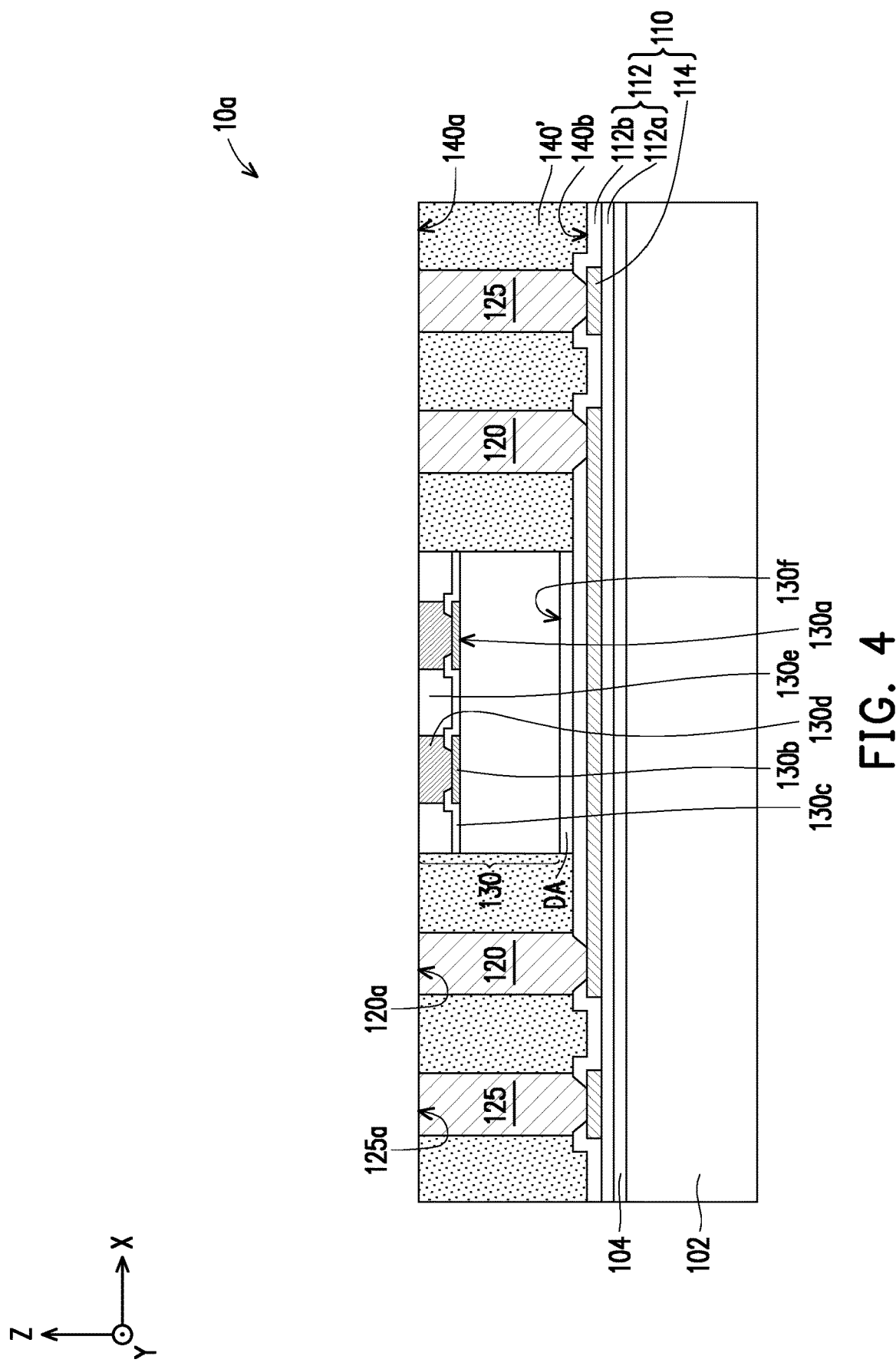

Referring to FIG. 4, in some embodiments, the insulating encapsulation 140 is planarized to form an insulating encapsulation 140' exposing the conductive pillars 120, the antenna elements 125, and the semiconductor die 130. In certain embodiments, as shown in FIG. 4, after the planarization, top surfaces 120a of the conductive pillars 120, top surfaces 125a of the antenna elements 125, and a top surface of the semiconductor die 130 (e.g. top surfaces of the conductive vias 130d and the protection layer 130e) are exposed by a top surface 140a of the insulating encapsulation 140'. That is, for example, the top surfaces 120a of the conductive pillars 120, the top surfaces 125a of the antenna elements 125, and the top surface of the semiconductor die 130 become substantially leveled with the top surface 140a of the insulating encapsulation 140'. In other words, the top surfaces 120a of the conductive pillars 120, the top surfaces 125a of the antenna elements 125, the top surface of the semiconductor die 130, and the top surface 140a of the insulating encapsulation 140' are substantially coplanar to each other. In some embodiments, as shown in FIG. 4, the conductive pillars 120, the antenna elements 125, and the semiconductor die 130 are accessibly revealed by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor die 130, the conductive pillars 120, and the antenna elements 125 may also be planarized. In certain embodiments, the planarizing step may, for example, performed on the over-molded insulating encapsulation 140 to level the top surface 140a of the insulating encapsulation 140', the top surfaces 120a of the conductive pillars 120, the top surfaces 125a of the antenna elements 125, and the top surfaces of the conductive vias 130d and the protection layer 130e of the semiconductor die 130.

Figure 5:
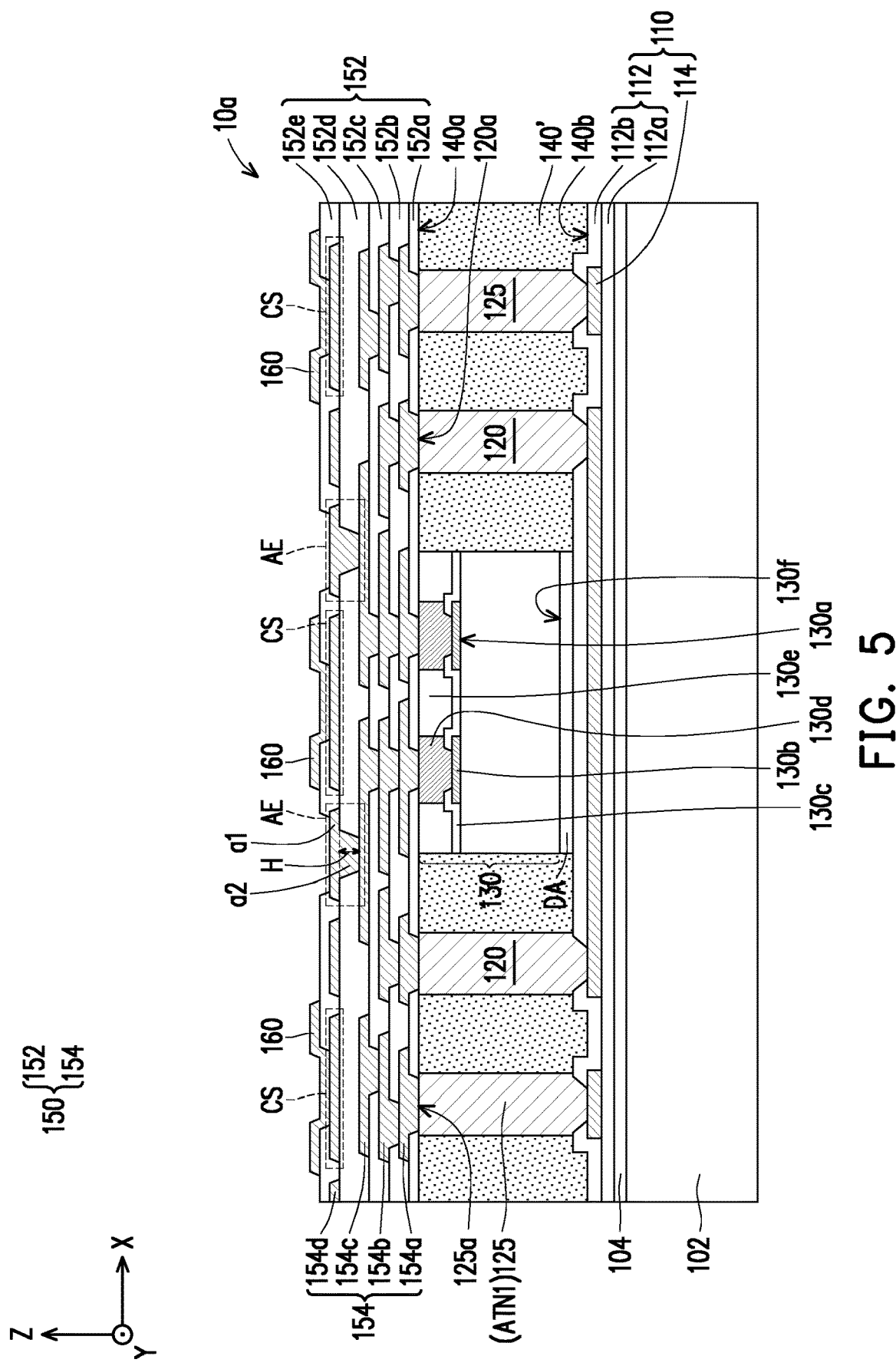

Referring to FIG. 5, in some embodiments, the redistribution circuit structure 150 is formed on the conductive pillars 120, the antenna elements 125, the semiconductor die 130, and the insulating encapsulation 140'. As shown in FIG. 5, the redistribution circuit structure 150 is formed on the top surfaces 120a of the conductive pillars 120, the top surfaces 125a of the antenna elements 125, the top surfaces of the conductive vias 130d and the protection layer 130e of the semiconductor die 130 and the top surface 140a of the insulating encapsulation 140'. In some embodiments, the redistribution circuit structure 150 is electrically connected to the conductive pillars 120 and the antenna elements 125, and is electrically connected to the semiconductor die 130 through the conductive vias 130d and the pads 130b. In some embodiments, through the redistribution circuit structure 150, the semiconductor die 130 is electrically connected to the conductive pillars 120. In some embodiments, through the redistribution circuit structure 150, the semiconductor die 130 is electrically connected to the antenna elements 125. In some embodiments, through the redistribution circuit structure 150 and the conductive pillars 120, the semiconductor die 130 is electrically connected to the redistribution circuit structure 110. As shown in FIG. 5, for example, the redistribution circuit structure 150 is referred to as a front-side redistribution layer of the semiconductor die 130 for providing routing function.

In some embodiments, as shown in FIG. 5, the semiconductor die 130 is directly located between the redistribution circuit structure 150 and the connecting film DA, where the conductive pillars 120, the antenna elements 125, and the insulating encapsulation 140' are directly located between the redistribution circuit structure 150 and the redistribution circuit structure 110. In other words, the redistribution circuit structure 110 and the redistribution circuit structure 150 are located at two opposite sides of the insulating encapsulation 140', where the redistribution circuit structure 110 is disposed on a bottom surface 140b of the insulating encapsulation 140' and the redistribution circuit structure 150 is disposed on the top surface 140a of the insulating encapsulation 140'.

In some embodiments, the formation of the redistribution circuit structure 150 includes sequentially forming one or more dielectric layers 152 and one or more metallization layers 154 in alternation. In certain embodiments, as shown in FIG. 5, the metallization layers 154 are sandwiched between the dielectric layers 152. For example, the dielectric layers 152 include a dielectric layer 152a, a dielectric layer 152b, a dielectric layer 152c, a dielectric layer 152d, and a dielectric layer 152e, and the metallization layers 154 include a metallization layer 154a, a metallization layer 154b, a metallization layer 154c, and a metallization layer 154d, where the metallization layer 154a is sandwiched between the dielectric layer 152a and the dielectric layer 152b, the metallization layer 154b is sandwiched between the dielectric layer 152b and the dielectric layer 152c, the metallization layer 154c is sandwiched between the dielectric layer 152c and the dielectric layer 152d, and the metallization layer 154d is sandwiched between the dielectric layer 152d and the dielectric layer 152e.

In other words, in some embodiments, the dielectric layer 152a, the metallization layer 154a, the dielectric layer 152b, the metallization layer 154b, the dielectric layer 152c, the metallization layer 154c, the dielectric layer 152d, the metallization layer 154d and the dielectric layer 152e are sequentially formed. As shown in FIG. 5, the top surface of a topmost layer (e.g. the metallization layer 154d) of the metallization layers 154 is exposed by a topmost layer (e.g. the dielectric layer 152e) of the dielectric layers 152 and the bottom surface of a bottommost layer (e.g. the metallization layer 154a) of the metallization layers 154 is exposed by a bottommost layer (e.g. the dielectric layer 152a) of the dielectric layers 152 to mechanically and electrically connect the conductive pillars 120, the antenna elements 125, and the conductive vias 130d of the semiconductor die 130, for example.

In certain embodiments, the formation of the dielectric layers 152 may be the same as the formation of the dielectric layers 112, and the formation of the metallization layers 154 may be the same as the formation of the metallization layer 114, thus may not be repeated herein. In an alternative embodiment, the material of the dielectric layers 152 may be the same as or different from the material of the dielectric layers 112. In an alternative embodiment, the material of the metallization layers 154 may be the same as or different from the material of the metallization layer 114. The disclosure is not limited thereto. It should be noted that the redistribution circuit structure 150 is not limited to include five dielectric layers and/or four metallization layers. For example, the numbers of the metallization layers and the dielectric layers included in the redistribution circuit structure 150 may be one or more than one. As shown in FIG. 5, in certain embodiments, the conductive pillars 120, the redistribution circuit structure 110 and the redistribution circuit structure 150 together and/or individually provide a routing function for the semiconductor die 130.

Continued on FIG. 5, in some embodiments, a plurality of connecting structures CS and a plurality of antenna elements AE are formed in the redistribution circuit structure 150. For example, the connecting structures CS, the antenna elements AE, and the metallization layer 154d are formed in the same step, and the materials of the connecting structures CS and the antenna elements AE is the same or similar to the material of the metallization layer 154d, thus may not be repeated herein. The number of the connecting structures CS and the number of the antenna elements AE are not limited to FIG. 5, and may be selected for designed based on the demand and the design layout.

In some embodiments, the connecting structures CS are embedded in and electrically connected to the redistribution circuit structure 150, and are further exposed by the dielectric layer 152e. For example, as shown in FIG. 5, the connecting structures CS are electrically connected to the semiconductor die 130 through the redistribution circuit structure 150. In certain embodiments, a plurality of under-ball metallurgy (UBM) patterns 160 are disposed on the connecting structures CS for electrically connecting with overlying connectors (e.g. conductive balls or conductive bumps). As shown in FIG. 5, for example, the UBM patterns 160 are directly formed on and electrically connected to the connecting structures CS. In some embodiments, a material of the UBM patterns 160 may include copper, nickel, titanium, tungsten, or alloys thereof or the like, and may be formed by an electroplating process, for example. The number of the UBM patterns 160 is not limited in this disclosure, and may be selected based on the design layout.

In some embodiments, the antenna elements AE are embedded in and electrically connected to the redistribution circuit structure 150, and are further exposed by the dielectric layer 152e. For example, as shown in FIG. 5, the antenna elements AE each are electrically connected to the semiconductor die 130 through the redistribution circuit structure 150. In some embodiments, the antenna elements AE each includes an upper portion a1 and a lower portion a2 physically connecting to the upper portions a1 along a stacking direction thereof (e.g. the (stacking) direction Z), where the upper portion a1 directly overlies on the lower portion a2, a sidewall of the lower portion a2 is wrapped by the dielectric layer 152d, and a sidewall of the upper portion a1 is wrapped by the dielectric layer 152e. In some embodiments, the antenna elements AE are used for electrically coupling to other later-formed or later-provided antenna elements, where the antenna elements AE and the other later-formed or later-provided antenna elements electrically coupled thereto work together for antenna application. As shown in FIG. 5, for example, a thickness H of the lower portion a2 of each of the antenna elements AE is approximately about 60 µm to about 80 µm to ensure stability of signal transmitting between the antenna elements AE and the semiconductor die 130. In other words, for example, the thickness H may also be referred to as a distance between the connecting structures CS and the metallization layer 154c.

Figure 6:
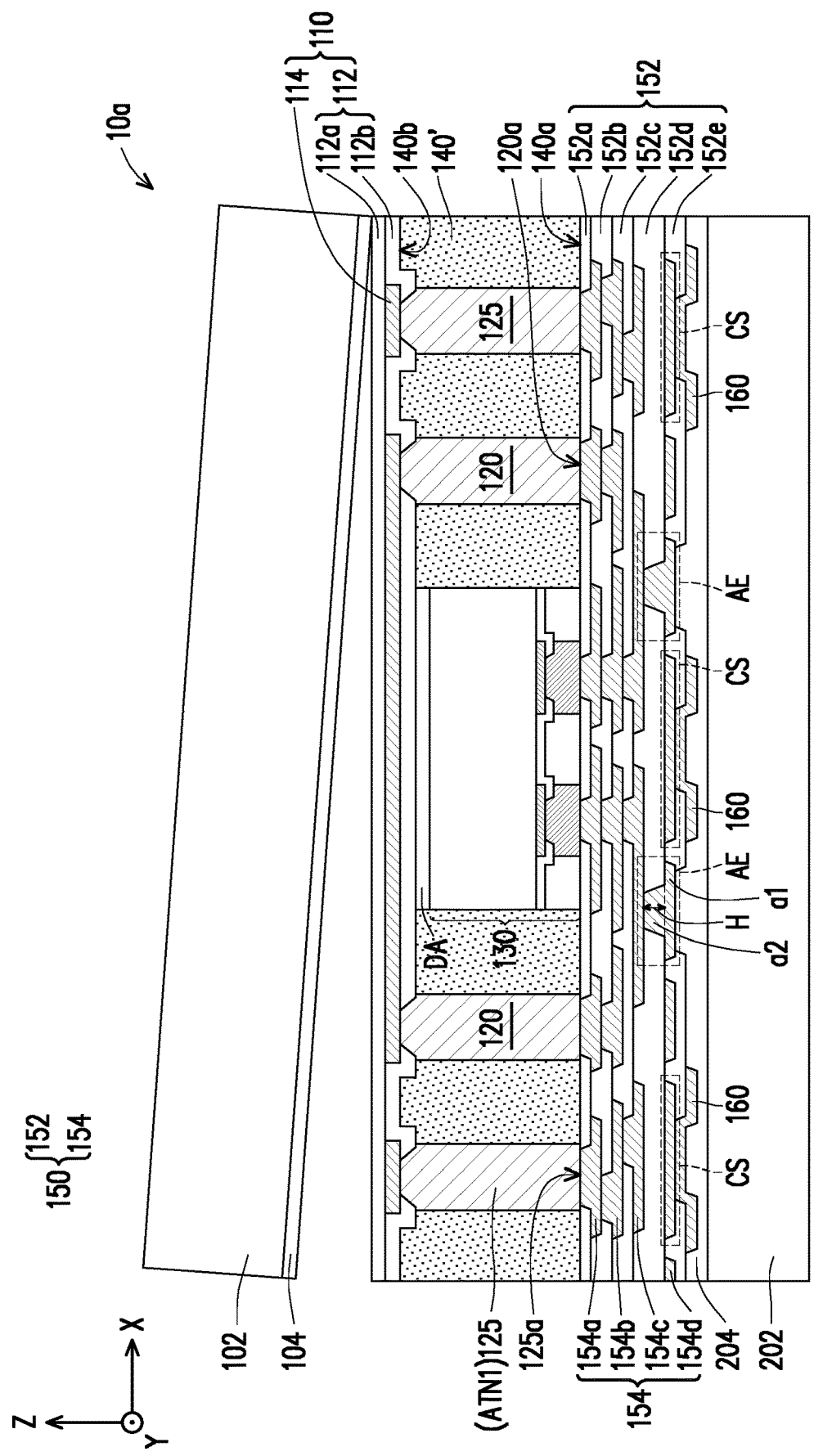

Referring to FIG. 6, in some embodiments, the whole structure depicted in FIG. 5 (e.g. the first package 10a) along with the carrier 102 is flipped (turned upside down), and the redistribution circuit structure 150 is placed on a carrier 202 provided with a debond layer 204. The material of the carrier 202 may be the same or similar to the material of the carrier 102, in some embodiments, thus may not be repeated herein. As shown in FIG. 6, portions of the UBM patterns 160, which protrude out of the redistribution circuit structure 150, are embedded in the debond layer 204 to ensure the position of the first package 10a. The material of the debond layer 204, for example, may be the same or similar to the material of the debond layer 104. In certain embodiments, the material of the debond layer 204 may include a polymer film having sufficient elasticity to allow the UBM patterns 160 being embedded therein.

Continued on FIG. 6, in some embodiments, after the redistribution circuit structure 150 is placed on the carrier 202, the carrier 102 is debonded from the redistribution circuit structure 110. In some embodiments, the redistribution circuit structure 110 is easily separated from the carrier 102 due to the debond layer 104, and the lowest layer (e.g. the dielectric layer 112a) of the dielectric layers 112 of the redistribution circuit structure 110 is exposed. In some embodiments, the carrier 102 is detached from the redistribution circuit structure 110 through a debonding process, and the carrier 102 and the debond layer 104 are removed. In one embodiment, the debonding process is a laser debonding process.

Figure 7:
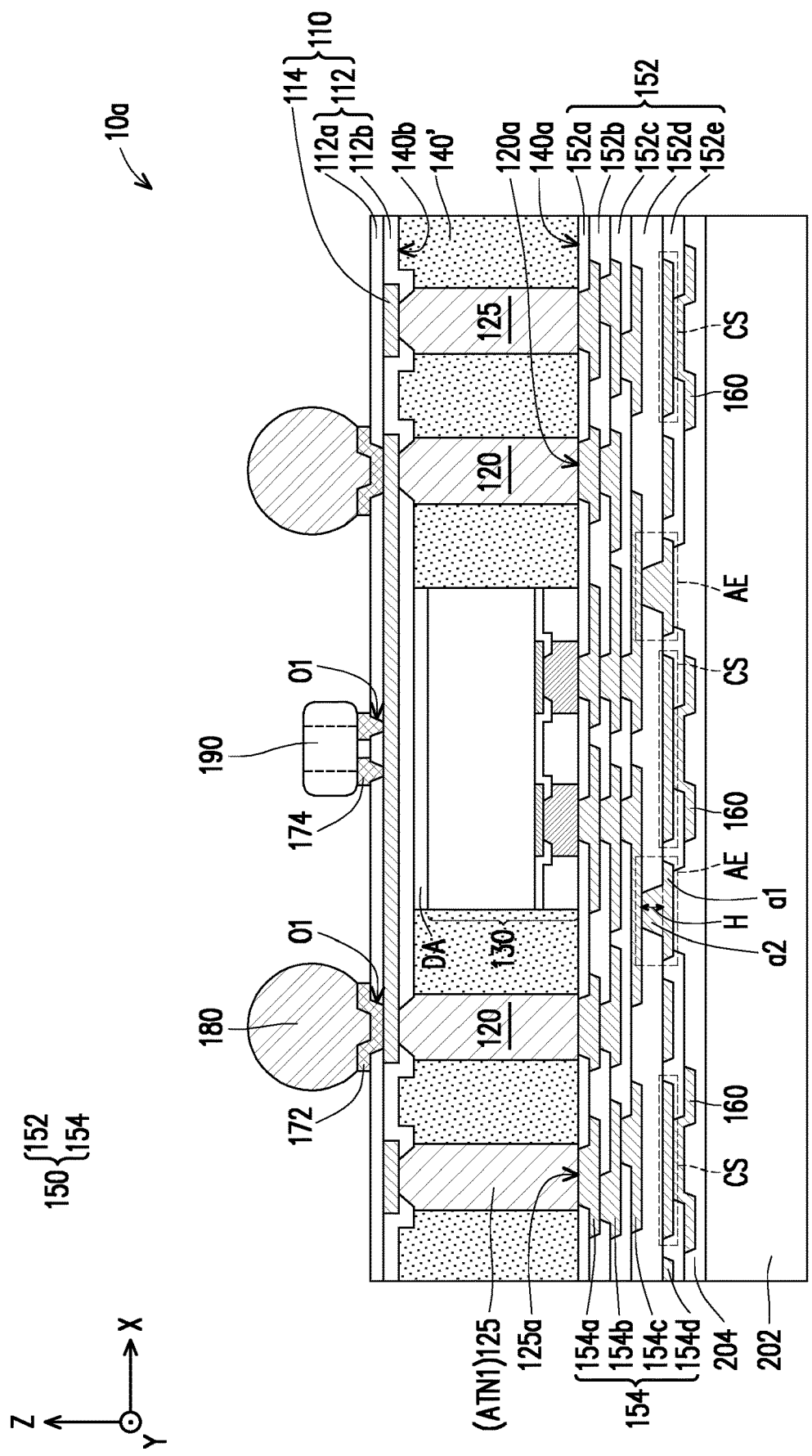

Referring to FIG. 7, in some embodiments, the lowest layer (e.g. the dielectric layer 112a) of the dielectric layers 112 of the redistribution circuit structure 110 is further patterned to form a plurality of contact openings (or recesses) O1 exposing portions of a surface of the metallization layer 114 of the redistribution circuit structure 110. The number of the contact openings O1 is not limited in the disclosure, and may be selected based on the demand and the design layout. In some embodiments, the contact openings O1 located in the lowest layer (e.g. the dielectric layer 112a) of the dielectric layers 112 are formed by laser drilling process or other suitable processes.

In some embodiments, after the contact openings O1 are formed in the dielectric layer 112a, a plurality of UBM patterns 172 may be disposed on the exposed surface of the metallization layers 114 by a portion of the contact openings O1 for electrically connecting with conductive elements (e.g. conductive balls) and/or connection pads 174 may be disposed on the exposed surface of the metallization layers 114 by other portion of the contact openings O1 for electrically connecting with at least one semiconductor elements (e.g. passive components or active components). As shown in FIG. 7, for example, the UBM patterns 172 and the connection pads 174 are formed on and electrically connected to the redistribution circuit structure 110. In some embodiments, the materials of the UBM patterns 172 and the connection pads 174 may include copper, nickel, titanium, tungsten, or alloys thereof or the like, and may be formed by an electroplating process, for example.

In one embodiment, the material of the UBM patterns 172 may be the same as that of the connection pads 174. In another embodiment, the material of the UBM patterns 172 may be different from that of the connection pads 174. In one embodiment, there may be only the UBM patterns 172 presented in the first package 10a; however, in an alternative embodiment, there may be only the connection pads 174 presented in the first package 10a. The numbers of the UBM patterns 172 and the connection pads 174 are not limited in this disclosure, and may be selected based on the design layout and controlled by adjusting the number of the contact openings O1.

Continued on FIG. 7, in some embodiments, a plurality of conductive elements 180 are formed on the redistribution circuit structure 110. As shown in FIG. 7, the conductive elements 180 are disposed on the UBM patterns 172 over the redistribution circuit structure 110. In some embodiments, the conductive elements 180 may be disposed on the UBM patterns 172 by ball placement process or reflow process. In some embodiments, the conductive elements 180 are, for example, solder balls or ball grid array (BGA) balls. In some embodiments, the conductive elements 180 are connected to the redistribution circuit structure 110 through the UBM patterns 172. As shown in the FIG. 7, some of the conductive elements 180 are electrically connected to the conductive pillars 120 through the UBM patterns 172 and the redistribution circuit structure 110; some of the conductive elements 180 are electrically connected to the semiconductor die 130 through the UBM patterns 172, the redistribution circuit structure 110, and the conductive pillars 120; and some of the conductive elements 180 are electrically connected to the redistribution circuit structure 150 through the UBM patterns 172, the redistribution circuit structure 110, and the conductive pillars 120. The number of the conductive elements 180 is not limited to the disclosure, and may be designated and selected based on the number of the UBM patterns 172.

In some embodiments, one or more semiconductor devices 190 are provided and disposed on the redistribution circuit structure 110. As shown in FIG. 7, the semiconductor devices 190 are disposed on the connection pads 174, and are connected to the redistribution circuit structure 110 through the connection pads 174. In some embodiments, the semiconductor devices 190 may be disposed on the connection pads 174 through reflow process or flip chip bonding process. In some embodiments, the conductive elements 180 and the semiconductor devices 190 are formed on one side of the redistribution circuit structure 110, wherein the redistribution circuit structure 110 is located between the insulating encapsulation 140' and the conductive elements 180 and between the insulating encapsulation 140' and the semiconductor devices 190. In some embodiments, as shown in FIG. 7, the semiconductor devices 190 include surface mount devices (e.g. passive devices, such as, capacitors, resistors, inductors, combinations thereof, or the like), however the disclose is not limited thereto. The number of the semiconductor devices 190 can be selected based on the number of the connection pads 174. In an alternative embodiment, the semiconductor devices 190 may include surface mount devices of the same type or different types, the disclosure is not limited thereto. In other alternative embodiments, the semiconductor devices 190 are optional, and may be omitted.

In some embodiments, the semiconductor devices 190 may be formed prior to the formation of the conductive elements 180. In an alternative embodiment, the conductive elements 180 may be formed after the formation of the semiconductor devices 190. The disclosure is not limited to the disclosure.

Figure 8:
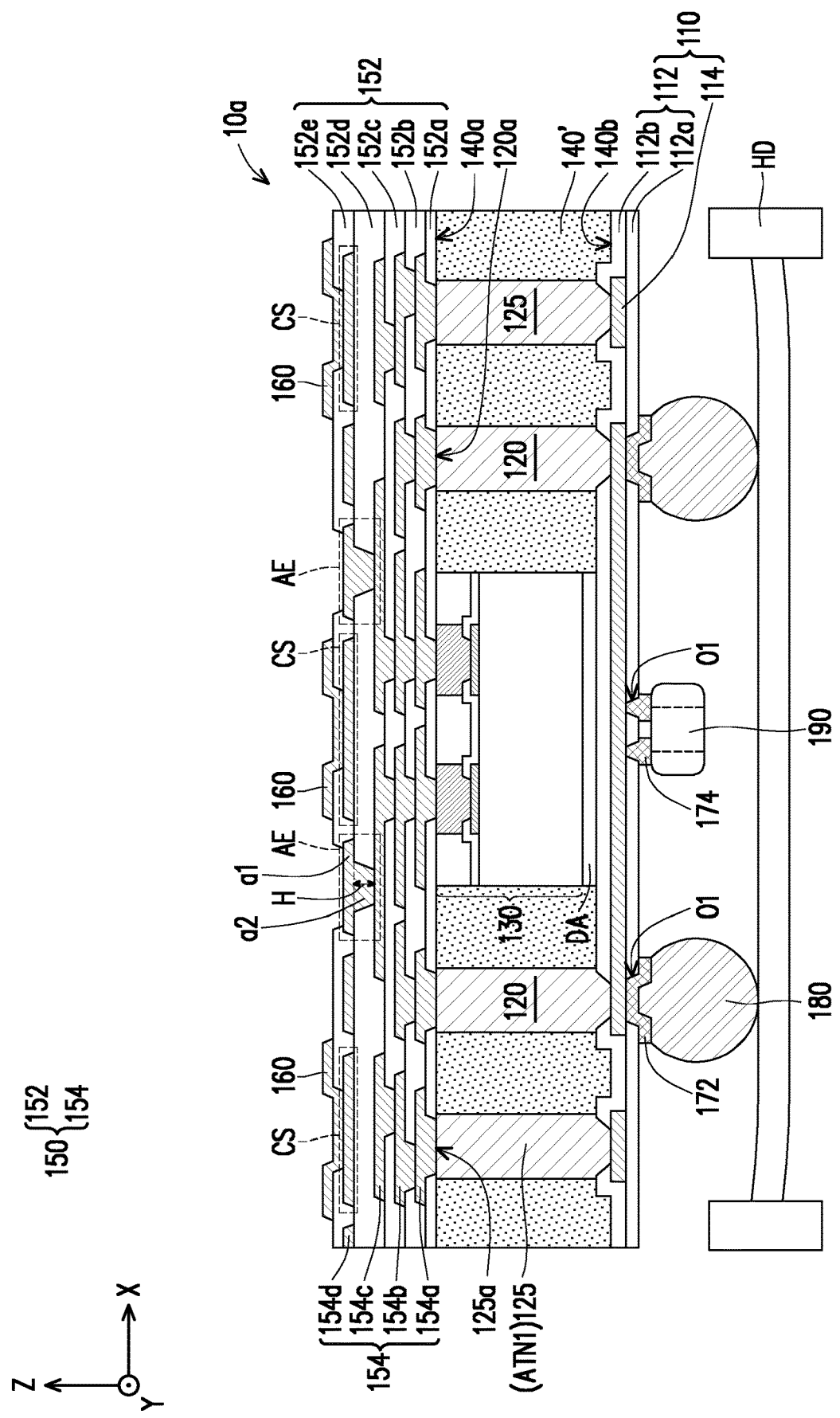

Referring to FIG. 8, in some embodiments, the whole first package 10a along with the carrier 202 is flipped (turned upside down), where the conductive elements 180 and the semiconductor devices 190 are placed to a holding device HD, and the carrier 202 is then debonded from the redistribution circuit structure 150. In some embodiments, the holding device HD may be an adhesive tape, a carrier film or a suction pad. The disclosure is not limited thereto.

In some embodiments, the redistribution circuit structure 150 is easily separated from the carrier 202 due to the debond layer 204. In some embodiments, the carrier 202 is detached from the redistribution circuit structure 150 through a debonding process, and the carrier 202 and the debond layer 204 are removed. In certain embodiments, the redistribution circuit structure 150 is exposed, as show in FIG. 8. In one embodiment, the debonding process is a laser debonding process. During the debonding step, the holding device HD is used to secure the first package 10a before debonding the carrier 202 and the debond layer 204.

In some embodiments, prior to flipping the first package 10a depicted in FIG. 7 and debonding the carrier 202 therefrom, a pre-cutting step is performed to the first package 10a. For example, the pre-cutting step cut through at least the redistribution circuit structure 110, the insulating encapsulation 140', and the redistribution circuit structure 150 of the first package 10a. The pre-cutting step may, for example, include laser cut, or the like. Due to the pre-cutting step, the first packages 10a interconnected therebetween are partially diced; and due to the debonding step, the partially diced first packages 10a are entirely separated from one another.

Figure 9:
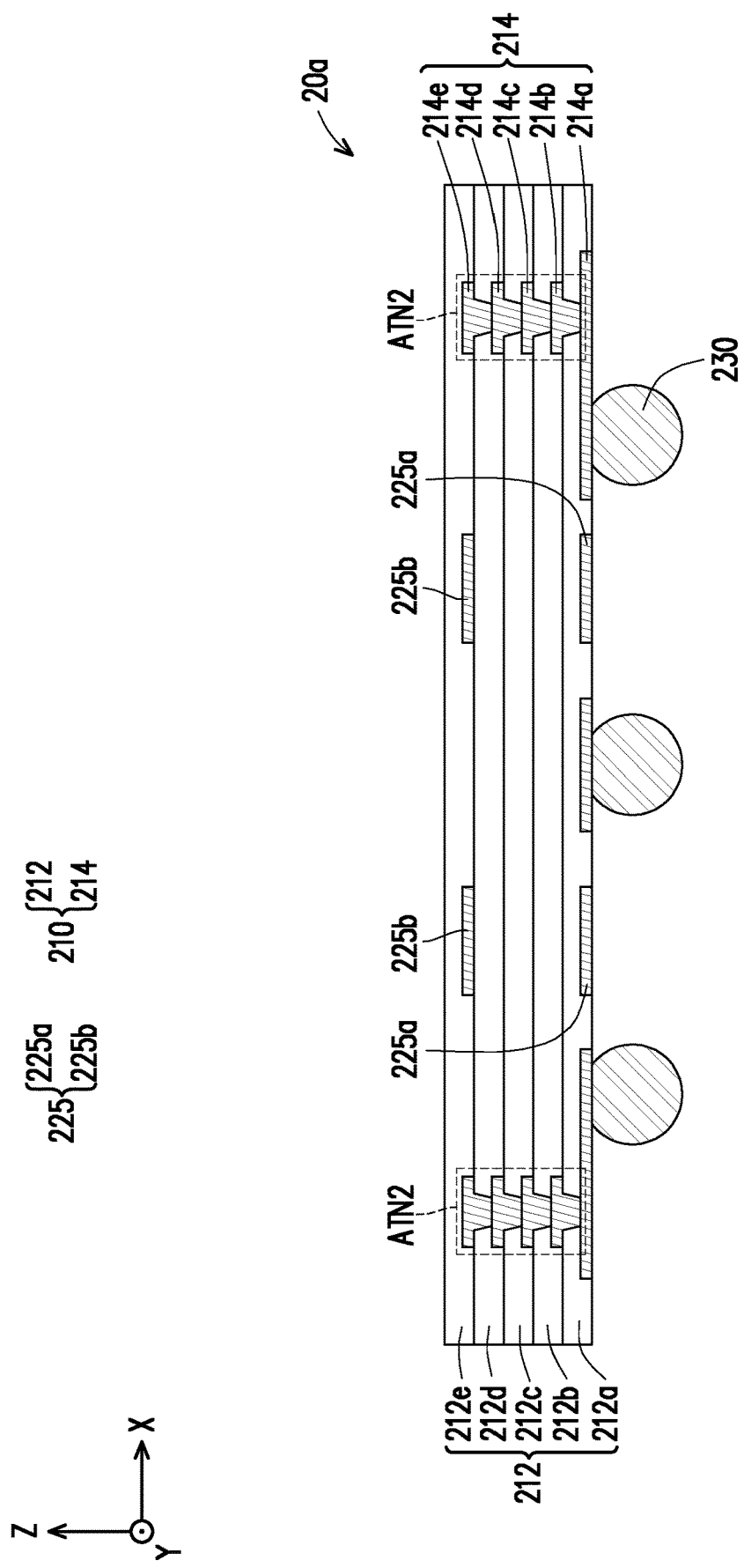

Referring to FIG. 9, in some embodiments, a second package 20a is provided. For example, the second package 20a includes an organic substrate 210, antenna elements 225, and conductive joints 230, where the antenna elements 225 are embedded in the organic substrate 210, and the conductive joints 230 are disposed on a surface of the organic substrate 210, as shown in FIG. 9.

In some embodiments, the organic substrate 210 includes sequentially-formed one or more than one organic dielectric layers 212 and one or more than one patterned conductive layers 214 in alternation. For example, the organic dielectric layers 212 include an organic dielectric layer 212a, an organic dielectric layer 212b, an organic dielectric layer 212c, an organic dielectric layer 212d, and an organic dielectric layer 212e, and the patterned conductive layers 214 include a patterned conductive layer 214a, a patterned conductive layer 214b, a patterned conductive layer 214c, a patterned conductive layer 214d, and a patterned conductive layer 214e, where the patterned conductive layer 214a is covered by the organic dielectric layer 212a, the patterned conductive layer 214b is sandwiched by the organic dielectric layer 212a and the organic dielectric layer 212b, the patterned conductive layer 214c is sandwiched by the organic dielectric layer 212b and the organic dielectric layer 212c, the patterned conductive layer 214d is sandwiched by the organic dielectric layer 212c and the organic dielectric layer 212d, and the patterned conductive layer 214e is sandwiched by the organic dielectric layer 212d and the organic dielectric layer 212e. As shown in FIG. 9, the patterned conductive layers 214a-214e are electrically interconnected to each other.

In some embodiments, the material of the organic dielectric layers 212 may include an organic material, which may be formed by suitable fabrication techniques such as spin-on coating or the like. The disclosure is not limited thereto. In certain embodiments, the material of the organic dielectric layers 212 may include an organic material having low permittivity (Dk) and low loss tangent (Df) properties, thereby achieving a low loss in gain for the antenna elements 225 in the antenna application. For example, a value of low Dk is less than 4, and a value of low Df is less than 0.009.

In some embodiments, the material of the patterned conductive layers 214 may be made of conductive materials formed by electroplating or deposition, such as aluminum, titanium, copper, nickel, tungsten, and/or alloys thereof, which may be patterned using a photolithography and etching process. In some embodiments, the patterned conductive layers 214 may be patterned copper layers or other suitable patterned metal layers.

It should be noted that the organic substrate 210 is not limited to include five organic dielectric layers and/or five patterned conductive layers. For example, the numbers of the organic dielectric layers and the patterned conductive layers included in the organic substrate 210 may be one or more than one.

In certain embodiments, the patterned conductive layers 214a-214e together may provide a routing function for the semiconductor die 130 after the second package 20a is bonded to the first package 10a (e.g. through connecting the conductive joints 230 of the second package 20a to the UBM patterns 160 of the first package 10a, which will be described in FIG. 10). For example, the patterned conductive layers 214a-214e may be further electrically connected to additional semiconductor devices (e.g. passive elements and/or active elements), so that the semiconductor die 130 may be electrically connected to the additional semiconductor devices through at least one of the patterned conductive layers 214a-214e.

In addition, portions of the patterned conductive layers 214b-214e aligning along the stacking direction Z and separated from the rest of the patterned conductive layers 214b-214e on a X-Y plane are stacked on and connected to one another to constitute a pillar-structure or a column-structure (indicated in a dotted box depicted in FIG. 9). In some embodiments, a pair of two adjacent pillar-structures or column-structures mentioned above together serve as an antenna ATN2. For example, the number of the antennas ATN2 may be one or more than one, the disclosure is not limited thereto. In one embodiment, the antennas ATN2 may be dipole antennas with vertical polarization or horizontal polarization. In some embodiments, for each antenna ATN2, one of the portions of the patterned conductive layers 214b is electrically connected to the underlying patterned conductive layer 214a which serves as a feed-line of the antenna ATN2, and other one of the portions of the patterned conductive layers 214b is electrically connected to the underlying patterned conductive layer 214a which serves as a ground plate/line of the antenna ATN2. In other words, the patterned conductive layer 214a (being electrically connected to the semiconductor die 130 after the second package 20a and the first package 10a are bonded) underlying and connected to the antenna ATN2 is referred as a ground plate/line and/or a feed line thereof. As shown in FIG. 9, for example, the antennas ATN2 are arranged along the edges of the second package 20a (also see FIG. 12).

However, in certain embodiments, the antenna ATN2 may be omitted from the second package 20a, see a package structure P2 depicted in FIG. 13. The disclosure is not limited thereto.

As shown in FIG. 9, the antenna elements 225 are formed in the organic substrate 210. For example, the antenna elements 225 include antenna elements 225a formed atop the organic dielectric layer 212a and antenna elements 225b formed atop the organic dielectric layer 212d, where the antenna elements 225a and the antenna elements 225b are embedded in the organic substrate 210. In some embodiments, the material of the antenna elements 225a and/or the antenna elements 225b include aluminum, titanium, copper, nickel, tungsten, and/or alloys thereof. In certain embodiments, the antenna elements 225a are arranged in form of a matrix, such as the N×N array or N×M arrays (N, M>0, N may or may not be equal to M); similarly, the antenna elements 225b are also arranged in form of a matrix, such as the N×N array or N×M arrays corresponding to the arrangement of the antenna elements 225a. The size of the array can be designated and selected based on the demand, and is not limited to the disclosure (e.g. an array depicted in FIG. 12).

In one embodiment, the antenna elements 225a and the patterned conductive layer 214a are formed in the same step, and the materials of the antenna elements 225a and the patterned conductive layer 214a is the same or similar; on the other hand, the antenna elements 225b and the patterned conductive layer 214d are formed in the same step, and the materials of the antenna elements 225b and the patterned conductive layer 214d is the same or similar, thus may not be repeated herein. The number of the antenna elements 225a and the number of the antenna elements 225b are not limited to FIG. 9, and may be selected for designed based on the demand and the design layout.

However, the disclosure is not limited thereto. In an alternative embodiment, the antenna elements 225 may further include one or more than one antenna elements formed on the organic dielectric layer 212b, the organic dielectric layer 212c, the organic dielectric layer 212d, and/or the organic dielectric layer 212e or one or more than one antenna elements formed in the organic dielectric layer 212a. As shown in FIG. 9, along the stacking direction Z of the antenna elements 225, each of the antenna elements 225b is aligned with a respective one of the antenna elements 225a underlying thereto, for example. In other words, along the stacking direction Z, each of the antenna elements 225b is overlapped with the respective one of the antenna elements 225a underlying thereto, in some embodiments.

In some embodiments, the conductive joints 230 are disposed on the patterned conductive layer 214a and protrude away from a surface of the patterned conductive layer 214a. As shown in FIG. 9, the conductive joints 230 are directly and physically connected to portions of the patterned conductive layer 214a exposed by the organic dielectric layer 212a, respectively. In some embodiments, the conductive joints 230 may be disposed on the patterned conductive layer 214a by ball placement process or reflow process. In some embodiments, the conductive joints 230 are, for example, micro-bumps (μ-bumps), copper pillars, solder balls or ball grid array (BGA) balls, where the conductive joints 230 may have non-planar sidewalls. For example, the sidewalls of the conductive joints 230 are curved surfaces in respect with the direction Z. In some embodiments, the conductive joints 230 may be connected to the portions of the patterned conductive layer 214a exposed by the organic dielectric layer 212a through one UBM pattern (similar to the UBM patterns 172). The number of the conductive joints 230 is not limited to the disclosure, and may be designated and selected based on the demand and the design layout. As shown in FIG. 9, the conductive joints 230 are electrically connected to the patterned conductive layers 214a-214e embedded in the organic substrate 210.

Figure 10:
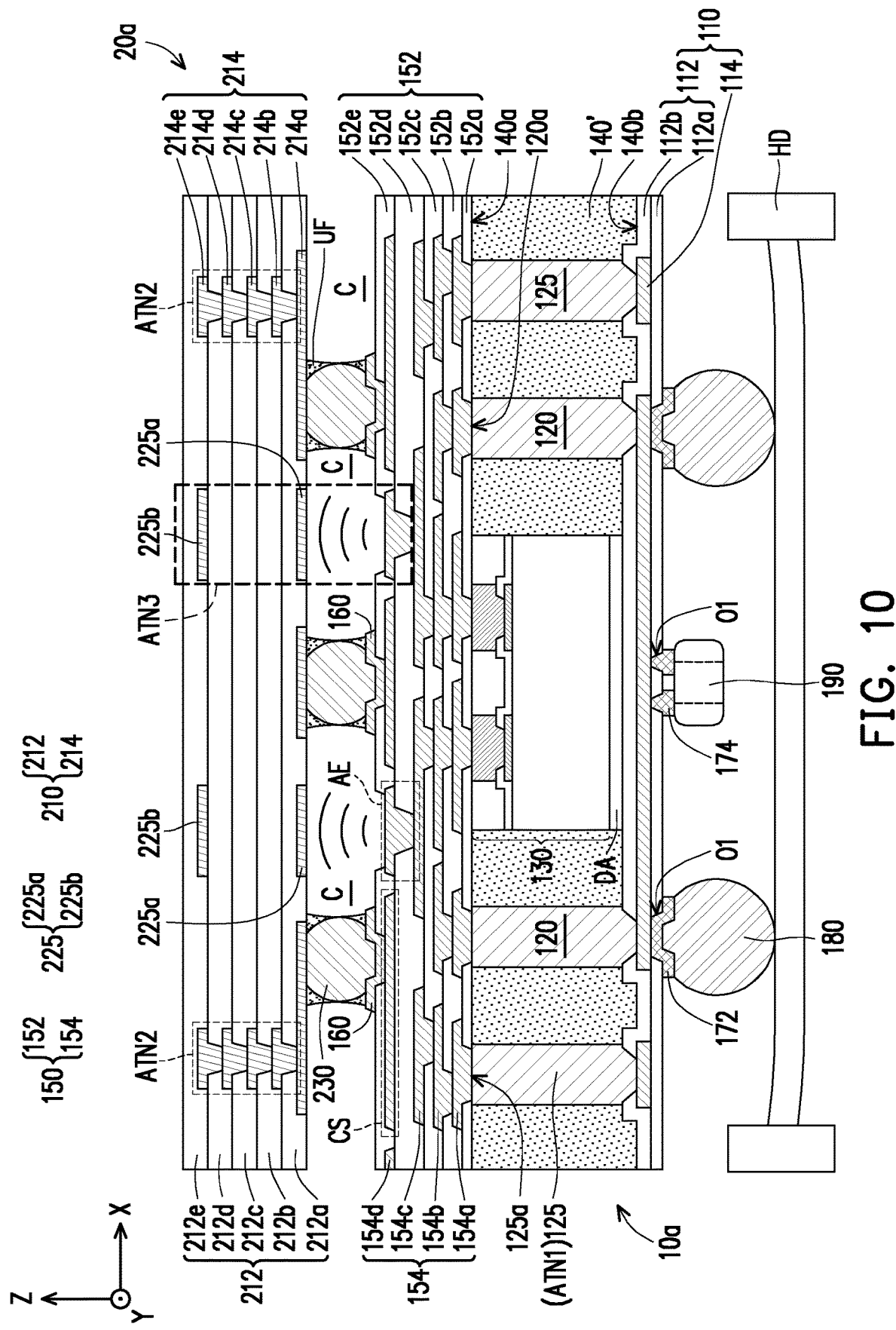

Referring to FIG. 10, in some embodiments, the second package 20a is placed over and then mounted onto the first package 10a. In some embodiments, the second package 20a is bonded on the first package 10a through mechanically connecting the conductive joints 230 and the UBM patterns 160. Due to the self-alignment between the conductive joints 230 and the UBM patterns 160, the bonding process of the second package 20a and the first package 10a is ease and time-saved. For example, an alignment between the conductive joints 230 and the UBM patterns 160 can be easily achieved by using an optical microscope (e.g. a detection of an intensity of light reflection of the UBM patterns 160). In some embodiments, the second package 20a is bonded on the first package 10a through flip chip bonding technology and/or surface mount technology.

In some embodiments, through the conductive joints 230, the UBM patterns 160, the connecting structures CS, and the redistribution circuit structure 150, the patterned conductive layers 214a-214e of the patterned conductive layers 214 in the organic substrate 210 are electrically connected to the semiconductor die 130. In some embodiments, the antennas ATN2 are electrically connected to the semiconductor die 130 through the patterned conductive layer 214a, the conductive joints 230, the UBM patterns 160, the connecting structures CS, and the redistribution circuit structure 150, where the signal transmission between the semiconductor die 130 and the antennas ATN2 is ensured.

In some embodiments, as shown in FIG. 10, along the stacking direction Z, the antenna elements 225a of the antenna elements 225 embedded in the second package 20a are respectively aligned to the antenna elements AE of the first package 10a underlying thereto. In some embodiments, the antenna elements 225a are respectively overlapped with the antenna elements AE, and thus the antenna elements AE are respectively electrically coupled to the antenna elements 225a overlying thereto. For example, one antenna element AE, one antenna element 225a and one antenna element 225b, which are overlapped with and aligned with one another along the stacking direction Z, constitute an antenna ATN3. The number of the antenna ATN3 may be one or more than one. In some embodiments, the antennas ATN3 may include patch antennas (having broadside radiation).

In some embodiments, the conductive joints 230 are not overlapped with the antennas ATN1 and the antennas ATN2. For example, positioning locations of the conductive joints 230 are located aside of positioning locations of the antennas ATN1, positioning locations of the antennas ATN2 and positioning locations of the antennas ATN3 along the stacking direction Z (e.g. on the vertical projection on the X-Y plane).

In some embodiments, as shown in FIG. 10, a cavity is formed between the antenna elements AE and the antenna elements 225a. For example, the cavity C is constituted by the conductive joints 230, the first package 10a, and the second package 20a. In one embodiment, the cavity C may be filled with air (having low permittivity (Dk) and low loss tangent (Df) properties), however the disclose is not limited thereto. In an alternative embodiment, the cavity C may be filled with underfill materials having low permittivity (Dk) and low loss tangent (Df) properties. As shown in FIG. 10, in each antenna ATN3, the antenna element AE in the first package 10a is electrically connected to the respective one antenna element 225a and the respective one antenna element 225b in a manner of electrical coupling. Owing to the air cavity in the antenna ATN3 depicted in FIG. 10, the package structure P1 achieves a higher gain and wide bandwidth for the antennas ATN3.

In some embodiments, for one antenna ATN3, the antenna element AE is electrically connected to the metallization layers 154 (e.g. the metallization layer 154c) of the redistribution circuit structure 150, where the metallization layers 154c overlapped with the antenna element AE serves as a ground plate/line and a feed-line for the antennas ATN3. In other words, for example, a portion of the metallization layers 154c connecting to the antenna elements AE may serve as feed lines for the antennas ATN3, and another portion of the metallization layers 154c electrically isolated from the feed line and overlapped with the antenna elements AE may serve as a ground plate/line for the antennas ATN3. In addition, due to the self-alignment between the conductive joints 230 and the UBM patterns 160, the antenna elements 225 of the second package 20a are easily aligned to the antenna elements AE of the first package 10a respectively underlying thereto. In some embodiments, the arrangement of the antenna elements AE in the first package 10a correspond to the arrangement of the antenna elements 225a in the second package 20a. In some embodiments, the antennas ATN3 are electrically connected to the semiconductor die 130 through the redistribution circuit structure 150, where the signal transmission between the semiconductor die 130 and the antennas ATN3 is ensured.

In some embodiments, the antennas ATN3 are the patch antennas of the same type (e.g. one frequency). However, the disclosure is not limited thereto. In certain embodiments, the antennas ATN3 may be the patch antennas of different types (e.g. various frequencies). For example, the antennas ATN3 having the same transmitting frequency are grouped into one group, where different groups of the antennas ATN3 are separated by the conductive joints 230 for preventing electrical coupling among the antennas ATN3 having different transmitting frequencies. Owing to conductive joints 230 being located aside of the antennas ATN3 in a projection on the first package 10a and/or the second package 20a along the stacking direction Z (see FIG. 12), the interference between the antennas ATN3 having different transmitting frequencies in one package structure P1 and/or among a plurality of the package structures P1 can be suppressed, thereby reducing the surface noise among the antennas ATN3; the performance of the package structure P1 is further improved. In other words, for example, the antennas ATN3 having different transmitting frequencies may be isolated from each other through the conductive joints. Owing to the configuration of the antennas ATN3 in addition to the antennas ATN1 and/or the antennas ATN2, a coverage range of the electromagnetic waves in the package structure P1 is widely increased, and the performance (e.g. gain and bandwidth) and the efficiency of the antenna application of the package structure Pt is thus enhanced.

Continued on FIG. 10, in some embodiments, after the second package 20a is bonded on the first package 10a with the conductive joints 230 there-between, an underfill material UF is formed between the first package 10a and the second package 20a and dispensed around the conductive joints 230. In some embodiments, the underfill material UF is at least wrapped around sidewalls of the conductive joints 230, as shown in FIG. 10. However, the disclosure is not limited thereto. With such configuration, the underfill material UF provides structural support and protection to the conductive joints 230. In an alternative embodiment, the underfill material UF may completely fill up the cavity C. In one embodiment, the underfill material UF may be formed by underfill dispensing or any other suitable method. In some embodiments, the underfill material UF may be a dielectric material having low permittivity (Dk) and low loss tangent (Df) properties, and the like. For example, a value of low Dk is less than 4, and a value of low Df is less than 0.009.

Figure 11:
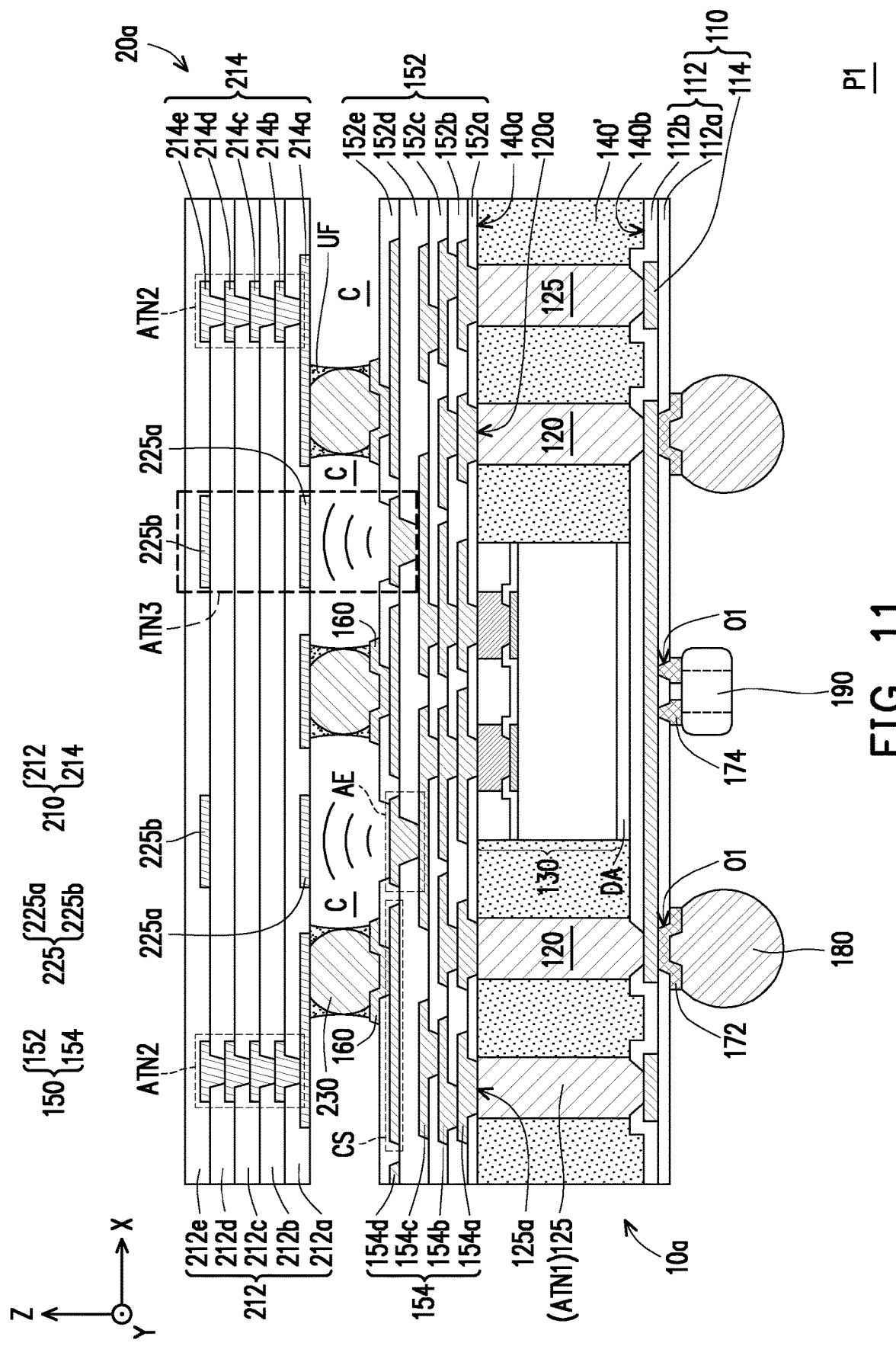

Referring to FIG. 11, in some embodiments, the conductive elements 180 are released from the holding device HD to form the package structure P1. Up to here, the manufacture of the package structure P1 is completed. In some embodiments, the package structure P1 may be further mounted with an additional package, chips/dies, other electronic devices, or a suitable substrate (e.g. an organic substrate) to form a stacked package structure, the disclosure is not limited thereto.

Figure 14:
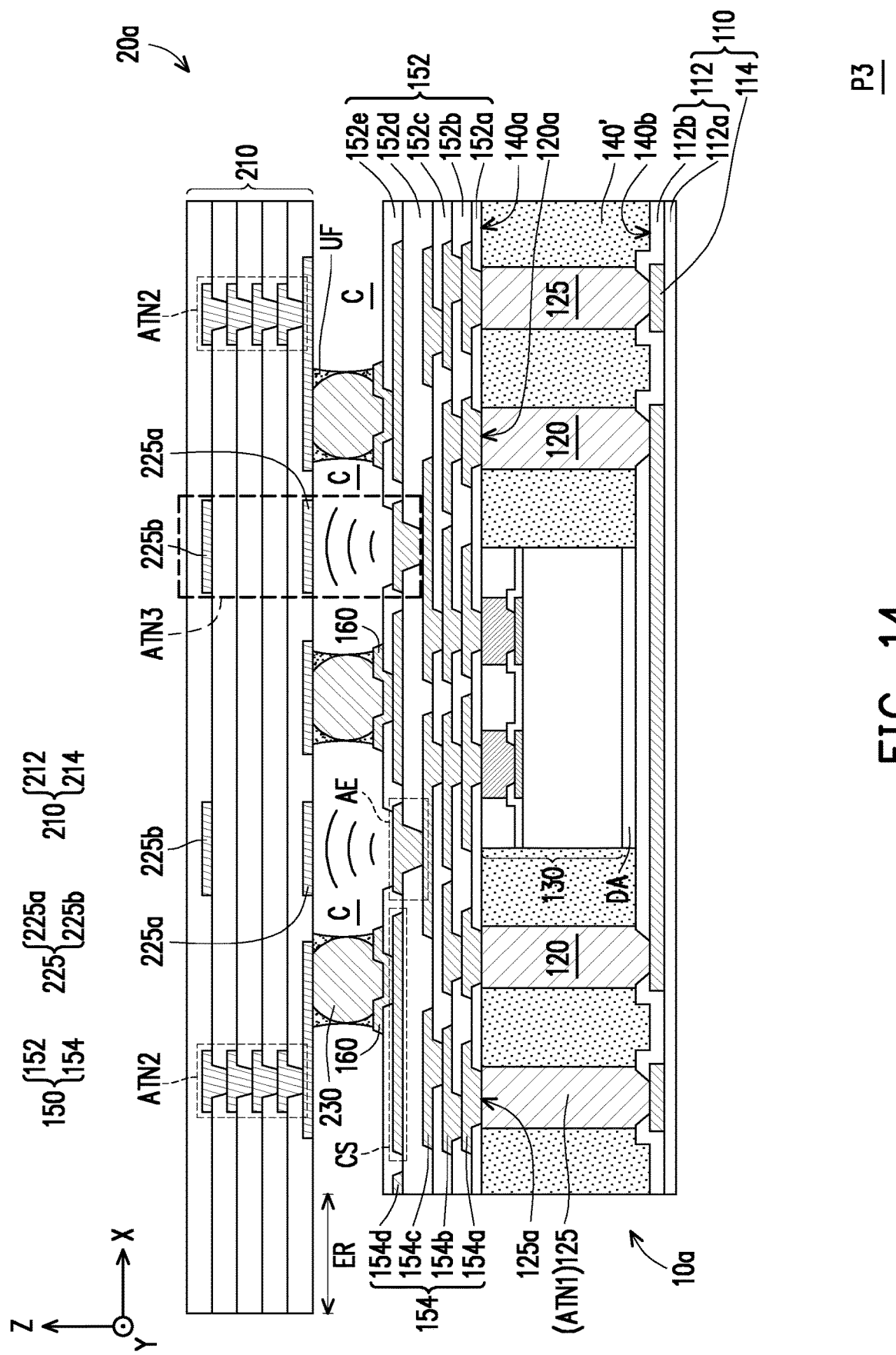
FIG. 14 is a schematic cross sectional view of a package structure according to some exemplary embodiments of the present disclosure.

FIG. 14 is a schematic cross sectional view of a package structure according to some exemplary embodiments of the present disclosure. Referring to FIG. 11 and FIG. 14 together, the package structure P1 depicted in FIG. 11 and the package structure P3 depicted in FIG. 14 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 11 and FIG. 14 together, the difference is that, for the package structure P3 depicted in FIG. 14, not only that the organic substrate 210 of the second package 20a includes an extending region ER, the contact openings O1, the UBM patterns 172, connection pads 174, the conductive elements 180 and the semiconductor devices 190 of the first package 10a are also excluded from the first package 10a.

In some embodiments, the extending region ER of the organic substrate 210 is extended on the X-Y plane for not only providing additional routing function for the package structure P3 but also providing more area to dispose one or more than one semiconductor devices (e.g. passivation elements or active elements) thereon. Owing to such configuration, the package structure P3 is capable of having a more complex redistribution circuitry while maintaining an overall thickness thereof in the stacking direction Z. In some embodiments, as shown in FIG. 14, the metallization layer 114 of the redistribution circuit structure 110 is completely covered by the dielectric layer 112a and is electrically connected to the semiconductor die 130 through the conductive pillars 120, the conductive pillars 120 and the metallization layer 114 together serve as a shielding layer which prevents the semiconductor die 130 being interfered by external signals. Owing to such configuration, a reliability in the performance of the package structure P3 is achieved.

Figure 15:
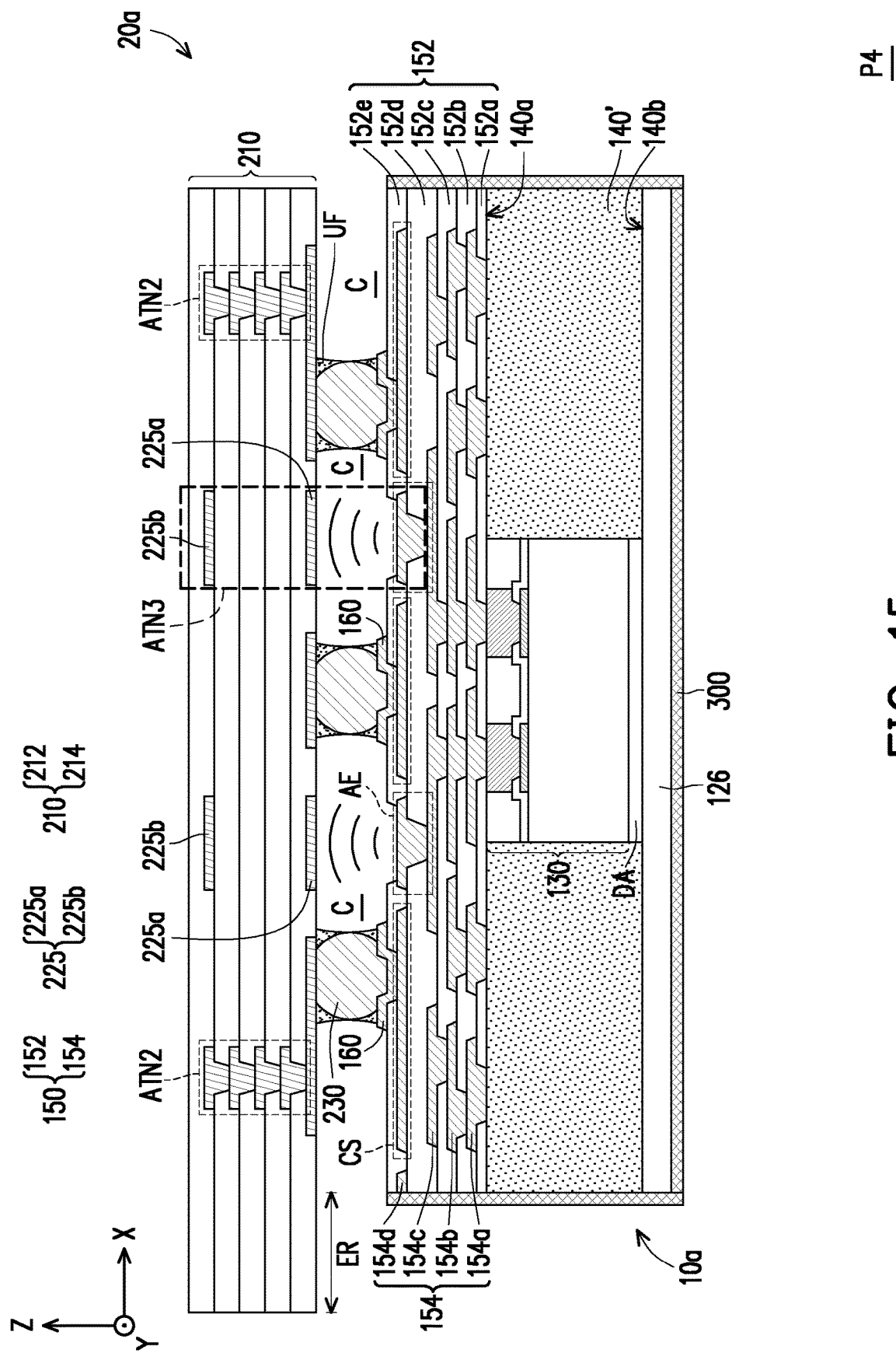
FIG. 15 is a schematic cross sectional view of a package structure according to some exemplary embodiments of the present disclosure.

FIG. 15 is a schematic cross sectional view of a package structure according to some exemplary embodiments of the present disclosure. Referring to FIG. 14 and FIG. 15 together, the package structure P3 depicted in FIG. 14 and the package structure P4 depicted in FIG. 15 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 14 and FIG. 15 together, the difference is that, for the package structure P4 depicted in FIG. 15, not only that the package structure P4 includes an additional element (e.g. an electromagnetic interference shielding layer 300) and excludes the conductive pillars 120 and the antenna elements 125 of the first package 10a, the redistribution circuit structure 110 of the first package 10a is also replaced by a dielectric layer 126. In some embodiments, the dielectric layer 126 covers the bottom surface 140b of the insulating encapsulation 140' and a surface of the connecting film DA disposed on the backside surface 130f of the semiconductor die 130. The formation and material of the dielectrically layer 126 may be the same or similar to the formation and material of the dielectric layers 112, thus not repeated herein. Due to the dielectrically layer 126, a protection is provided to the semiconductor die 130.

In some embodiments, the electromagnetic interference shielding layer 300 is disposed on the dielectric layer 126 of the first package 10a and further extends to sidewalls of the first package 10a (including sidewalls of the dielectric layer 126, the insulating encapsulation 140', and the redistribution circuit structure 150) in order to electrically connected to the redistribution circuit structure 150. As shown in FIG. 15, the electromagnetic interference shielding layer 300 is physically connected to the metallization layers 154 of the redistribution circuit structure 150, for example. In some embodiments, through the redistribution circuit structure 150, the electromagnetic interference shielding layer 300 is electrically connected to the semiconductor die 130.

In some embodiments, the electromagnetic interference shielding layer 300 may be made of an electrically conductive material. Materials used for the electromagnetic interference shielding layer 300 may include copper, nickel, an alloy of nickel and iron, an alloy of copper and nickel, silver, etc., but not limited thereto. In some embodiments, the electromagnetic interference shielding layer 300 may be fabricated by using an electrolytic plating, electroless plating, sputtering, physical vapor deposition ("PVD"), chemical vapor deposition ("CVD"), or other suitable metal deposition process. The electromagnetic interference shielding layer 300 is used for reducing or inhibiting the electromagnetic field in a space by blocking the field with barriers made of conductive or magnetic materials. The electromagnetic interference shielding layer 300 in some embodiments may reduce the coupling of, for example, radio waves, electromagnetic fields and electrostatic fields. In the disclosure, the electromagnetic interference shielding layer 300 prevents the semiconductor die 130 being interfered by external signals. Owing to such configuration, a reliability in the performance of the package structure P4 is also achieved.

Figure 16:
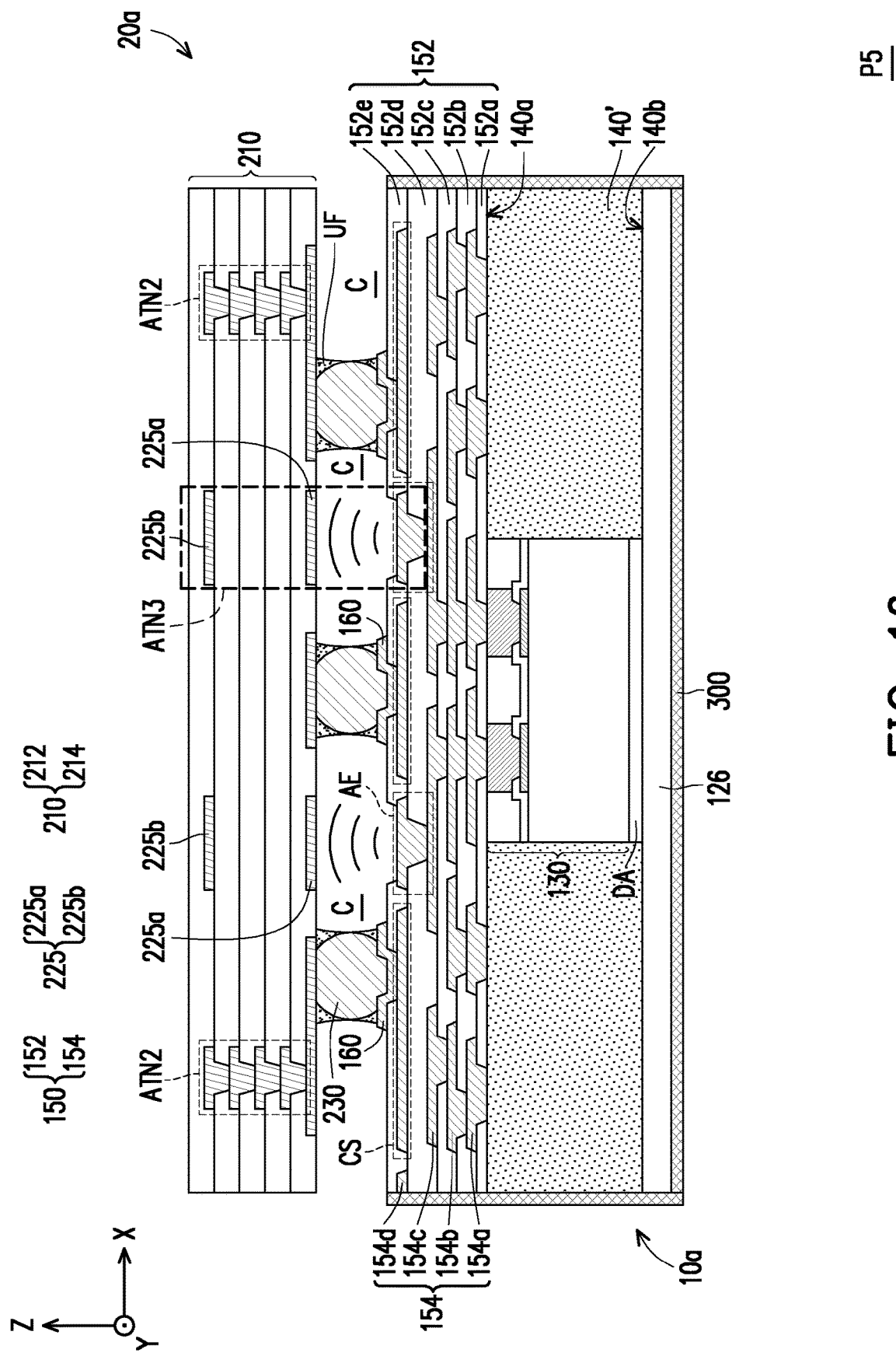
FIG. 16 is a schematic cross sectional view of a package structure according to some exemplary embodiments of the present disclosure.

FIG. 16 is a schematic cross sectional view of a package structure according to some exemplary embodiments of the present disclosure. Referring to FIG. 11 and FIG. 16 together, the package structure P1 depicted in FIG. 11 and the package structure P5 depicted in FIG. 16 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 11 and FIG. 16 together, the difference is that, for the package structure P5 depicted in FIG. 16, not only that the package structure P5 includes an additional element (e.g. the electromagnetic interference shielding layer 300) and excludes the conductive pillars 120, and the antenna elements 125 of the first package 10a, the redistribution circuit structure 110 is also replaced by a dielectric layer 126. As mentioned, the dielectrically layer 126 provides protection to the semiconductor die 130 while the electromagnetic interference shielding layer 300 prevents the semiconductor die 130 being interfered by external signals. Owing to such configuration, a reliability in the performance of the package structure P5 is achieved.

Figure 17:
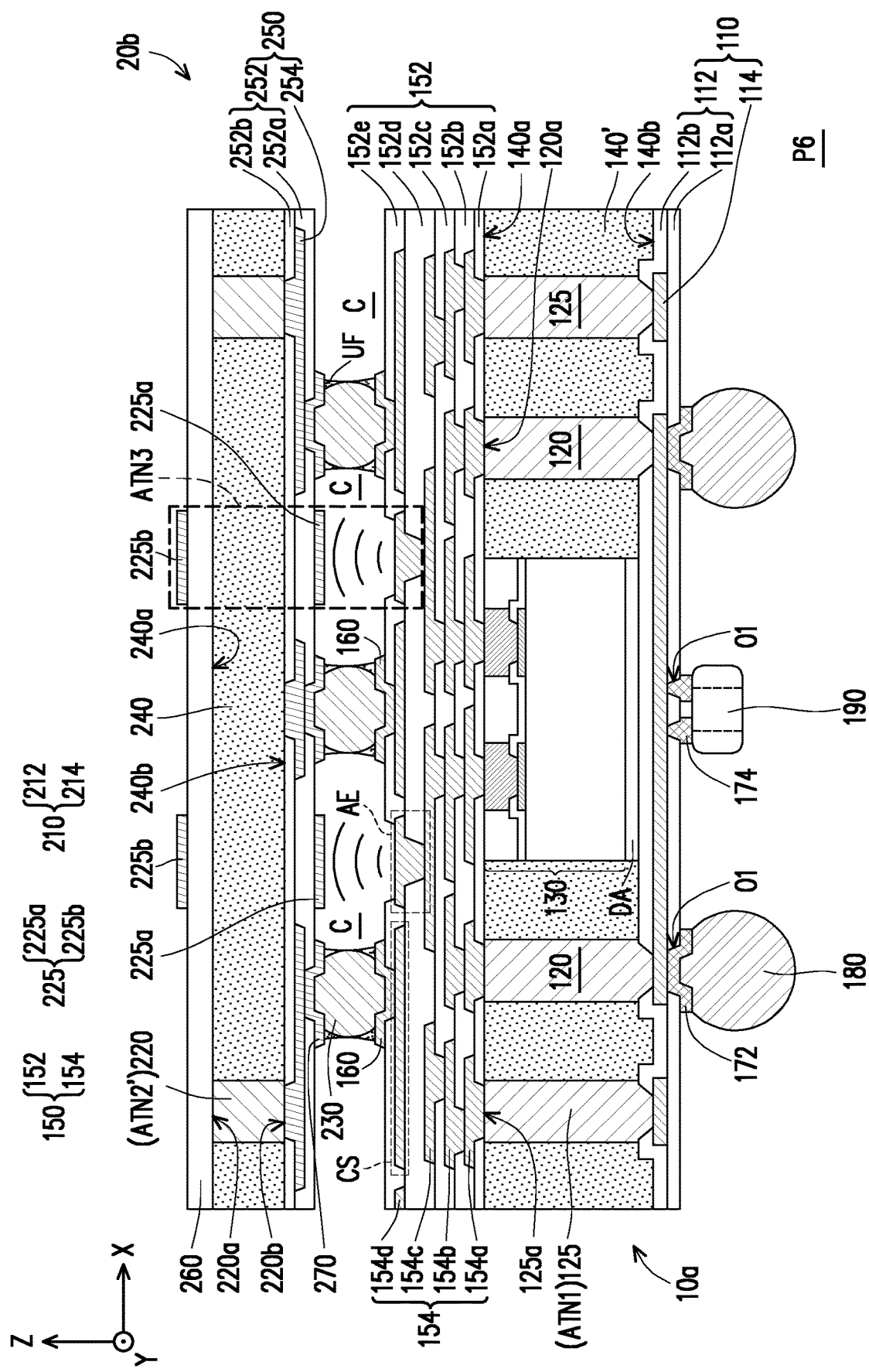
FIG. 17 is a schematic cross sectional view of a package structure according to some exemplary embodiments of the present disclosure.

FIG. 17 is a schematic cross sectional view of a package structure according to some exemplary embodiments of the present disclosure. Referring to FIG. 11 and FIG. 17 together, the package structure P1 depicted in FIG. 11 and the package structure P6 depicted in FIG. 17 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 11 and FIG. 17 together, the difference is that, for the package structure P6 depicted in FIG. 17, the second package 20a is replaced with a second package 20b. In some embodiments, the second package 20b is mounted onto the first package 10a through the conductive joints 230, where the underfill material UF is at least partially wrapped around the sidewalls of the conductive joints 230.

In some embodiments, the second package 20b includes conductive pillars 220, the antenna elements 225 (including the antenna elements 225a and the antenna elements 225b), the conductive joints 230, an insulating encapsulation 240, a redistribution circuit structure 250, a dielectric layer 260, and UBM patterns 270. As shown in FIG. 17, for example, the conductive pillars 220 are encapsulated in the insulating encapsulation 240, where top surfaces 220a of the conductive pillars 220 are substantially levelled with and coplanar to a top surface 240a of the insulating encapsulation 240, and bottom surfaces 220b of the conductive pillars 220 are substantially levelled with and coplanar to a bottom surface 240b of the insulating encapsulation 240. In some embodiments, the insulating encapsulation 240 may be a dielectric material having low permittivity (Dk) and low loss tangent (Df) properties, and the like. For example, a value of low Dk is less than 4, and a value of low Df is less than 0.009.

For example, the formation and material of the conductive pillars 220 may be the same or similar to the formation and material of the conductive pillars 120, and thus not repeated herein. For simplification, only two conductive pillars 220 are presented in FIG. 17 for illustrative purposes, however it should be noted that the number of the conductive pillars 220 may be less than two or more than two; the disclosure is not limited thereto. The number of the conductive pillars 220 to be formed can be selected based on the demand.

Continued on FIG. 17, in some embodiments, the redistribution circuit structure 250 is formed on and is electrically connected to the conductive pillars 220. As shown in FIG. 17, for example, the redistribution circuit structure 250 is disposed on the bottom surfaces 220b of the conductive pillars 220 and the bottom surface 240b of the insulating encapsulation 240. In some embodiments, the redistribution circuit structure 250 includes sequentially formed one or more dielectric layers 252 and one or more metallization layers 254 in alternation. In some embodiments, the redistribution circuit structure 250 includes two dielectric layers 252 (e.g. a dielectric layer 252a and a dielectric layer 252b) and one metallization layer 254 as shown in FIG. 17, where the metallization layer 254 is sandwiched between the dielectric layer 252a and the dielectric layer 252b of the dielectric layers 252. However, the disclosure is not limited thereto. The numbers of the metallization layers and the dielectric layers included in the redistribution circuit structure 250 is not limited thereto, and may be designated and selected based on the demand. For example, the numbers of the metallization layers and the dielectric layers may be one or more than one.

In some embodiments, portions of a top surface of the metallization layer 254 are respectively exposed by the openings of a topmost layer (e.g. the dielectric layer 252b) of the dielectric layers 252 for physically connecting the conductive pillars 220, and portions of a bottom surface of the metallization layer 254 are respectively exposed by the openings of a bottom layer (e.g. the dielectric layer 252a) of the dielectric layers 252 for physically connecting the UBM patterns 270. The formation and material of the UBM patterns 270 may be the same or similar to the formation and material of the UBM patterns 160 or the formation and material of the UBM patterns 172, and thus may not be repeated herein.

In some embodiments, as shown in FIG. 17, the conductive joints 230 are respectively disposed on the UBM patterns 270. The number of the conductive joints 230 and the number of the UBM patterns 270 may be one or more than one, where the number of the UBM patterns 270 corresponds to the number of the conductive joints 230. For example, through the UBM patterns 270, the conductive joints 230 are electrically connected to the redistribution circuit structure 250; and through the UBM patterns 270 and the redistribution circuit structure 250, the conductive joints 230 are electrically connected to the conductive pillars 220. In other words, the conductive pillars 220 are electrically connected to the semiconductor die 130 through the redistribution circuit structure 250, the UBM patterns 270, the conductive joints 230, the UBM patterns 160, and the redistribution circuit structure 150. In some embodiments, a pair of two adjacent conductive pillars 220 serve as an antenna ATN2'.

In some embodiments, for each antenna ATN2', one of the conductive pillars 220 is electrically connected to a portion of the underlying metallization layer 254 which serves as a feed-line of the antenna ATN2', and other one of the conductive pillars 220 is electrically connected to another portion of the underlying metallization layer 254 which serves as a ground plate/line of the antenna ATN2'. In other words, the underlying metallization layer 254 connected to the antenna ATN2' is referred as a ground plate/line and/or a feed line thereof. As shown in FIG. 17, for example, the antennas ATN2' are arranged along the edges of the second package 20b (similar to the arrangement of the antenna ATN2 shown in FIG. 12). For example, the number of the antennas ATN2' may be one or more than one, the disclosure is not limited thereto. In one embodiment, the antennas ATN2' may be dipole antennas with vertical polarization or horizontal polarization.

In some embodiments, the dielectric layer 260 is formed on the top surfaces 220a of the conductive pillars 220 and the top surface 240a of the insulating encapsulation 240. The formation and material of the dielectric layer 260 may be the same or similar to the formation and material of the dielectric layer 112 or the formation and material of the dielectric layer 152, for example. The formation and material of the dielectric layer 260 may be the same or similar to the formation and material of the organic dielectric layers 212, for another example.

In some embodiments, the antenna elements 225a are disposed on an outer surface of the redistribution circuit structure 250 facing toward the first package 10a, and the antenna elements 225b are disposed on other outer surface of the redistribution circuit structure 250 facing away from first package 10a, where each antenna element 225a is electrically coupled to one of the antenna elements 225b directly overlying thereto along the stacking direction Z. In some embodiments, the antenna elements 225a and the antenna elements 225b are formed by lamination or the like, the disclosure is not limited thereto. The arrangements of the antenna elements 225a and the antenna elements 225b are described in FIG. 9 and FIG. 10, and thus may not be repeated herein. In some embodiments, as shown in FIG. 17, along the stacking direction Z, the antenna elements 225a of the antenna elements 225 are respectively aligned to the antenna elements AE of the first package 10a. In some embodiments, the antenna elements 225a are respectively overlapped with the antenna elements AE, so that the antenna elements AE are respectively electrically coupled to the antenna elements 225a directly overlying thereto. For example, one antenna element AE, one antenna element 225a and one antenna element 225b, which are overlapped with and aligned with one another along the stacking direction Z, constitute the antenna ATN3. The number of the antenna ATN3 may be one or more than one.

In some embodiments, for one antenna ATN3, the antenna element AE is electrically connected to the metallization layers 154 (e.g. the metallization layer 154c) of the redistribution circuit structure 150, where the metallization layers 154c overlapped with the antenna element AE serves as a ground plate/line and a feed-line for the antennas ATN3. In other words, for example, a portion of the metallization layers 154c connecting to the antenna elements AE may serve as feed lines for the antennas ATN3, and another portion of the metallization layers 154c electrically isolated from the feed line and overlapped with the antenna elements AE may serve as a ground plate/line for the antennas ATN3. In addition, due to the self-alignment between the conductive joints 230 and the UBM patterns 160, the antenna elements 225 of the second package 20b are easily aligned to the antenna elements AE of the first package 10a respectively underlying thereto. In some embodiments, the arrangement of the antenna elements AE in the first package 10a correspond to the arrangement of the antenna elements 225a in the second package 20b. In some embodiments, the antennas ATN3 are electrically connected to the semiconductor die 130 through the redistribution circuit structure 150, where the signal transmission between the semiconductor die 130 and the antennas ATN3 is ensured. Owing to the configuration of the antennas ATN3 in addition to the antennas ATN1 and/or the antennas ATN2', a coverage range of the electromagnetic waves in the package structure P6 is widely increased, and the performance (e.g. gain and bandwidth) and the efficiency of the antenna application of the package structure P6 is thus enhanced.

Figure 18:
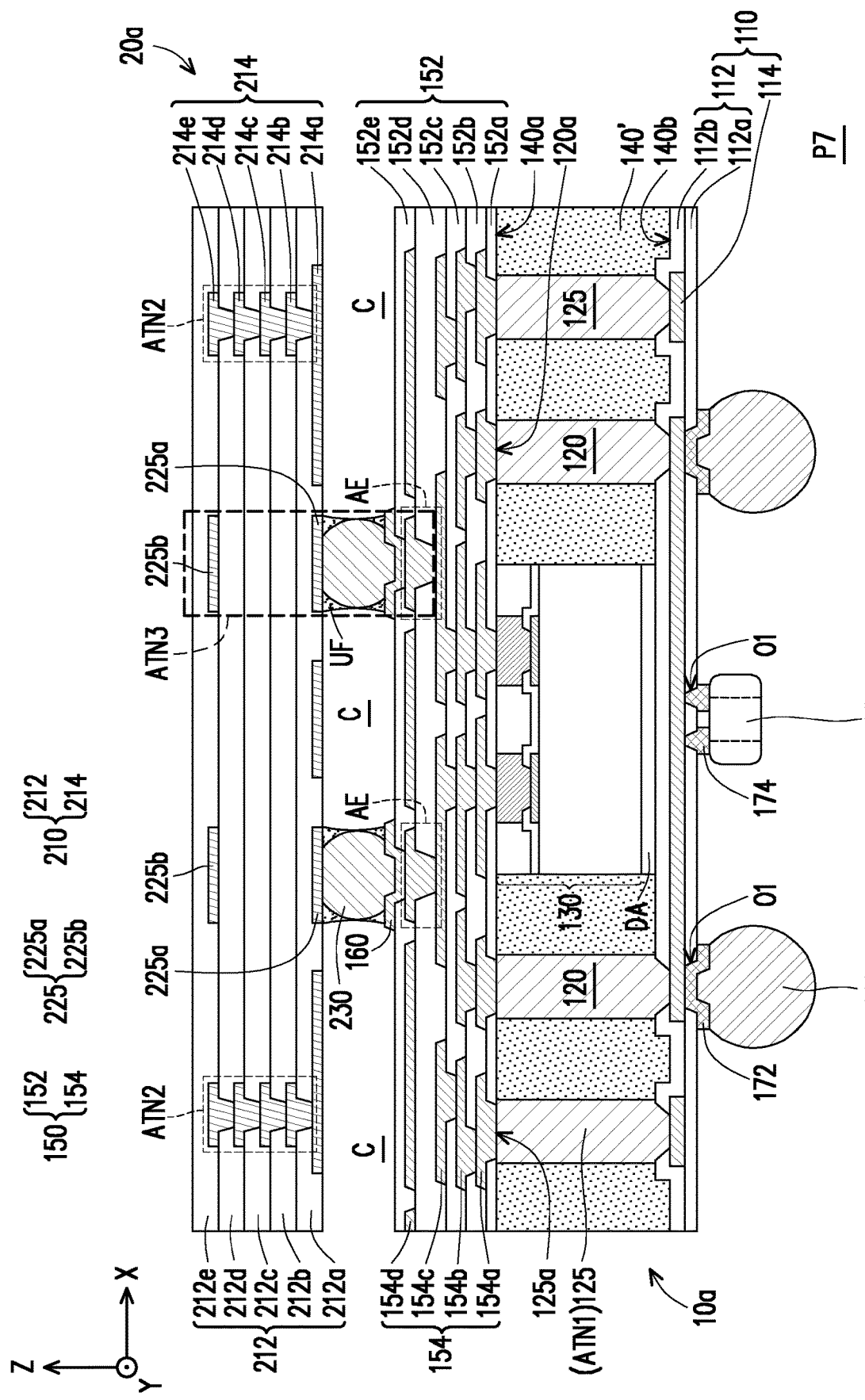
FIG. 18 is a schematic cross sectional view of a package structure according to some exemplary embodiments of the present disclosure.
Figure 19:
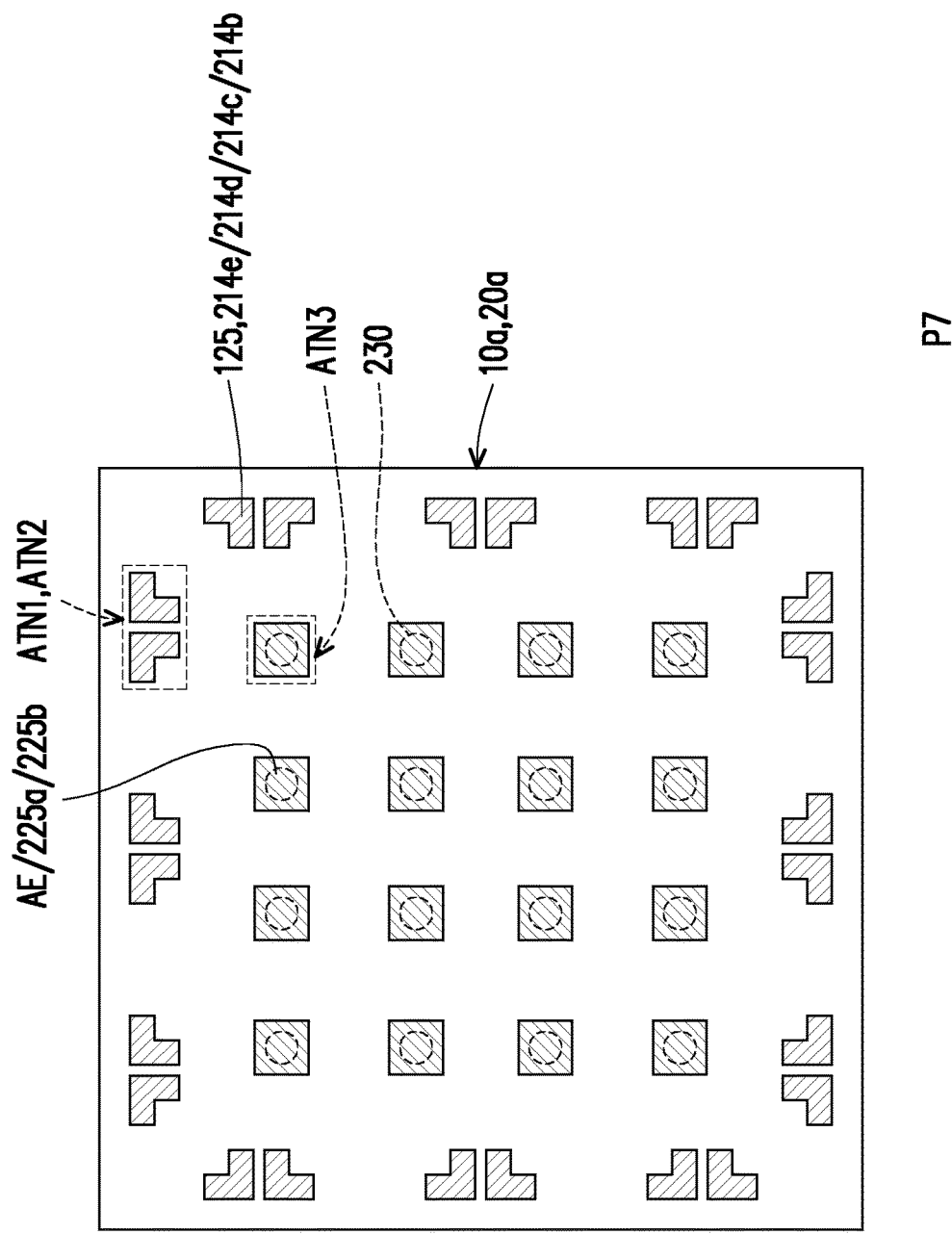
FIG. 19 is a schematic top view illustrating a relative position between antennas and conductive joints depicted in FIG. 18.

FIG. 18 is a schematic cross sectional view of a package structure according to some exemplary embodiments of the present disclosure. FIG. 19 is a schematic top view illustrating a relative position between antennas and conductive joints depicted in FIG. 18. Referring to FIG. 11 and FIG. 18 together, the package structure P1 depicted in FIG. 11 and the package structure P7 depicted in FIG. 18 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 11 and FIG. 18 together, the difference is that, for the package structure P7 depicted in FIG. 18, the antenna elements AE of the first package 10a are electrically connected to the antenna elements 225a of the second package 20a through physically connecting the conductive joints 230 and the antenna elements AE. In addition, for example, the UBM patterns 160 may be formed between the conductive joints 230 and the antenna elements AE. Owing to such configuration, the antenna elements AE not only serve as a part of the antenna ATN3 but also serve as a connecting structure (along with a respective one conductive joint 230) of the package structure P7 for ensuring the bonding strength between the conductive joints 230 and the antenna elements AE. In other words, the connecting structures CS in the package structures P1-P6 are omitted.

In some embodiments, the conductive joints 230 are not overlapped with the antennas ATN1 and the antennas ATN2 but overlapped with the ATN3. For example, the positioning locations of the conductive joints 230 are located aside of the positioning locations of the antennas ATN1 and the positioning locations of the antennas ATN2 and are overlapped with the positioning locations of the antennas ATN3 along the stacking direction Z (e.g. on the vertical projection on the X-Y plane).

However, the disclosure is not limited thereto. In an alternative embodiment, the UBM patterns 160 between the conductive joints 230 and the antenna elements AE may be omitted, and the conductive joints 230 may be directly bonded to the antenna elements AE by physical contact.

In some embodiments, the antenna elements AE of the first package 10a transmits the electrical signals from the semiconductor die 130 of the first package 10a to the antenna elements 225 (e.g. the antenna elements 225a) of the second package 20a or transmits the electrical signals from the antenna elements 225 (e.g. the antenna elements 225a) of the second package 20a to the semiconductor die 130 of the first package 10a through physical connection, such as physically connecting one of the antenna elements 225a and a respective one of the antenna elements AE through one conductive joint 230 (and one UBM pattern 160) there-between. As shown in FIG. 18, for example, it should be noted that the conductive joints 230 are overlapped with the antenna elements AE and the antenna elements 225a-225b, also see FIG. 19.

In some embodiments, the antenna elements 225 may further include one or more additional antenna elements (not shown) in addition to the antenna elements 225a, 225b. For example, the one or more additional antenna elements are located between the antenna elements 225a and the antenna elements 225b along the stacking direction Z, where one antenna element 225a, one antenna element 225b, and one or more additional antenna elements stacked on and overlapped with one another along the stacking direction Z are electrically connected to each other through electrical coupling. The formation and material of the one or more additional antenna elements are the same or similar to the formation and material of the antenna elements 225a and/or 225b, and thus may not be repeated herein. The one or more additional antenna elements and one or more the metallization layers 214a-214d may be formed at the same step; however, the disclosure is not limited to. In the disclosure, the arrangement of the one or more additional antenna elements corresponds to the arrangements of the antenna elements 225a-225b. Owing to the configuration of the antennas ATN3 in addition to the antennas ATN1 and/or the antennas ATN2, a coverage range of the electromagnetic waves in the package structure P7 is widely increased, and the performance (e.g. gain and bandwidth) and the efficiency of the antenna application of the package structure P7 is enhanced.

Figure 20:
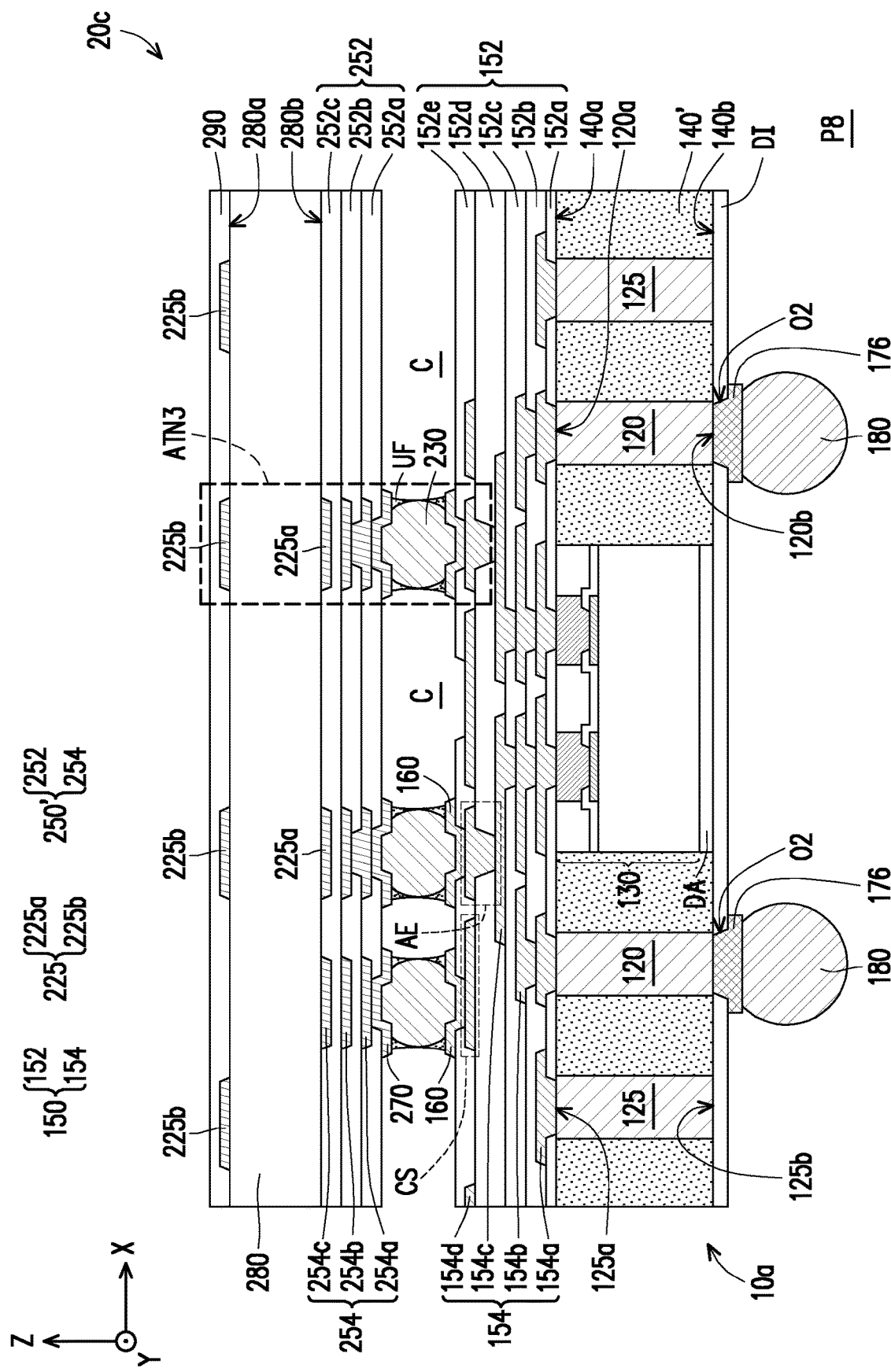
FIG. 20 is a schematic cross sectional view of a package structure according to some exemplary embodiments of the present disclosure.
Figure 21:
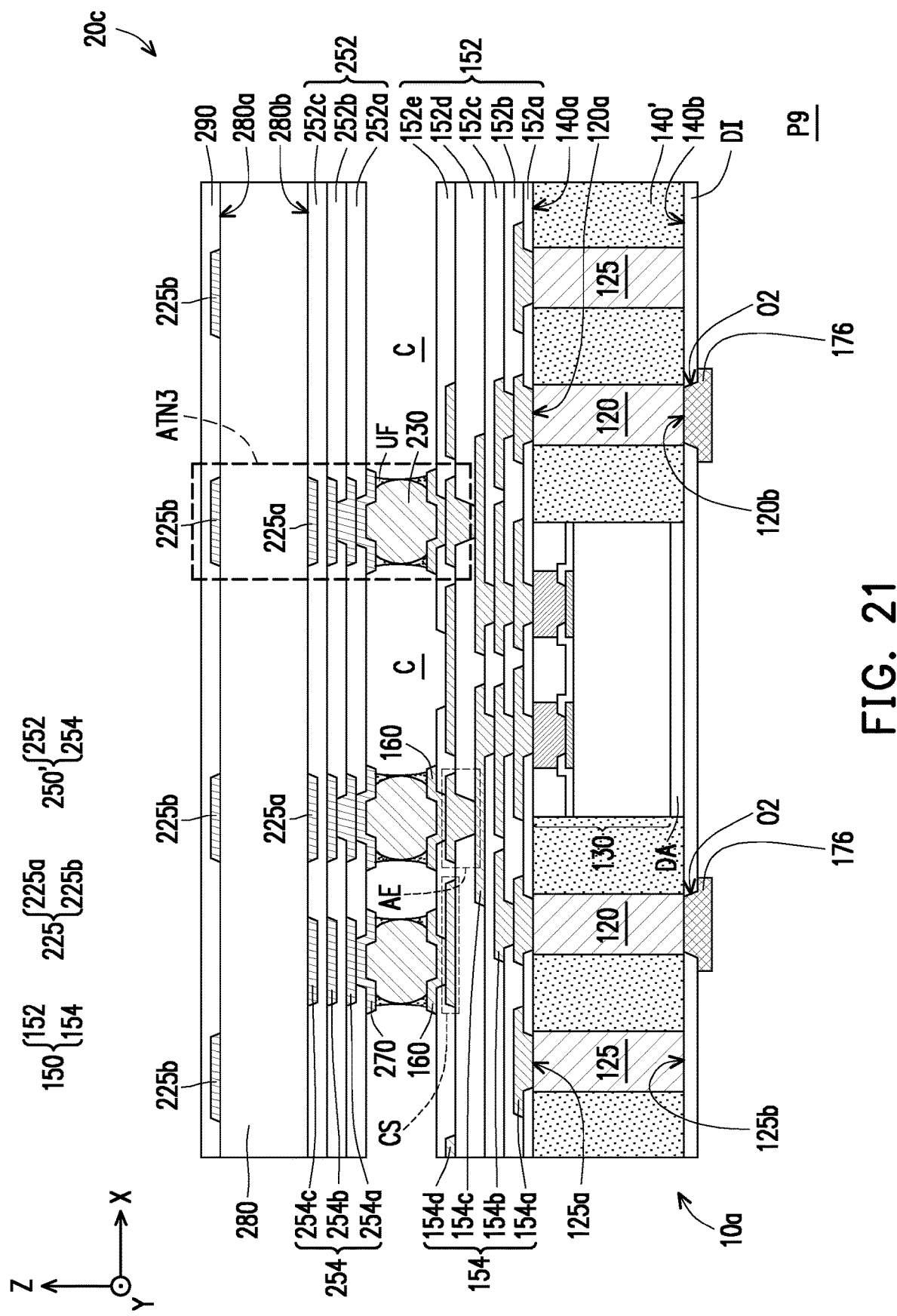
FIG. 21 is a schematic cross sectional view of a package structure according to some exemplary embodiments of the present disclosure.

FIG. 20 is a schematic cross sectional view of a package structure according to some exemplary embodiments of the present disclosure. FIG. 21 is a schematic cross sectional view of a package structure according to some exemplary embodiments of the present disclosure. Referring to FIG. 18 and FIG. 20 together, the package structure P7 depicted in FIG. 18 and the package structure P8 depicted in FIG. 20 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 18 and FIG. 20 together, the difference is that, for the package structure P8 depicted in FIG. 20, not only the second package 20a is replaced with a second package 20c, a dielectric layer DI and connection pads 176 are included in the first package 10a while the redistribution circuit structure 110, the UBM patterns 172, connection pads 174, and the semiconductor devices 190 of the first package 10a are excluded from the first package 10a. In some embodiments, the second package 20c is mounted onto the first package 10a through the conductive joints 230, where the underfill material UF is at least partially wrapped around the sidewalls of the conductive joints 230.

In some embodiments, the second package 20c includes the antenna elements 225 (including the antenna elements 225a and the antenna elements 225b), the conductive joints 230, a redistribution circuit structure 250', the UBM patterns 270, an organic dielectric layer 280, and a dielectric layer 290. As shown in FIG. 20, for example, the antenna elements 225b are disposed on a top surface 280a of the organic dielectric layer 280, and the dielectric layer 290 is formed on the antenna elements 225b and the top surface 280a of the organic dielectric layer 280 exposed by the antenna elements 225b. In some embodiments, the antenna elements 225b are sandwiched between the dielectric layer 290 and the organic dielectric layer 280. The materials of the organic dielectric layer 280 and the dielectric layer 290 may be the same or similar to the material of the organic dielectric layers 212 or the material of the dielectric layers 112, and thus may not be repeated herein.

In some embodiments, the redistribution circuit structure 250' is disposed on a bottom surface 280b of the organic dielectric layer 280, where the redistribution circuit structure 250' is located between the organic dielectric layer 280 and the first package 10a. In some embodiments, the redistribution circuit structure 250' includes sequentially formed one or more dielectric layers 252 and one or more metallization layers 254 in alternation. For example, the redistribution circuit structure 250' includes three dielectric layers 252 (e.g. a dielectric layer 252a, a dielectric layer 252b and dielectric layer 252c) and three metallization layers 254 (e.g. a metallization layer 254a, a metallization layer 254b and metallization layer 254c) as shown in FIG. 20, where the metallization layer 254a is sandwiched between the dielectric layer 252a and the dielectric layer 252b, the metallization layer 254b is sandwiched between the dielectric layer 252b and the dielectric layer 252c, and the metallization layer 254c is covered by the dielectric layer 252c. However, the disclosure is not limited thereto. The numbers of the metallization layers and the dielectric layers included in the redistribution circuit structure 250' is not limited thereto, and may be designated and selected based on the demand. The materials and formation methods of the redistribution circuit structure 250' similar to the processes for forming the redistribution circuit structure 250 as described in FIG. 17 may not be repeated herein.

In some embodiments, portions of a bottom surface of the metallization layer 254a are respectively exposed by the openings of a bottom layer (e.g. the dielectric layer 252a) of the dielectric layers 252 for physically connecting the UBM patterns 270. The formation and material of the UBM patterns 270 may be the same or similar to the formation and material of the UBM patterns 160 or the formation and material of the UBM patterns 172, and thus may not be repeated herein. In some embodiments, as shown in FIG. 20, the conductive joints 230 are respectively disposed on the UBM patterns 270. The number of the conductive joints 230 and the number of the UBM patterns 270 may be one or more than one, where the number of the UBM patterns 270 corresponds to the number of the conductive joints 230.

In certain embodiments, the antenna elements 225a are disposed in the redistribution circuit structure 250' and on the bottom surface 280b of the organic dielectric layer 280. For example, the antenna elements 225a are formed in a step of forming the metallization layer 254c, however, the disclosure is not limited thereto. In an alternative embodiment, the antenna elements 225a may be formed in a step of forming the metallization layer 254b, the disclosure is not limited thereto. As shown in FIG. 20, the antenna elements 225a and the antenna elements 225b, which are stacked on and overlapped with to one another, are electrically coupled. In other words, one of the antenna elements 225a is aligned with a respective one of the antenna elements 225b overlying thereto along the stacking direction Z. In some embodiments, the antenna elements 225a are electrically connected to the redistribution circuit structure 250'.

As shown in FIG. 20, for example, the conductive joints 230 are respectively bonded to the antenna elements AE of the first package 10a through the UBM patterns 160. In one embodiment, the UBM patterns 160 may be omitted, and the conductive joints 230 directly contact the antenna elements AE. In other words, the antenna elements AE of the first package 10a are electrically connected to the antenna elements 225a of the second package 20c through connecting the conductive joints 230 and the antenna elements AE with or without the UBM patterns 160 there-between. In some embodiments, one antenna element AE, one antenna element 225a and one antenna element 225b, which are overlapped with and electrically connected to one another along the stacking direction Z, constitute the antenna ATN3. In some embodiments, for one antenna ATN3, a portion of the metallization layers 154c connecting to the antenna elements AE may serve as feed lines for the antennas ATN3, and another portion of the metallization layers 154c electrically isolated from the feed line and overlapped with the antenna elements AE may serve as a ground plate/line for the antennas ATN3. For example, through the redistribution circuit structure 150, the UBM patterns 160, the conductive joints 230, the UBM patterns 270, the redistribution circuit structure 250', the semiconductor die 130 is electrically connected to the antennas ATN3. In addition, for example, the antenna elements AE of the first package 10a are connected to the conductive joints 230 of the second package 20c through physically connection. Owing to such configuration, the antenna elements AE not only serve as a part of the antenna ATN3 but also serve as a connecting structure (along with a respective one conductive joint 230) of the package structure P8 for ensuring the bonding strength between the conductive joints 230 and the antenna elements AE.

In some embodiments, the conductive joints 230 are not overlapped with the antennas ATN1 but overlapped with the antennas ATN3. For example, the positioning locations of the conductive joints 230 are located aside of the positioning locations of the antennas ATN1 and are overlapped with the positioning locations of the antennas ATN3 along the stacking direction Z (e.g. on the vertical projection on the X-Y plane).

In addition, for example, the package structure P8 may further include at least one connecting structure CS for ensuring the bonding strength between the first package 10a and the second package 20c, as shown in FIG. 20. The disclosure is not limited; in an alternative embodiment, the connecting structure CS may be omitted. Owing to the configuration of the antennas ATN3 in addition to the antennas ATN1, a coverage range of the electromagnetic waves in the package structure P8 is widely increased, and the performance (e.g. gain and bandwidth) and the efficiency of the antenna application of the package structure P8 is enhanced.

In some embodiments, at least one antenna element 225b overlaps with the underlying antenna element(s) 125a along the stacking direction Z, as shown in FIG. 20; however, the disclose is not limited thereto. In an alternative embodiment, no antenna element 225b may be overlapped with the underlying antenna element(s) 125a along the stacking direction Z.

Continued on FIG. 20, in some embodiments, the redistribution circuit structure 110 of the first package 10a is replaced by a dielectric layer DI for providing protection to the semiconductor die 130, the conductive pillars 120, and the antenna elements 125. The formation and material of the dielectric layer DI may be the same or similar to the formation and material of the dielectric layer 126 described in FIG. 15, and thus may not be repeated herein.

In some embodiments, a plurality of contact openings (or recesses) O2 are formed in the dielectric layer DI to expose the bottom surface 120b of the conductive pillars 120. The formation of the contact openings O2 is similar to the process of forming the contact openings O1, and the number of the contact openings O2 may be one or more than one. In some embodiments, connection pads 176 are formed on the dielectric layer DI and is connected to the conductive pillars 120 through the contact openings O2, respectively. In some embodiments, the materials of the connection pads 176 may include copper, nickel, titanium, tungsten, or alloys thereof or the like, and may be formed by an electroplating process, for example.

In certain embodiments, as show in FIG. 20, the conductive elements 180 may be formed on the connection pads 176 and serve as the conductive terminals of the package structure P8 for connecting to additional package, chips/dies, other electronic devices, or a suitable substrate (e.g. an organic substrate) to form a stacked package structure. The number of the connection pads 176 and the number of the conductive elements 180 is not limited thereto, and may be selected based on the demand or design layout by adjusting the number of the contact openings O2.

However, the disclosure is not limited thereto. In an alternative embodiment, the conductive elements 180 depicted in FIG. 20 may be omitted from the first package 10a, where the connection pads 176 will serve as the conductive terminals for connecting to additional package, chips/dies, other electronic devices, or a suitable substrate (e.g. an organic substrate) to form a stacked package structure, see a package structure P9 depicted in FIG. 21.

Figure 22:
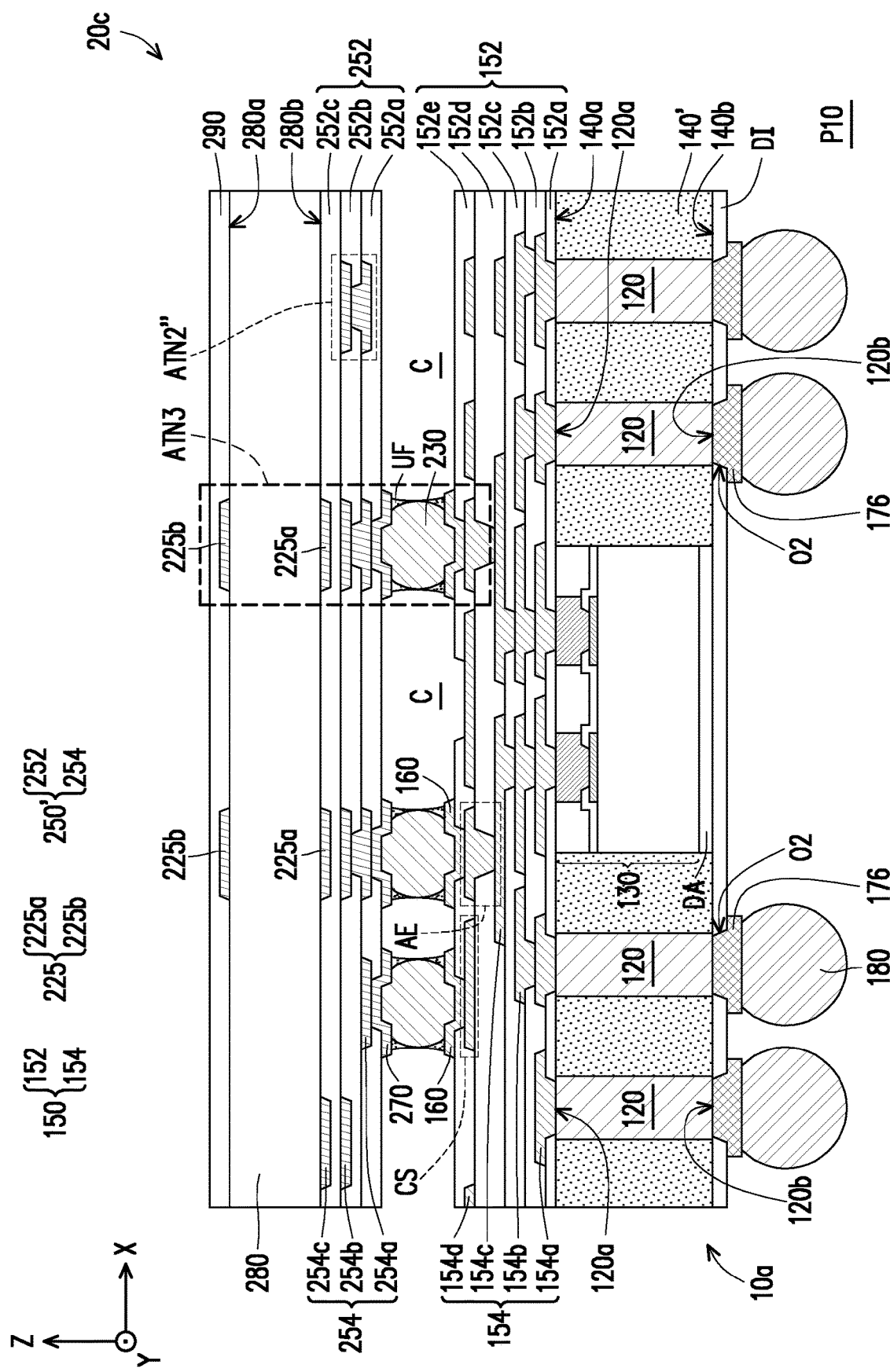
FIG. 22 is a schematic cross sectional view of a package structure according to some exemplary embodiments of the present disclosure.

FIG. 22 is a schematic cross sectional view of a package structure according to some exemplary embodiments of the present disclosure. Referring to FIG. 20 and FIG. 22 together, the package structure P8 depicted in FIG. 20 and the package structure P10 depicted in FIG. 22 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 20 and FIG. 22 together, the difference is that, for the package structure P10 depicted in FIG. 22, the antenna elements 125 are omitted from the first package 10a while antennas ATN2" are formed in the second package 20c. In other words, the antennas ATN2" are introduced to the second package 20c, and the antennas ATN1 are omitted from the first package 10a, for example. In some embodiments, the second package 20c is mounted onto the first package 10a through the conductive joints 230, where the underfill material UF is at least partially wrapped around the sidewalls of the conductive joints 230.

In some embodiments, in the second package 20c, portions of the metallization layers 254 aligning along the stacking direction Z and separated from the rest of the metallization layers 254 on a X-Y plane are stacked on and connected to one another to constitute a pillar-structure or a column-structure (indicated in a dotted box depicted in FIG. 22), where a pair of two adjacent pillar-structures or column-structures together serve as an antenna ATN2". In one embodiment, the antennas ATN2" may be dipole antennas with vertical polarization or horizontal polarization. In some embodiments, for each antenna ATN2", one of the pillar-structures or column-structures is electrically connected to a portion of the rest of the redistribution circuit structure 250' which serves as a feed-line of the antenna ATN2", and other one of the pillar-structures or column-structures is electrically connected to another portion of the rest of the redistribution circuit structure 250' which serves as a ground plate/line of the antenna ATN2". In other words, a part of the redistribution circuit structure 250' electrically connected to the antenna ATN2" is referred as a ground plate/line and/or a feed line thereof.

As shown in FIG. 22, for example, the antennas ATN2" are arranged along the edges of the second package 20c. The arrangement of the antennas ATN2" is similar to the arrangement of the antennas ATN2 and/or ATN2', and thus may not be repeated herein. For example, through the redistribution circuit structure 150, the UBM patterns 160, the conductive joints 230, the UBM patterns 270, the redistribution circuit structure 250', the semiconductor die 130 is electrically connected to the antennas ATN2".

In some embodiments, at least one antenna ATN2" overlaps with the underlying conductive pillar(s) 120 along the stacking direction Z, as shown in FIG. 22; however, the disclose is not limited thereto. In an alternative embodiment, no antenna ATN2" may be overlapped with the underlying conductive pillar(s) 120 along the stacking direction Z.

Continued on FIG. 22, in some embodiments, the antenna elements 125 are replaced by the conductive pillars 120. In other words, the antennas ATN1 are omitted from the first package 10a depicted in FIG. 22, for example. Owing to such configuration, more conductive terminals (e.g. the conductive elements 180) are provided to the package structure P10. In some embodiments, the conductive joints 230 are not overlapped with the antennas ATN2" but overlapped with the antennas ATN3. For example, positioning locations of the conductive joints 230 are located aside of the positioning locations of the antennas ATN2" and are overlapped with the positioning locations of the antennas ATN3 along the stacking direction Z (e.g. on the vertical projection on the X-Y plane).

However, the disclosure is not limited thereto. In an alternative embodiment, the conductive elements 180 depicted in FIG. 22 may be omitted from the first package 10a, where the connection pads 176 will serve as the conductive terminals for connecting to additional package, chips/dies, other electronic devices, or a suitable substrate (e.g. an organic substrate) to form a stacked package structure, see a package structure P11 depicted in FIG. 23.

Figure 23:
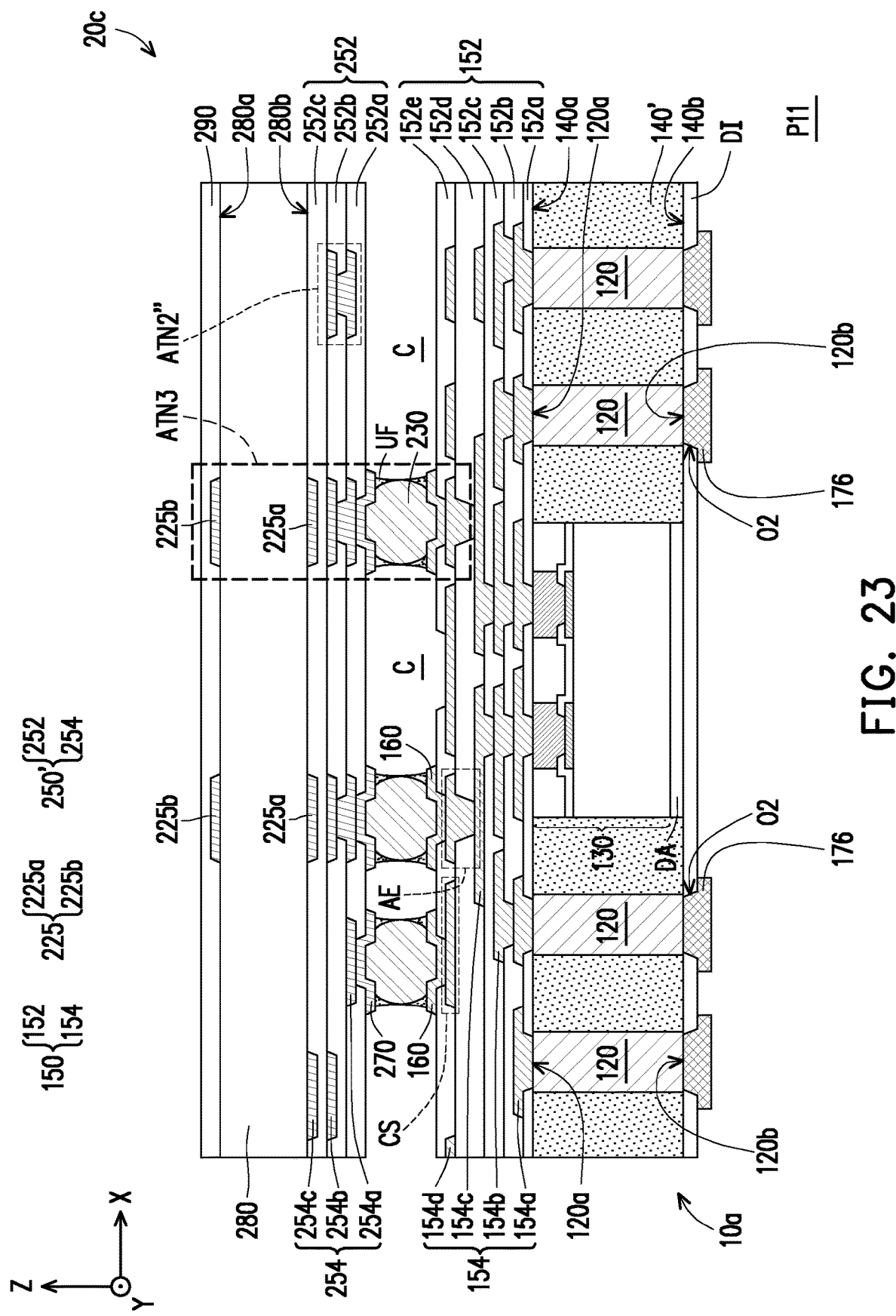
FIG. 23 is a schematic cross sectional view of a package structure according to some exemplary embodiments of the present disclosure.

On the other hand, for example, the antennas ATN2" depicted in the package structure P10 of FIG. 22 and the package structure P11 of FIG. 23 may also be introduced to the package structure P8 of FIG. 20 and/or the package structure P9 of FIG. 21. The disclosure is not limited thereto.

Figure 24:
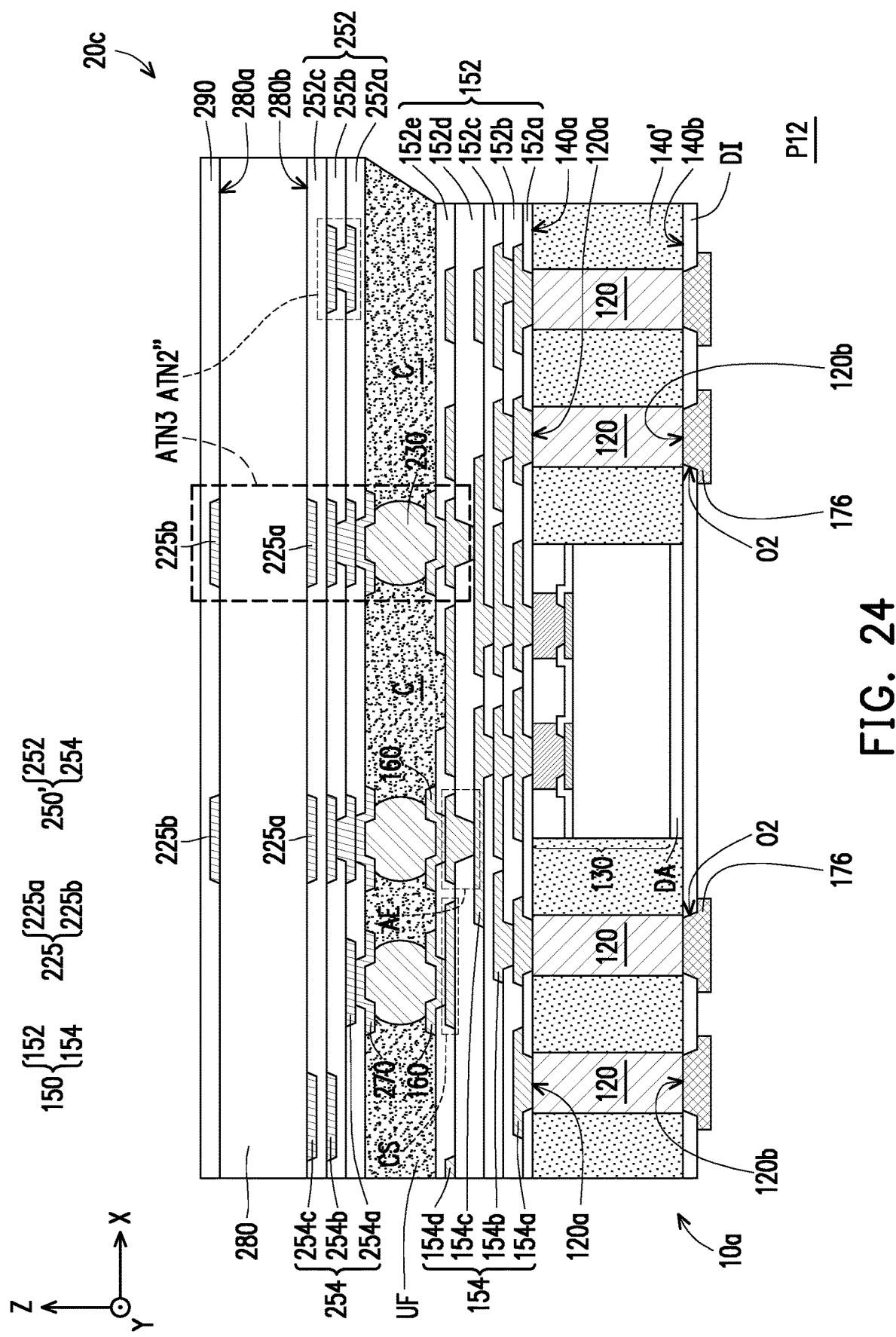
FIG. 24 is a schematic cross sectional view of a package structure according to some exemplary embodiments of the present disclosure.

FIG. 24 is a schematic cross sectional view of a package structure according to some exemplary embodiments of the present disclosure. Referring to FIG. 22 and FIG. 24 together, the package structure P10 depicted in FIG. 22 and the package structure P12 depicted in FIG. 24 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 22 and FIG. 24 together, the difference is that, for the package structure P12 depicted in FIG. 24, a size of the second package 20c is greater than a size of the first package 10a on the X-Y plane, and the underfill material UF not only further fills up the gaps between the conductive joints 230 and the gaps between the conductive joints 230, the redistribution circuit structure 250' and the redistribution circuit structure 150 and but also extends to the sidewall of the first package 10a. In other words, for example, the underfill material UF covers the surfaces of the redistribution circuit structure 250' and the redistribution circuit structure 150 facing to each other and completely fills up the cavity C between the conductive joints 230, the redistribution circuit structure 250', and the redistribution circuit structure 150, where a portion of the sidewall of the first package 10a is covered by the underfill material UF. Owing to underfill material UF, the bonding strength between the first package 10a and the second package 20c of the package structure P12 is further increased.

Figure 25:
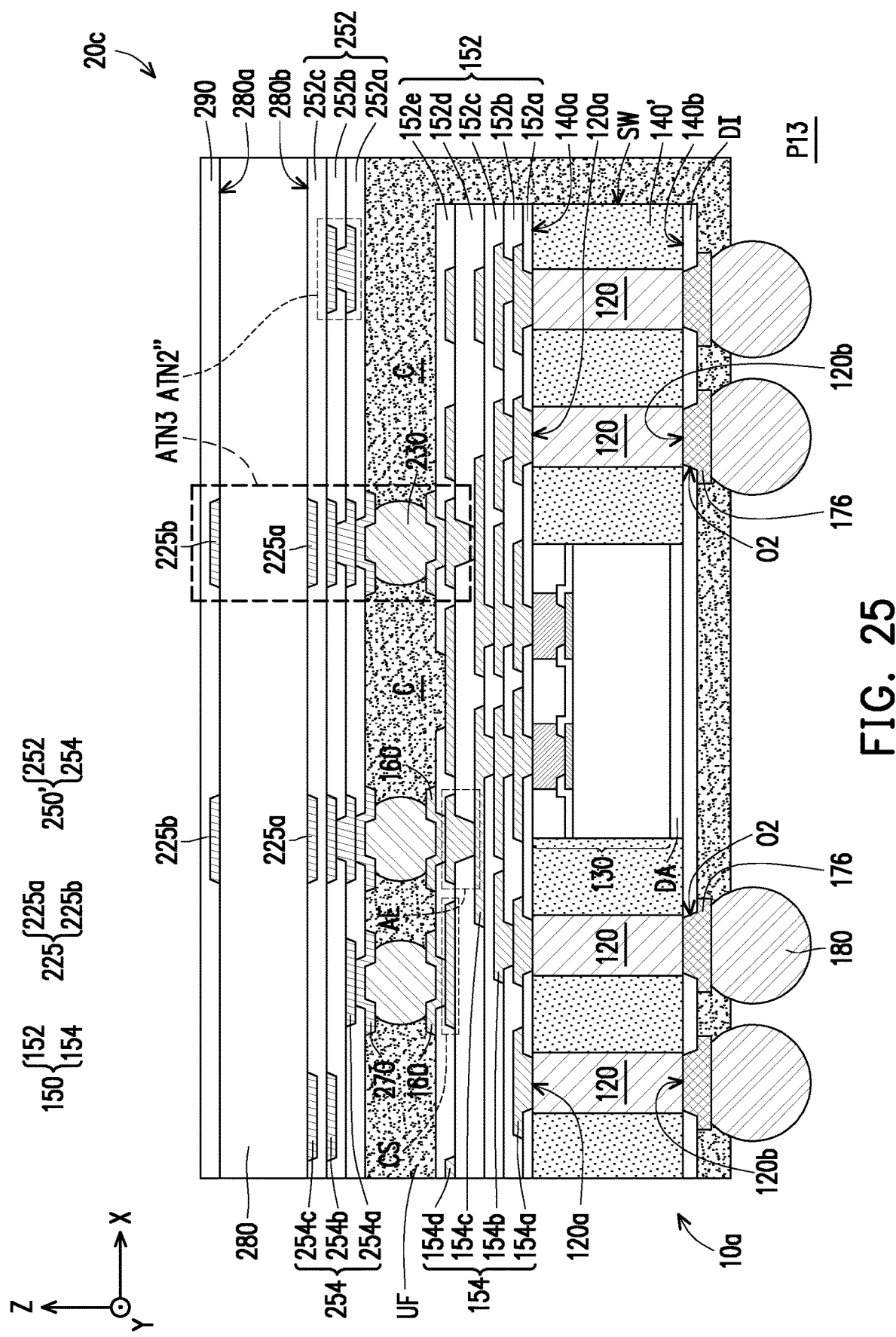
FIG. 25 is a schematic cross sectional view of a package structure according to some exemplary embodiments of the present disclosure.

FIG. 25 is a schematic cross sectional view of a package structure according to some exemplary embodiments of the present disclosure. Referring to FIG. 24 and FIG. 25 together, the package structure P12 depicted in FIG. 24 and the package structure P13 depicted in FIG. 25 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 24 and FIG. 25 together, the difference is that, for the package structure P13 depicted in FIG. 25, the underfill material UF not only further extends to the sidewall SW of the first package 10a but also extends to cover the conductive elements 180. In other words, for example, the underfill material UF covers the surfaces of the redistribution circuit structure 250' and the redistribution circuit structure 150 facing to each other and completely fills up the cavity C between the conductive joints 230, the redistribution circuit structure 250', and the redistribution circuit structure 150, where the sidewall of the first package 10a is completely covered by the underfill material UF and a surface of the first package 10a disposed with the conductive elements 180 is also covered by the underfill material UF. For example, as shown in FIG. 25, a portion of the sidewall of each conductive element 180 is covered by the underfill material UF. Owing to underfill material UF, the bonding strength between the first package 10a and the second package 20c of the package structure P13 is further increased, and the first package 10a is further protected by the underfill material UF. For example, the conductive elements 180 are further secured to the first package 10a due to the underfill material UF.

FIG. 26 to FIG. 30 are schematic cross sectional views of various stages in a manufacturing method of a package structure in accordance with some embodiments of the disclosure. The elements similar to or substantially the same as the elements described previously will use the same reference numbers, and certain details or descriptions of the same elements (e.g. the formations and materials) and the relationship thereof (e.g. the relative positioning configuration and electrical connection) will not be repeated herein.

Figure 26:
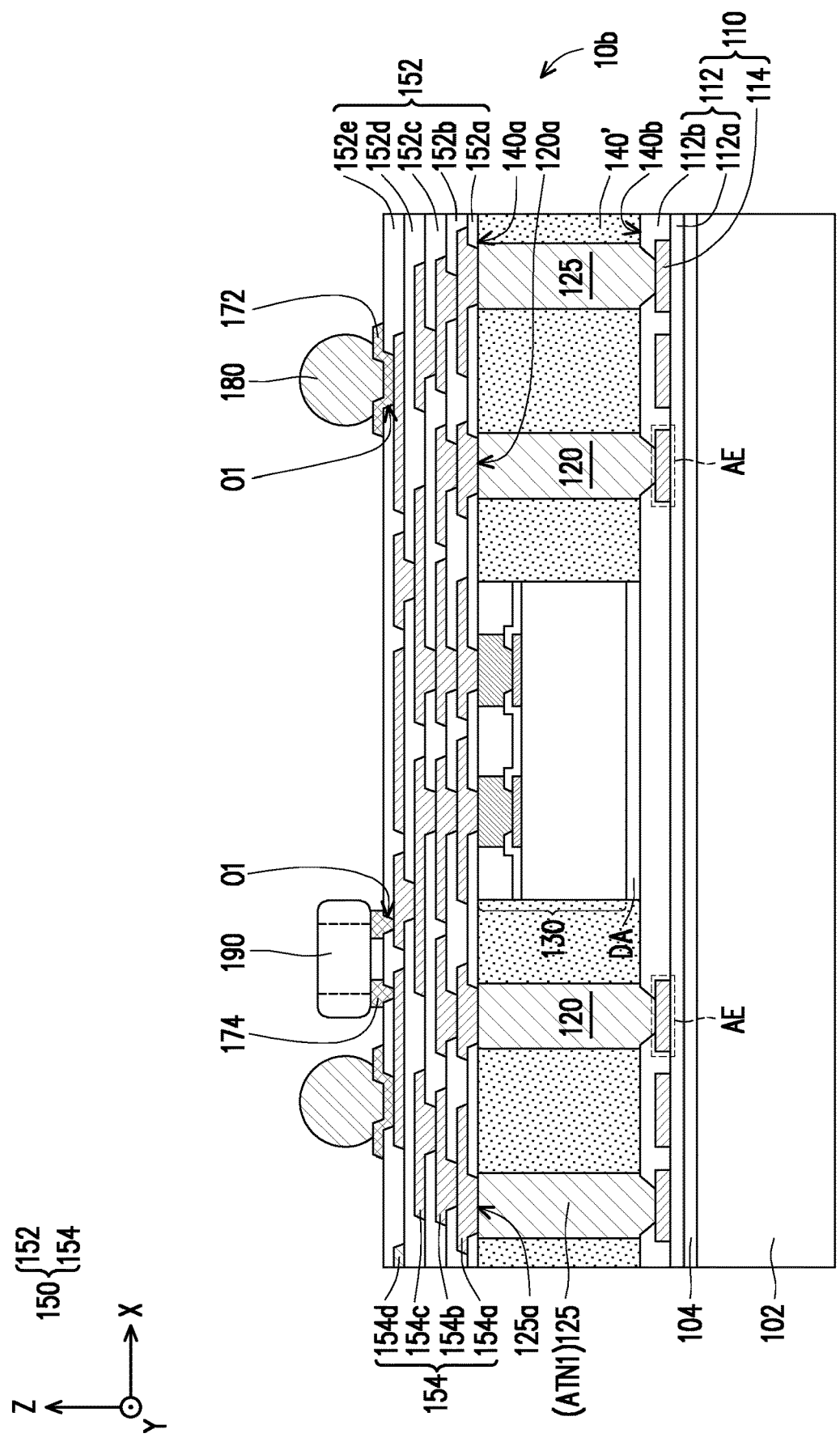
FIG. 26 to FIG. 30 are schematic cross sectional views of various stages in a manufacturing method of a package structure in accordance with some embodiments of the disclosure.

Referring to FIG. 26, in some embodiments, the redistribution circuit structure 150, the UBM patterns 172 and the connection pads 174, the conductive elements 180, and the semiconductor device 190 are sequentially form on the top surface 120a of the conductive pillars 120, the top surface 125a of the antenna elements 125, the top surface of the semiconductor die 130, and the top surface 140a of the insulating encapsulation 140', following the process as described in FIG. 4. The numbers of the UBM patterns 172 and the connection pads 174 and the numbers of the conductive elements 180 and the semiconductor device 190 are not limited to the disclosure. The numbers of the dielectric layers 152 and the metallization layers 154 of the redistribution circuit structure 150 are not limited to the disclosure. As shown in FIG. 26, the antennas ATN1 (e.g. the antenna elements 125) are electrically connected to the semiconductor die 130 through the redistribution circuit structure 150, where the redistribution circuit structure 110 and/or the redistribution circuit structure 150 electrically connected to the antennas ATN1 serve as a ground plate/line and a feed-line for the antennas ATN1.

In some embodiments, the semiconductor die 130 is located between the redistribution circuit structure 110 and the redistribution circuit structure 150, where the semiconductor die 130 is physically and electrically connected to the redistribution circuit structure 150. For example, the semiconductor die 130 is electrically connected to the conductive pillars 120 and the antenna elements 125 through the redistribution circuit structure 150, and the semiconductor die 130 is electrically connected to the redistribution circuit structure 110 through the conductive pillars 120, the antenna elements 125, and the redistribution circuit structure 150. In some embodiments, the conductive pillars 120 are arranged around the semiconductor die 130, and the antenna elements 125 are arranged around the conductive pillars 120.

Figure 27:
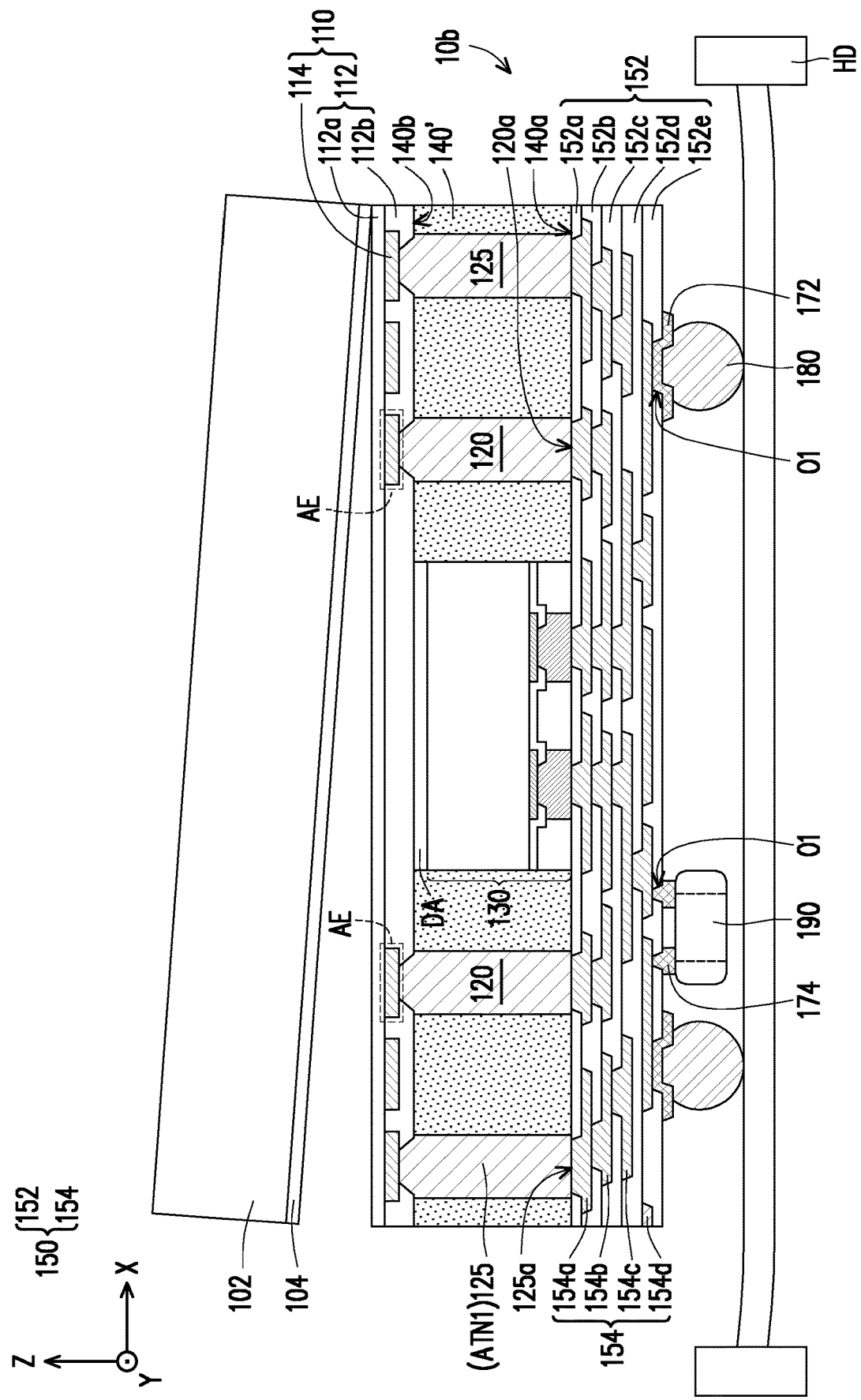

Referring to FIG. 27, in some embodiments, the whole first package 10b along with the carrier 102 is flipped (turned upside down), where the conductive elements 180 and the semiconductor devices 190 are placed to the holding device HD, and the carrier 102 is then debonded from the redistribution circuit structure 110. In some embodiments, the redistribution circuit structure 110 is easily separated from the carrier 102 due to the debond layer 104. In some embodiments, the carrier 102 is detached from the redistribution circuit structure 110 through a debonding process, and the carrier 102 and the debond layer 104 are removed. In certain embodiments, the redistribution circuit structure 110 (e.g. the dielectric layer 112a) is exposed, as show in FIG. 27. In one embodiment, the debonding process is a laser debonding process. During the debonding step, the holding device HD is used to secure the first package 10b before debonding the carrier 102 and the debond layer 104.

In some embodiments, prior to flipping the first package 10b as described in FIG. 27 and debonding the carrier 102 therefrom, a pre-cutting step is performed to the first package 10b. For example, the pre-cutting step cut through at least the redistribution circuit structure 150, the insulating encapsulation 140', and the redistribution circuit structure 110 of the first package 10b. Due to the pre-cutting step, the first packages 10b interconnected therebetween are partially diced; and due to the debonding step, the partially diced first packages 10b are entirely separated from one another.

Figure 28:
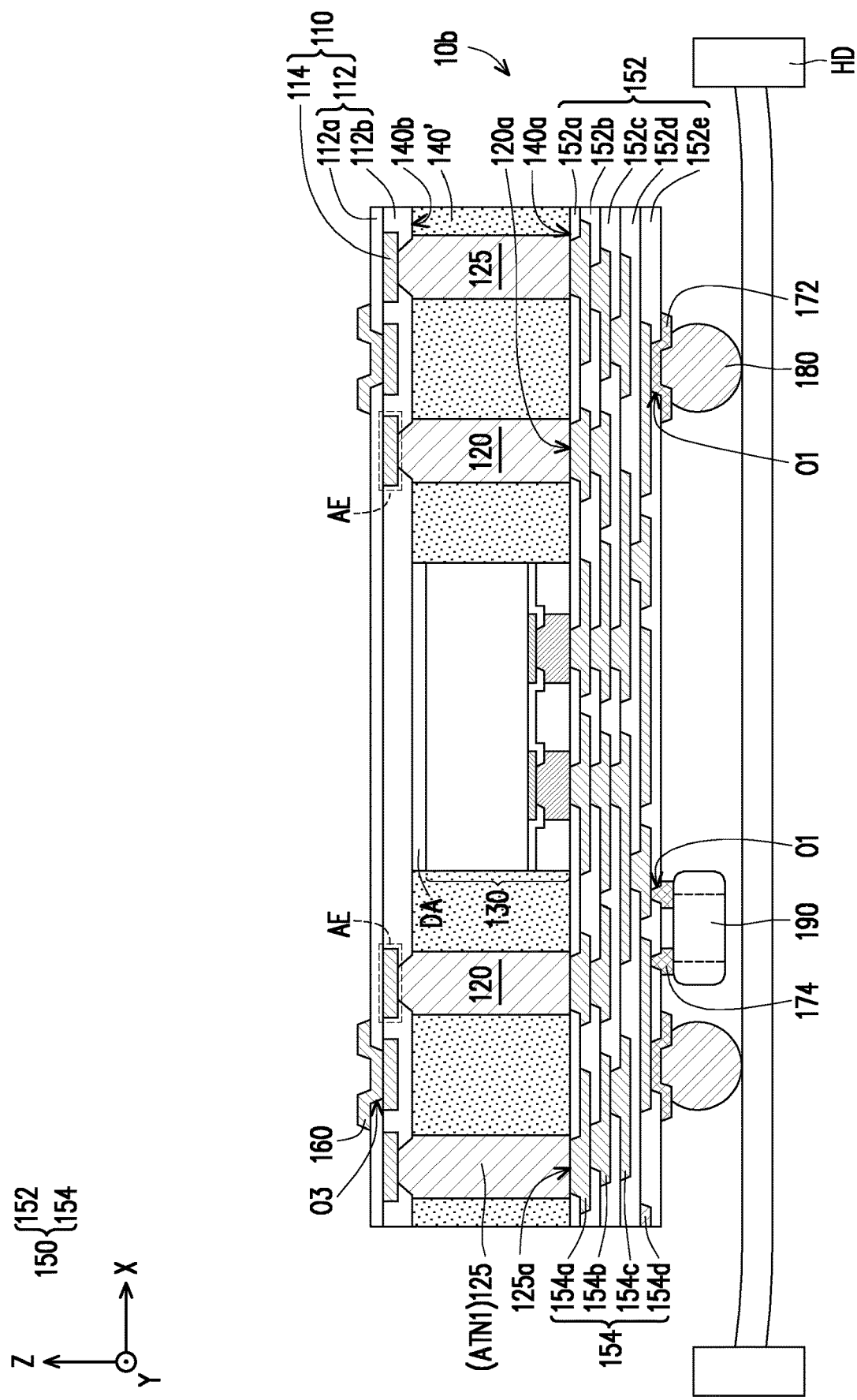

Referring to FIG. 28, in some embodiments, after removing the carrier 102 and the debond layer 104 and exposing the dielectric layer 112a of the redistribution circuit structure 110, a plurality of contact openings (or recesses) O3 are formed in the dielectric layer 112a to expose portions of the metallization layer 154. The formation of the contact openings O3 may be the same or similar to the contact openings O1 and/or the contact openings O2. The number of the contact openings O3 are not limited to the disclosure, and may be one or more than one.

In some embodiments, the UBM patterns 160 are disposed on the dielectric layer 112a and connected to the exposed portions of the metallization layer 154 through the contact openings O3. The UBM patterns 160 are used to electrically connect the underlying exposed portions of the metallization layer 154 and the overlying connectors (e.g. conductive balls or conductive bumps, such as the conductive joints 230 of the second package 20a depicted in FIG. 29). The number of the UBM patterns 160 is not limited in this disclosure, and may be controlled by adjusting the number of the contact openings O3. In some embodiments, the UBM patterns 160 may be omitted from the first package 10b, the disclosure is not limited thereto.

Figure 29:
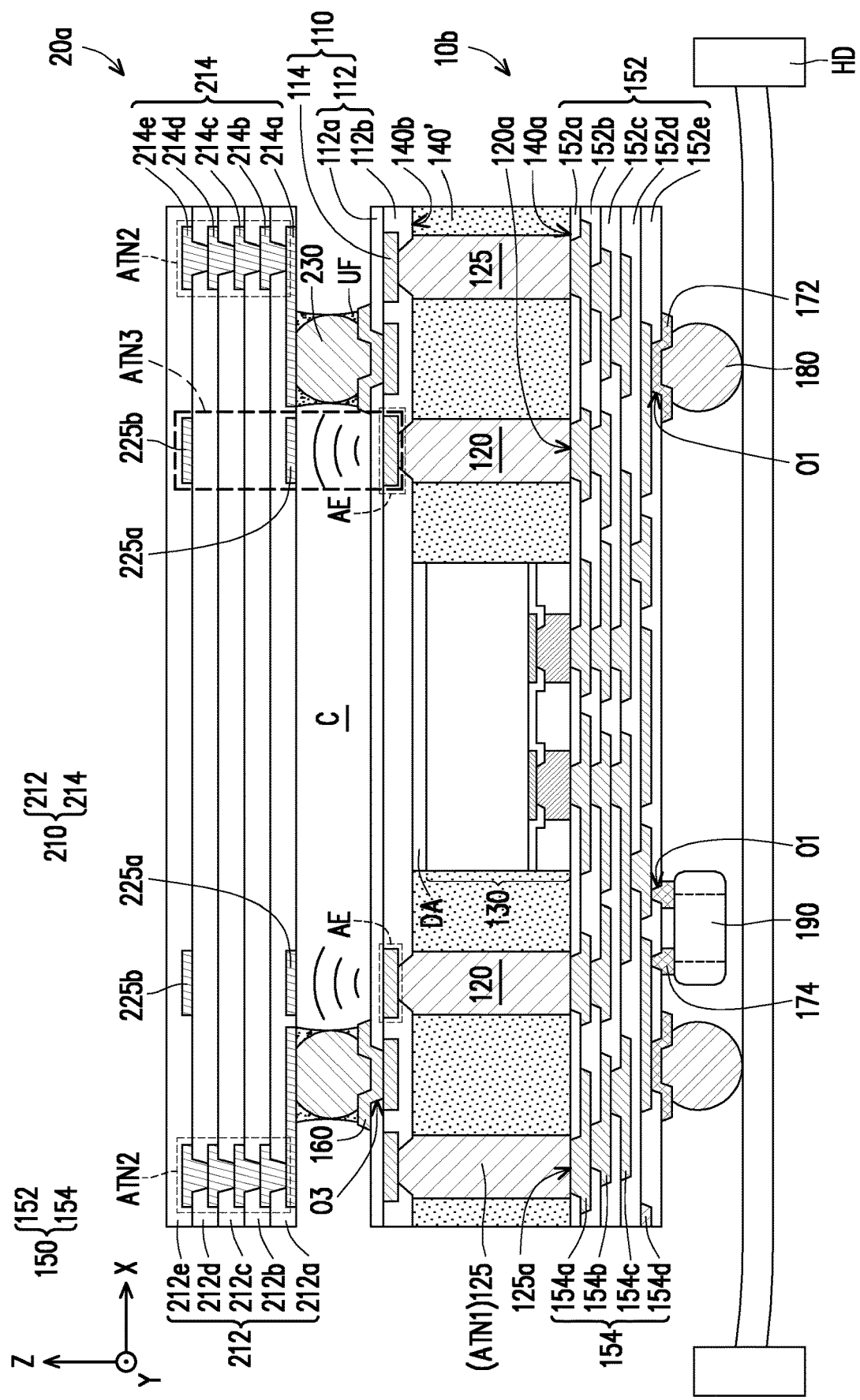

Referring to FIG. 29, in some embodiments, the second package 20a is provided and is placed over and then mounted onto the first package 10b. In some embodiments, the second package 20a is bonded on the first package 10b through mechanically connecting the conductive joints 230 and the UBM patterns 160, where the conductive joints 230 are wrapped by the underfill material UF for ensuring the bonding strength between the second package 20a and the first package 10b. Due to the self-alignment between the conductive joints 230 and the UBM patterns 160, the bonding process of the second package 20a and the first package 10b is ease and time-saved.

In some embodiments, as shown in FIG. 29, the antennas ATN2 (e.g. the metallization layers 214b-214e) are electrically connected to the semiconductor die 130 through the metallization layers 214a, the conductive joints 230, the UBM patterns 160, the redistribution circuit structure 110, the conductive pillars 120, and the redistribution circuit structure 150, where the signal transmission between the semiconductor die 130 and the antennas ATN2 is ensured. For example, the metallization layer 214a electrically connected to the antennas ATN2 serve as a ground plate/line and a feed-line for the antennas ATN2. In some embodiments, the antennas ATN3 (e.g. the antenna elements AE, 225a, and 225b aligned to and overlapped with each other along the stacking direction Z) are electrically connected to the semiconductor die 130 through the redistribution circuit structure 110, the conductive pillars 120, and the redistribution circuit structure 150, where the signal transmission between the semiconductor die 130 and the antennas ATN3 is ensured. For example, the redistribution circuit structure 110 electrically connected to the antennas ATN3 serve as a ground plate/line and a feed-line for the antennas ATN3.

In some embodiments, the conductive joints 230 are not overlapped with the antennas ATN1, the antennas ATN2, and the antennas ATN3. For example, the positioning locations of the conductive joints 230 are located aside of the positioning locations of the antennas ATN1, the positioning locations of the antennas ATN2 and the positioning locations of the antennas ATN3 along the stacking direction Z (e.g. on the vertical projection on the X-Y plane).

As shown in FIG. 29, for example, in each antenna ATN3, the antenna element AE of the first package 10b is electrically connected to the respective one antenna element 225a and the respective one antenna element 225b of the second package 20a in a manner of electrical coupling. In some embodiments, due to the cavity C formed between the antenna elements AE and the antenna elements 225a, the package structure P14 achieves a higher gain and wide bandwidth for the antennas ATN3. Owing to conductive joints 230 being located aside of the antennas ATN3 in a projection on the first package 10b and/or the second package 20a along the stacking direction Z, the interference between the antennas ATN3 having different transmitting frequencies in one package structure P14 and/or among a plurality of the package structures P14 can be suppressed, thereby reducing the surface noise among the antennas ATN3; the performance of the package structure P14 is further improved. Owing to the configuration of the antennas ATN3 in addition to the antennas ATN1 and/or the antennas ATN2, a coverage range of the electromagnetic waves in the package structure P14 is widely increased, and the performance (e.g. gain and bandwidth) and the efficiency of the antenna application of the package structure P14 is thus enhanced.

Figure 30:
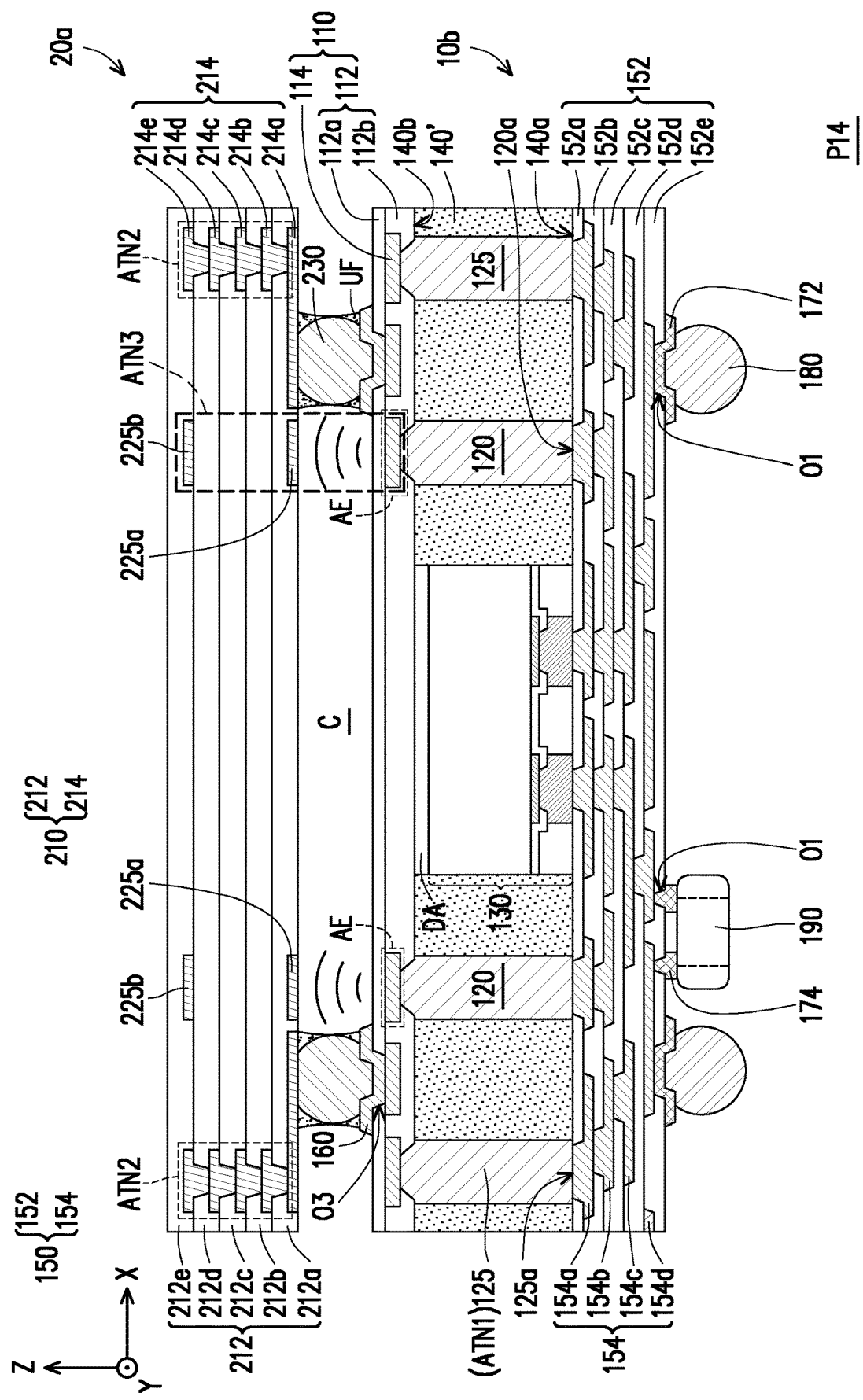

Referring to FIG. 30, in some embodiments, the conductive elements 180 and/or the semiconductor device 190 are released from the holding device HD to form the package structure P14. Up to here, the manufacture of the package structure P14 is completed. In some embodiments, the package structure P14 may be further mounted with an additional package, chips/dies, other electronic devices, or a suitable substrate (e.g. an organic substrate) to form a stacked package structure, the disclosure is not limited thereto.

Figure 31:
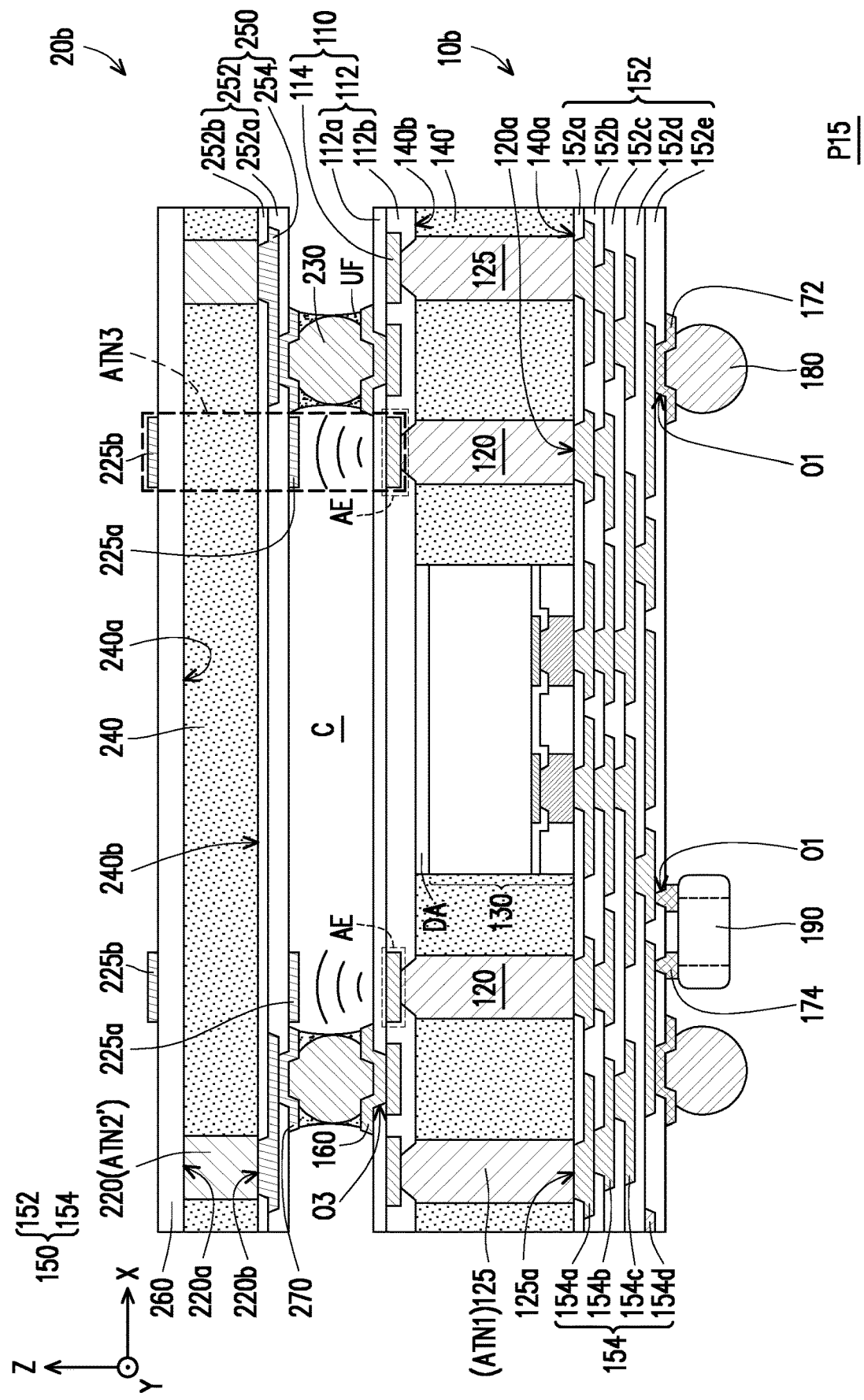
FIG. 31 is a schematic cross sectional view of a package structure according to some exemplary embodiments of the present disclosure.

FIG. 31 is a schematic cross sectional view of a package structure according to some exemplary embodiments of the present disclosure. Referring to FIG. 30 and FIG. 31 together, the package structure P14 depicted in FIG. 30 and the package structure P15 depicted in FIG. 31 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 30 and FIG. 31 together, the difference is that, for the package structure P15 depicted in FIG. 31, the second package 20a is replaced with the second package 20b (as described in FIG. 17). In some embodiments, the second package 20b is mounted onto the first package 10b through the conductive joints 230, where the underfill material UF is at least partially wrapped around the sidewalls of the conductive joints 230.

In some embodiments, as shown in FIG. 31, the antenna ATN2' are electrically connected to the semiconductor die 130 through the metallization layer 254, the UBM patterns 270, the conductive joints 230, the UBM patterns 160, the redistribution circuit structure 110, the conductive pillars 120, and the redistribution circuit structure 150, where the signal transmission between the semiconductor die 130 and the antennas ATN2' is ensured. For example, the metallization layer 254 electrically connected to the antennas ATN2' serve as a ground plate/line and a feed-line for the antennas ATN2'. In some embodiments, the antennas ATN3 (e.g. the antenna elements AE, 225a, and 225b aligned to and overlapped with each other along the stacking direction Z) are electrically connected to the semiconductor die 130 through the redistribution circuit structure 110, the conductive pillars 120, and the redistribution circuit structure 150, where the signal transmission between the semiconductor die 130 and the antennas ATN3 is ensured. For example, the redistribution circuit structure 110 electrically connected to the antennas ATN3 serve as a ground plate/line and a feed-line for the antennas ATN3.

In some embodiments, the conductive joints 230 are not overlapped with the antennas ATN1, the antennas ATN2, and the antennas ATN3. For example, the positioning locations of the conductive joints 230 are located aside of the positioning locations of the antennas ATN1, the positioning locations of the antennas ATN2 and the positioning locations of the antennas ATN3 along the stacking direction Z (e.g. on the vertical projection on the X-Y plane). Owing to the configuration of the antennas ATN3 in addition to the antennas ATN1 and/or the antennas ATN2', a coverage range of the electromagnetic waves in the package structure P15 is widely increased, and the performance (e.g. gain and bandwidth) and the efficiency of the antenna application of the package structure P15 is thus enhanced.

Figure 32:
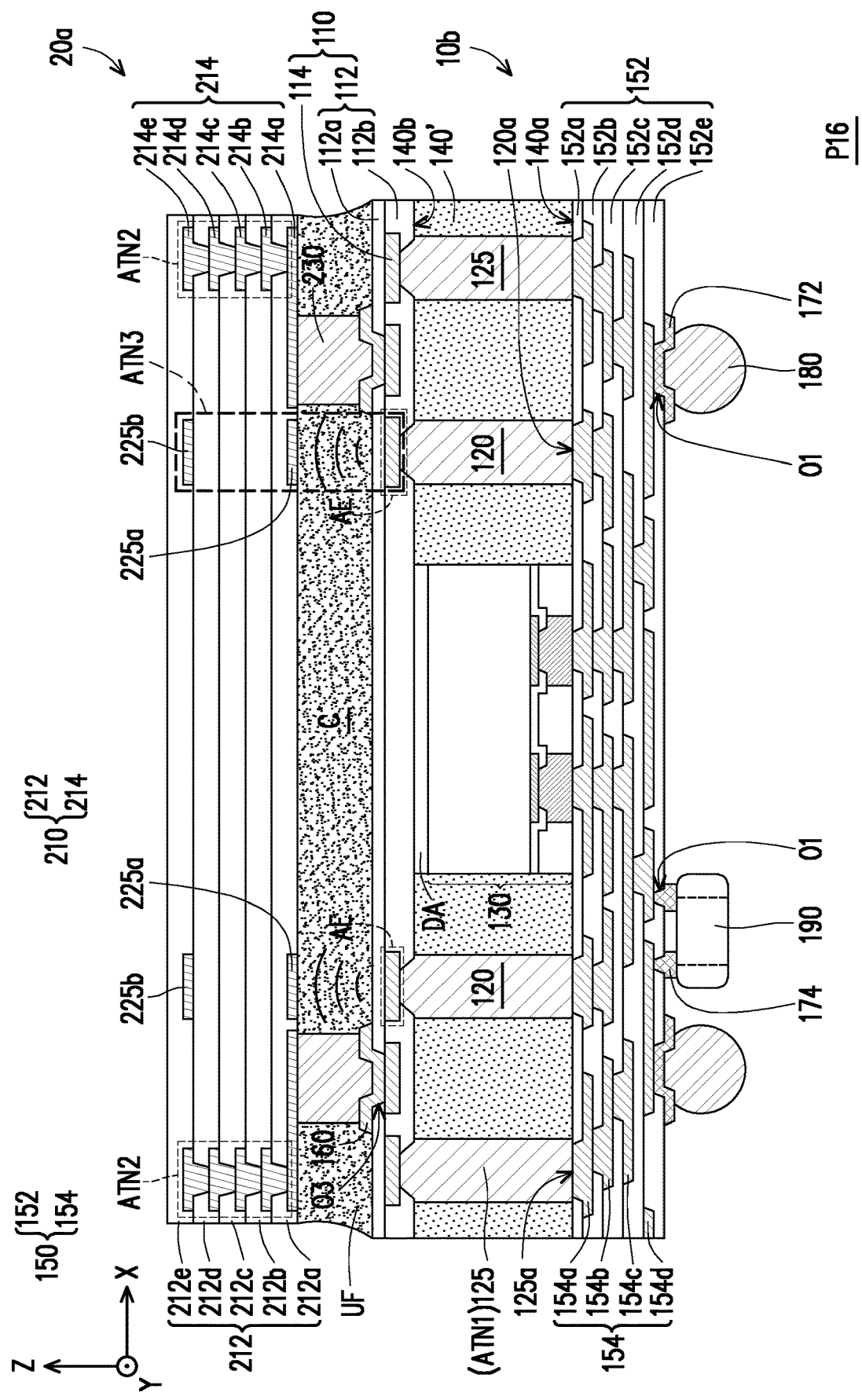
FIG. 32 is a schematic cross sectional view of a package structure according to some exemplary embodiments of the present disclosure.

FIG. 32 is a schematic cross sectional view of a package structure according to some exemplary embodiments of the present disclosure. Referring to FIG. 30 and FIG. 32 together, the package structure P14 depicted in FIG. 30 and the package structure P16 depicted in FIG. 32 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 30 and FIG. 32 together, the difference is that, for the package structure P16 depicted in FIG. 32, the underfill material UF not only wrapped around the sidewalls of the conductive joints 230 but further fills up the gaps between the conductive joints 230 and the gaps between the conductive joints 230, the organic substrate 210 and the redistribution circuit structure 110. In other words, for example, the underfill material UF covers the surfaces of the organic substrate 210 and the redistribution circuit structure 110 facing to each other and completely fills up the cavity C between the conductive joints 230, the organic substrate 210 and the redistribution circuit structure 110. Owing to underfill material UF, the bonding strength between the first package 10b and the second package 20a of the package structure P16 is further increased.

In some embodiments, in package structure P16 depicted in FIG. 32, the conductive joints 230 have planar sidewalls. For example, as shown in FIG. 32, the sidewalls of the conductive joints 230 may include the flat planar sidewalls connecting the organic substrate 210 and the redistribution circuit structure 110, where the flat planar sidewalls are substantially parallel to the direction Z. In other words, the disclosure does not limit the profile of the cross-sectional view of the conductive joints 230 along the direction Z.

Figure 33:
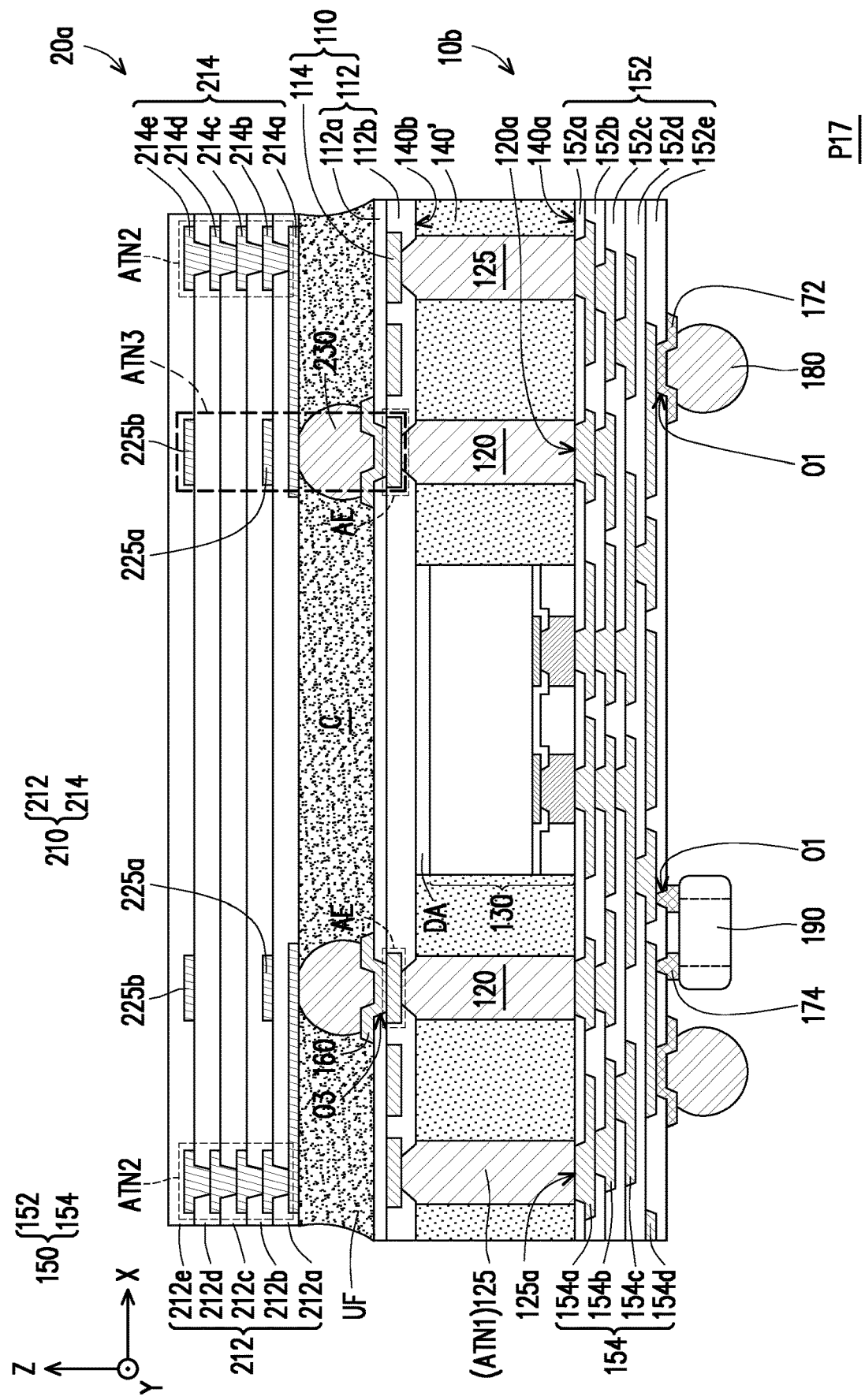
FIG. 33 is a schematic cross sectional view of a package structure according to some exemplary embodiments of the present disclosure.
Figure 34:
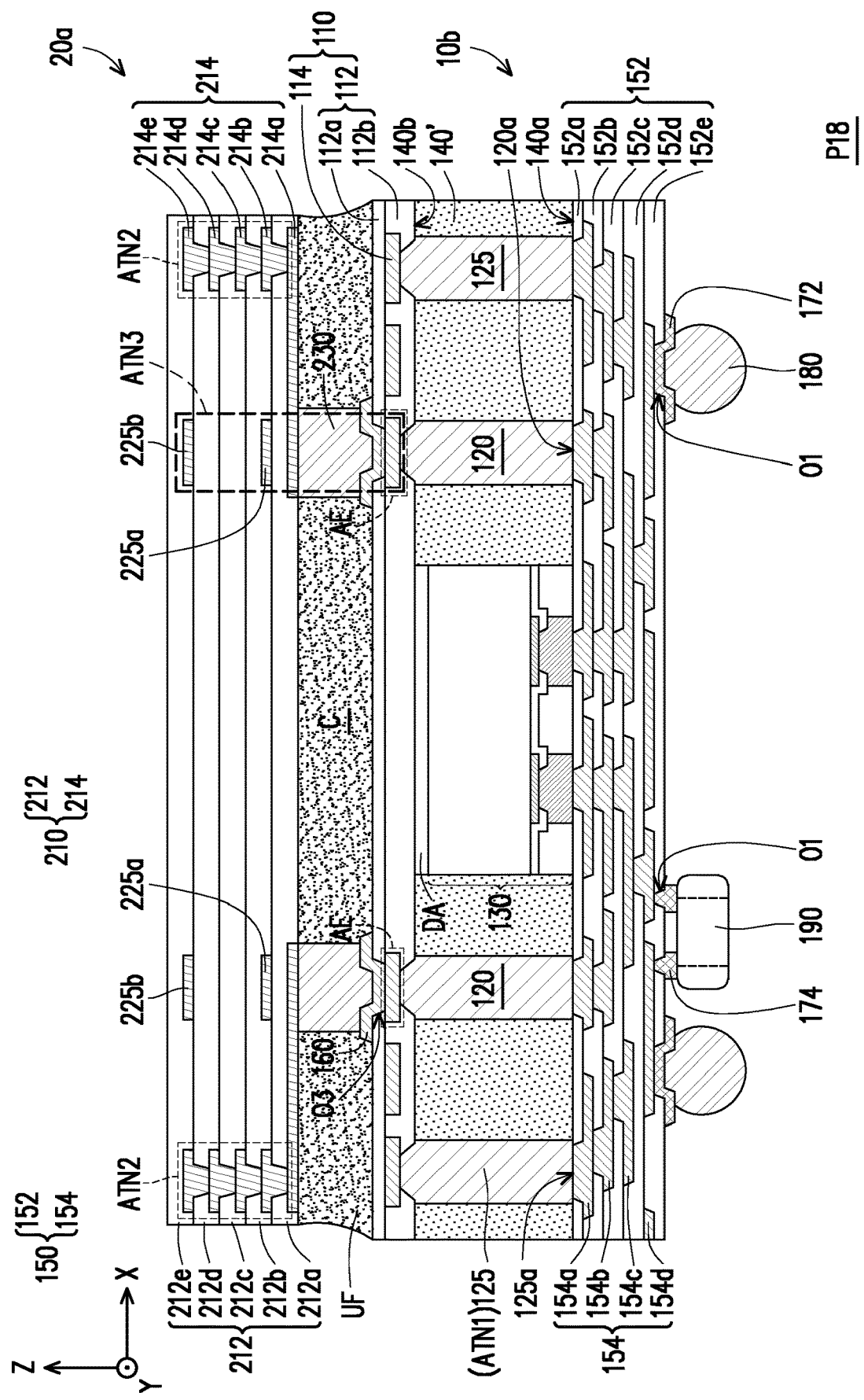
FIG. 34 is a schematic cross sectional view of a package structure according to some exemplary embodiments of the present disclosure.

FIG. 33 is a schematic cross sectional view of a package structure according to some exemplary embodiments of the present disclosure. FIG. 34 is a schematic cross sectional view of a package structure according to some exemplary embodiments of the present disclosure. Referring to FIG. 30 and FIG. 33 together, the package structure P14 depicted in FIG. 30 and the package structure P17 depicted in FIG. 33 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 30 and FIG. 33 together, the difference is that, for the package structure P17 depicted in FIG. 33, the antenna elements AE of the first package 10b are electrically connected to the antenna elements 225a of the second package 20a through physically connecting the conductive joints 230 and the antenna elements AE. In addition, for example, the UBM patterns 160 may be formed between the conductive joints 230 and the antenna elements AE, as shown in FIG. 33; however, the disclosure is not limited thereto. Owing to such configuration, the antenna elements AE not only serve as a part of the antenna ATN3 but also serve as a connecting structure (along with a respective one conductive joint 230) of the package structure P17.

In some embodiments, the antennas ATN2 (e.g. the metallization layers 214b-214e) are electrically connected to the semiconductor die 130 through the metallization layers 214a, the conductive joints 230, the UBM patterns 160, the redistribution circuit structure 110, the conductive pillars 120, and the redistribution circuit structure 150, where the signal transmission between the semiconductor die 130 and the antennas ATN2 is ensured. For example, the metallization layer 214a electrically connected to the antennas ATN2 serve as a ground plate/line and a feed-line for the antennas ATN2. In some embodiments, the antennas ATN3 (e.g. the antenna elements AE, 225a, and 225b aligned to and overlapped with each other along the stacking direction Z) are electrically connected to the semiconductor die 130 through the metallization layers 214a, the conductive joints 230, the UBM patterns 160, the redistribution circuit structure 110, the conductive pillars 120, and the redistribution circuit structure 150, where the signal transmission between the semiconductor die 130 and the antennas ATN3 is ensured. For example, the redistribution circuit structure 110 electrically connected to the antennas ATN3 serve as a ground plate/line and a feed-line for the antennas ATN3. In some embodiments, the conductive joints 230 are not overlapped with the antennas ATN1 and the antennas ATN2 but overlapped with the antennas ATN3. For example, the positioning locations of the conductive joints 230 are located aside of the positioning locations of the antennas ATN1 and the positioning locations of the antennas ATN2 and are overlapped with the positioning locations of the antennas ATN3 along the stacking direction Z (e.g. on the vertical projection on the X-Y plane).

In some embodiments, in the package structure P17 depicted in FIG. 33, the underfill material UF not only wrapped around the sidewalls of the conductive joints 230 but further fills up the gaps between the conductive joints 230 and the gaps between the conductive joints 230, the organic substrate 210 and the redistribution circuit structure 110. In other words, for example, the underfill material UF covers the surfaces of the organic substrate 210 and the redistribution circuit structure 110 facing to each other and completely fills up the cavity C between the conductive joints 230, the organic substrate 210 and the redistribution circuit structure 110. Owing to underfill material UF, the bonding strength between the first package 10b and the second package 20a of the package structure P17 is further increased.

However, in an alternative embodiment, the conductive joints 230 may have planar sidewalls. For example, in a package structure P18 as shown in FIG. 34, the sidewalls of the conductive joints 230 may include the flat planar sidewalls connecting the organic substrate 210 and the redistribution circuit structure 110, where the flat planar sidewalls are substantially parallel to the direction Z.

Figure 35:
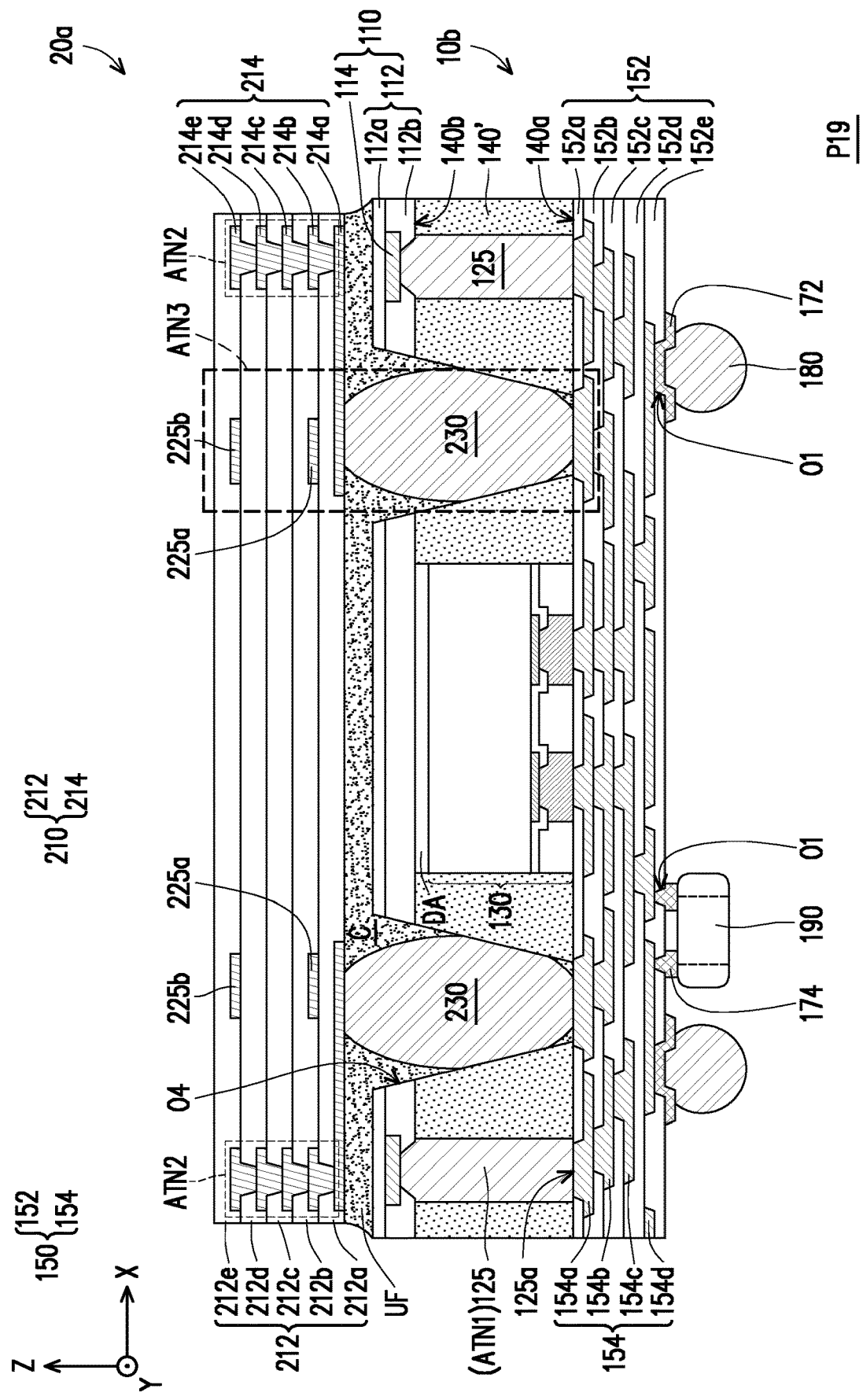
FIG. 35 is a schematic cross sectional view of a package structure according to some exemplary embodiments of the present disclosure.

FIG. 35 is a schematic cross sectional view of a package structure according to some exemplary embodiments of the present disclosure. Referring to FIG. 33 and FIG. 35 together, the package structure P17 depicted in FIG. 33 and the package structure P19 depicted in FIG. 35 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 33 and FIG. 35 together, the difference is that, for the package structure P19 depicted in FIG. 35, the second package 20a is bonded to the first package 10b by physically connecting the conductive joints 230 and the metallization layers 154 of the redistribution circuit structure 150.

In some embodiments, as shown in FIG. 35, before the second package 20a is placed on and mounted onto the first package 10b, a plurality of openings O4 are formed in the first package 10b, where the openings O4 penetrate the redistribution circuit structure 110 and the insulating encapsulation 140' to expose portions of the metallization layer 154a of the redistribution circuit structure 150. In some embodiments, the conductive joints 230 are respectively placed into the openings O4 and bonded on the exposed portions of the metallization layer 154a of the redistribution circuit structure 150 exposed by the openings O4. Owing to such configuration, the conductive joints 230 of the package structure P19 not only serve as a connecting structure of the package structure P19 but also serve as a part of the antenna ATN3. In other words, the UBM patterns 160, the antenna elements AE and/or conductive pillars 120 in the package structures P19 may be omitted. In some embodiments, as shown in FIG. 35, the conductive joints 230 are electrically connected to the semiconductor die 130 through the redistribution circuit structure 150 by physically connecting the metallization layer 154a.

In some embodiments, the openings O4 are, for example, formed by a laser drilling process, however the disclosure is not limited thereto. For example, in FIG. 35, only two openings O4 are shown, however the disclosure is not limited thereto. The number of the openings O4 may be one or more than one depending on the demand. In some embodiments, the openings O4 are located aside of and surround the semiconductor die 130, as shown in FIG. 35. In some embodiments, if considering the openings O4 are holes with substantially round-shaped in a top-view on the X-Y plane, each of the openings O4 includes a slant sidewall SS in a cross-section on a X-Z plane (or saying a Y-Z plane), where each of the openings O4 has a top opening having a top diameter and a bottom opening having a bottom diameter, and the top diameter is greater than the bottom diameter. However, the cross-sectional shape and/or the top view of the openings O4 are not limited to be round and may be elliptical, oval, tetragonal, octagonal or any suitable polygonal shape.

In certain embodiments, the antennas ATN2 (e.g. the metallization layers 214b-214e) are electrically connected to the semiconductor die 130 through the metallization layers 214a, the conductive joints 230, and the redistribution circuit structure 150, where the signal transmission between the semiconductor die 130 and the antennas ATN2 is ensured. For example, the metallization layer 214a electrically connected to the antennas ATN2 serve as a ground plate/line and a feed-line for the antennas ATN2. In some embodiments, the antennas ATN3 (e.g. the antenna elements 225a, and 225b aligned to and overlapped with each other along the stacking direction Z and/or a portion of the metallization layer 154a) are electrically connected to the semiconductor die 130 through the metallization layers 214a, the conductive joints 230, and the redistribution circuit structure 150, where the signal transmission between the semiconductor die 130 and the antennas ATN3 is ensured. For example, the redistribution circuit structure 150 electrically connected to the antennas ATN3 serve as a ground plate/line and a feed-line for the antennas ATN3. In some embodiments, the conductive joints 230 are not overlapped with the antennas ATN1 and the antennas ATN2 but overlapped with the antennas ATN3. For example, the positioning locations of the conductive joints 230 are located aside of the positioning locations of the antennas ATN1 and the positioning locations of the antennas ATN2 and are overlapped with the positioning locations of the antennas ATN3 along the stacking direction Z (e.g. on the vertical projection on the X-Y plane).

Moreover, in the package structure P19 as shown in FIG. 35, the openings O4, the gaps between the conductive joints 230, and the gaps between the conductive joints 230, the organic substrate 210, the first redistribution circuit structure 110, the insulating encapsulation 140' and the redistribution circuit structure 150 are filled-up by the underfill material UF, in some embodiments. In other words, for example, the underfill material UF covers the surfaces of the organic substrate 210 and the redistribution circuit structure 110 facing to each other and completely fills up the cavity C between the conductive joints 230, the organic substrate 210 and the redistribution circuit structure 110. Owing to underfill material UF, the bonding strength between the first package 10b and the second package 20a of the package structure P19 is further increased.

In the disclosure, for the antennas ATN3 depicted in the package structure P1 to the package structure P6 and the package structure P14 to the package structure P16, the antenna elements AE of the first package 10a/10b, in a manner of electrical coupling, transmits the electrical signals from the semiconductor die 130 of the first package 10a/10b to the antenna elements 225 (e.g. the antenna elements 225a) of the second package 20a/20b or transmits the electrical signals from the antenna elements 225 (e.g. the antenna elements 225a) of the second package 20a/20b to the semiconductor die 130 of the first package 10a/10b. In some embodiments, the positioning locations of the conductive joints 230 are located aside of the positioning locations of the antennas ATN1, the positioning locations of the antennas ATN2/ATN2' and the positioning locations of the antennas ATN3 along the stacking direction Z (e.g. on the vertical projection on the X-Y plane).

However, the disclosure is not limited thereto; and in an alternative embodiment, the antenna elements AE of the first package 10a/10b may transmit the electrical signals from the semiconductor die 130 of the first package 10a/10b to the antenna elements 225 (e.g. the antenna elements 225a) of the second package 20a/20b/20c or transmits the electrical signals from the antenna elements 225 (e.g. the antenna elements 225a) of the second package 20a/20b/20c to the semiconductor die 130 of the first package 10a/10b through physical connection by connectors there-between, see the package structure P7 to the package structure P13 and the package structure P17 to the package structure P19. With such physically connection, the positioning locations of the conductive joints 230 are located aside of the positioning locations of the antennas ATN1 and the positioning locations of the antennas ATN2/ATN2'/ATN2" but overlapped with the positioning locations of the antennas ATN3 along the stacking direction Z (e.g. on the vertical projection on the X-Y plane).

In an alternative embodiment, the antenna elements 225 of the second package 20c may also be electrically coupled to the antenna elements AE of the first package 10a/10b, the disclosure is not limited thereto. In addition, for example, the extending region ER may also be introduced to the second package 20b and the second package 20c depicted in the above embodiments.

Figure 36:
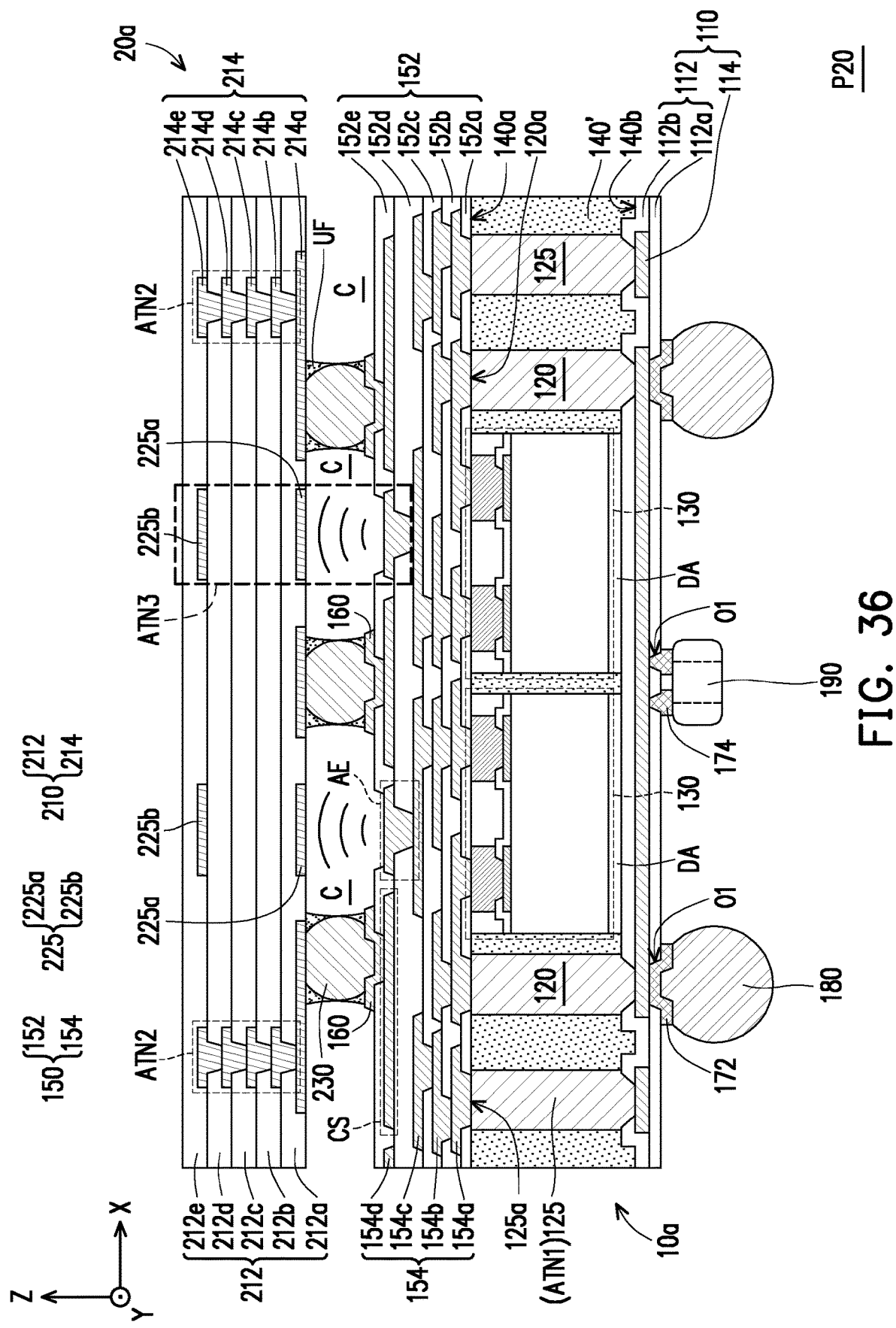
FIG. 36 is a schematic cross sectional view of a package structure according to some exemplary embodiments of the present disclosure.

FIG. 36 is a schematic cross sectional view of a package structure according to some exemplary embodiments of the present disclosure. Referring to FIG. 11 and FIG. 36 together, the package structure P1 depicted in FIG. 11 and the package structure P20 depicted in FIG. 36 are similar; such that the elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 11 and FIG. 36 together, the difference is that, for the package structure P20 depicted in FIG. 36, at least one semiconductor die 130 include a plurality of semiconductor dies 130. As shown in FIG. 36, for example, the semiconductor dies 130 are electrically communicated with each other through the redistribution circuit structure 150. In some embodiments, the semiconductor dies 130 may include the same or different types, and may be chips selected from digital chips (for example, a baseband chip), analog chips (for example, wireless and radio frequency chips) or mixed signal chips, ASIC chips, integrated passive devices (IPDs), sensor chips, memory chips, logic chips or voltage regulator chips. The disclosure is not limited thereto. In the disclosure, a single semiconductor die depicted in any one of the package structures P1-P19 may be substituted by a plurality of semiconductor dies depicted in the package structure P20 of FIG. 36. The number of the semiconductor dies may be, for example, one, two or more; the disclosure is not limited to thereto.

Figure 37:
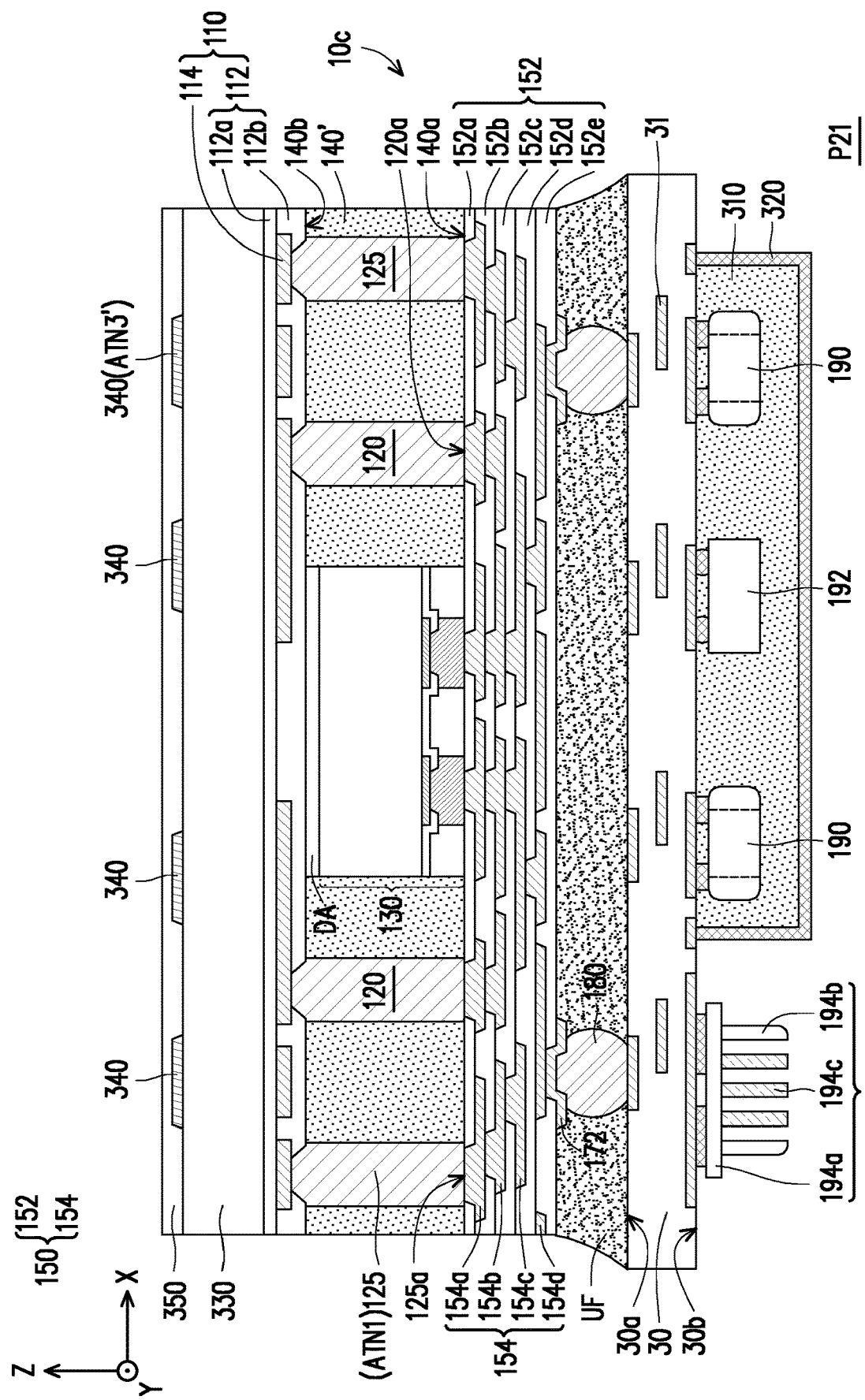
FIG. 37 is a schematic cross sectional view of a package structure according to some exemplary embodiments of the present disclosure.

FIG. 37 is a schematic cross sectional view of a package structure according to some exemplary embodiments of the present disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

In some embodiments, as shown in FIG. 37, an organic substrate 30 is provided to have a side 30a bonded with a first package 10c and a side 30b bonded with a connecting module 194, where the side 30a is opposite to the side 30b. In some embodiments, the organic substrate 30 is an organic circuit board having metal segments 31 configured for re-routing function. As shown in FIG. 37, the first package 10c is physically and electrically connected to the organic substrate 30 through the conductive elements 180 and the metal segments 31 distributed on the side 30a, and the connecting module 194 is electrically connected to the organic substrate 30 by physically connecting the metal segments 31 distributed on the side 30b. In some embodiments, the first package 10c is mounted onto the organic substrate 30 by directly connecting the conductive elements 180, where the conductive elements are, for example, BGA balls.

For example, the structure of the first package 10c is similar to the structure of the first package 10b, and the difference is that, in the first package 10c, the conductive elements 180 are connected to the redistribution circuit structure 150 through the UBM patterns 172, and there is no the conductive elements 180, the semiconductor devices 190, the UBM patterns 160, and the connection pads 174 disposed on the dielectric layer 112a of the redistribution circuit structure 110. Instead, as shown in FIG. 37, an insulating encapsulation 330 is formed on the redistribution circuit structure 110 and cover the dielectric layer 112a thereof, antenna elements 340 are formed on the insulating encapsulation 330, and a protection layer 350 is formed on the antenna elements 340 and cover the insulating encapsulation 330 exposed by the antenna elements 340, in some embodiments.

As shown in FIG. 37, the insulating encapsulation 330 is sandwiched between the redistribution circuit structure 110 and the antenna elements 340 and between the redistribution circuit structure 110 and the protection layer 350. In some embodiments, the antenna elements 340 are electrically coupled with the metallization layer 114 which serves as a feed-line for the antenna elements 340, and a portion of the metallization layer 114 overlapped with the antenna elements 340 serves as a ground plate for the antenna elements 340. In some embodiments, the metallization layer 114 is referred as a ground plate and/or a feed line of the antenna elements 340, where the antenna elements 340 are referred to as antennas ATN3'.

In some embodiments, the antenna elements 340 are formed by forming a metallization layer (not shown) by electroplating or deposition over the insulation encapsulation 330 and then patterning the metallization layer by photolithographic and etching processes. In an alternative embodiment, the antenna elements 340 are formed by forming a metallization layer (not shown) by plating process. In some embodiments, the material of the metallization layer includes aluminum, titanium, copper, nickel, tungsten, and/or alloys thereof. In some embodiments, the antenna elements 340 are arranged in form of a matrix, such as the N×N array or N×M arrays (N, M>0, N may or may not be equal to M). The size of the array for antenna elements 340 can be designated and selected based on the demand. In some embodiments, the antenna elements 340 may include patch antennas (having broadside radiation).

As shown in FIG. 37, for example, the antennas ATN3' are electrically connected to the semiconductor die 130 through the redistribution circuit structure 110, the conductive pillars 120 and the redistribution circuit structure 150, while the antennas ATN1 are electrically connected to the semiconductor die 130 through the redistribution circuit structure 150. Owing to the configuration of the antennas ATN3' in addition to the antennas ATN1, a coverage range of the electromagnetic waves in the package structure P21 is widely increased, and the performance (e.g. gain and bandwidth) and the efficiency of the antenna application of the package structure P21 is thus enhanced. In some embodiments, the gaps between the conductive elements 180 and the gaps between the conductive elements 180, the first package 10c and the organic substrate 30 are filled with the underfill material UF for enhancing the bonding strength between the first package 10c and the organic substrate 30. In an alternative embodiment, since the size of the first package 10c is smaller than the size of the organic substrate 30 on the X-Y plane, the underfill material UF may further cover a portion of sidewalls of the first package 10c.

In some embodiments, the connecting module 194 includes a circuit board 194a, a frame structure 194b, and a plurality of pins 194c, where the frame structure 194b and the pins 194c are located on the circuit board 194a, and the pins 194c are surrounded by the frame structure 194b. In some embodiments, the circuit board 194a includes an interconnection circuitry structure including metal layers and dielectric layers arranged in alternation. In some embodiments, the pins 194c are distributed over a surface of the circuit board 194a, where the pins 194c are electrically connected to the metal layers of the circuit board 194a, and a material of the pins 194c may include copper, copper alloy, or the like. In the disclosure, a dimension of the pins is significantly greater than a dimension of the metallization layers of the metallization layer 114 and metallization layers 154. In some embodiments, the frame structure 194b surrounds the pins 194c, where a material of the frame structure 194b may include a dielectric layer with suitable stiffness to protect the pins being damaged due to external forces. In one embodiment, the connecting module 194 may be a general radio frequency (RF) signal connector (multiple pins (3-16 pins)) or the like, however the disclosure is not limited thereto. As shown in FIG. 37, the connecting module 194 is electrically connected to the semiconductor die 130 through the metal segments 31, the conductive elements 180, and the redistribution circuit structure 150. Due to the connecting module 194, the package structure P21 is capable of being electrically connected to additional external electronic device(s) while maintaining an impact volume and a small form factor.

In some embodiments, at least one passive device 190 and/or at least one active device 192 are further included and mounted onto the side 30b of the organic substrate 30. For example, as shown in FIG. 37, two passive devices 190 and one active device 192 are shown for illustration purpose, and does not limit the disclosure. The number of the passive device and the number of the active device may be one or more than one. In some embodiments, the passive devices 190 and the active device 192 are physically and electrically connected to the metal segments 31 distributed on the side 30b. Due to the organic substrate 30, the passive devices 190 and the active device 192 are electrically connected to the semiconductor die 130 through the metal segments 31, the conductive elements 180, and the redistribution circuit structure 150. For example, the passive device may be a resistor, a capacitor, an inductor or the like. For example, the active device may be a semiconductor device or semiconductor die (similar to the type of the semiconductor die 130). The disclosure is not limited thereto.

In some embodiments, an insulating encapsulation 310 is formed on the side 30b of the organic substrate 30, where the passive devices 190 and the active device 192 are encapsulated in the insulating encapsulation 310. Owing to the insulating encapsulation 310, the passive devices 190 and the active device 192 are protected from being damaged by external force. In some embodiments, the side 30b of the organic substrate 30 is partially covered by the insulating encapsulation 310. For example, as shown in FIG. 37, the organic substrate 30 is located between the insulating encapsulation 140' and the insulating encapsulation 310, where the connecting module 194 is free of the insulating encapsulation 310, and the passive devices 190 and the active device 192 are encapsulated in the insulating encapsulation 310.

In some embodiments, an electromagnetic interference shielding layer 320 is formed on the insulating encapsulation 310, and is electrically connected to the metal segments 31 disposed on the side 30b of the organic substrate 30. As shown in FIG. 37, the electromagnetic interference shielding layer 320 completely wraps walls of the insulating encapsulation 310 and is distant from the connecting module 194, where the walls of the insulating encapsulation 310 are not contacting to the organic substrate 30. In some embodiments, the formation and material of the electromagnetic interference shielding layer 320 may be the same or similar to the formation and material of the electromagnetic interference shielding layer 300 described in FIG. 15, and thus is not repeated herein. In the disclosure, the electromagnetic interference shielding layer 320 prevents the passive devices 190 and the active device 192 being interfered by external signals. As shown in FIG. 37, for example, the active device 192, the connecting module 194, and the electromagnetic interference shielding layer 320 are electrically coupled to the semiconductor die 130 through the organic substrate 30, the UBM patterns 172, the conductive elements 180 and the redistribution circuit structure 150. Owing to such configuration, a reliability in the performance of the package structure P21 is also achieved.

Figure 38:
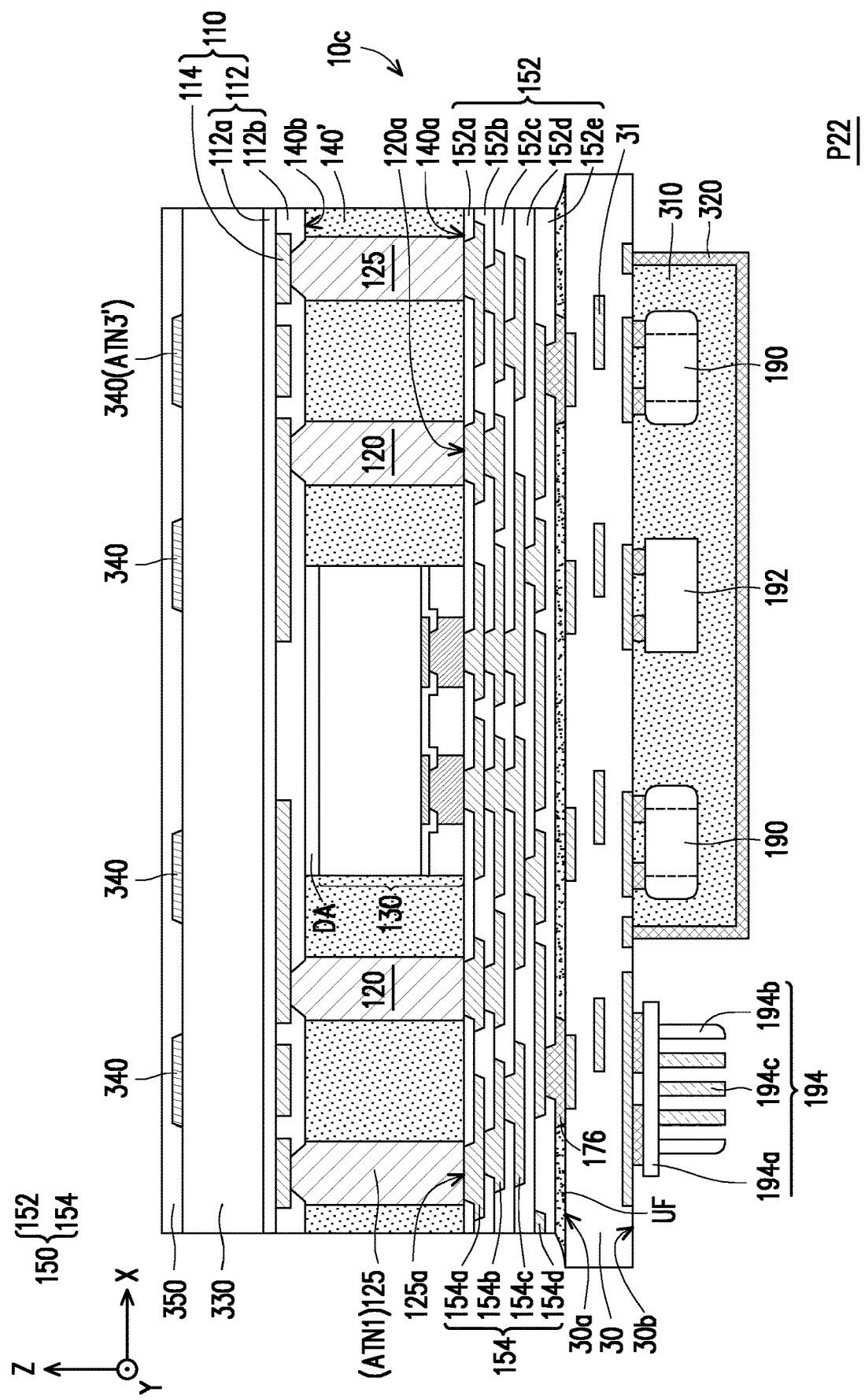
FIG. 38 is a schematic cross sectional view of a package structure according to some exemplary embodiments of the present disclosure.

FIG. 38 is a schematic cross sectional view of a package structure according to some exemplary embodiments of the present disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 37 and FIG. 38 together, the difference is that, for the package structure P22 depicted in FIG. 38, the UBM patterns 172 and the conductive elements 180 together are replaced by connection pads 176. For example, the connection pads 176 may be land grid array (LGA). As shown in FIG. 38, for example, the active device 192, the connecting module 194, and the electromagnetic interference shielding layer 320 are electrically coupled to the semiconductor die 130 through the organic substrate 30, the connection pads 176 and the redistribution circuit structure 150. Owing to such configuration, an overall thickness (along the stacking direction Z) of the package structure P22 may further be reduced.

Figure 39:
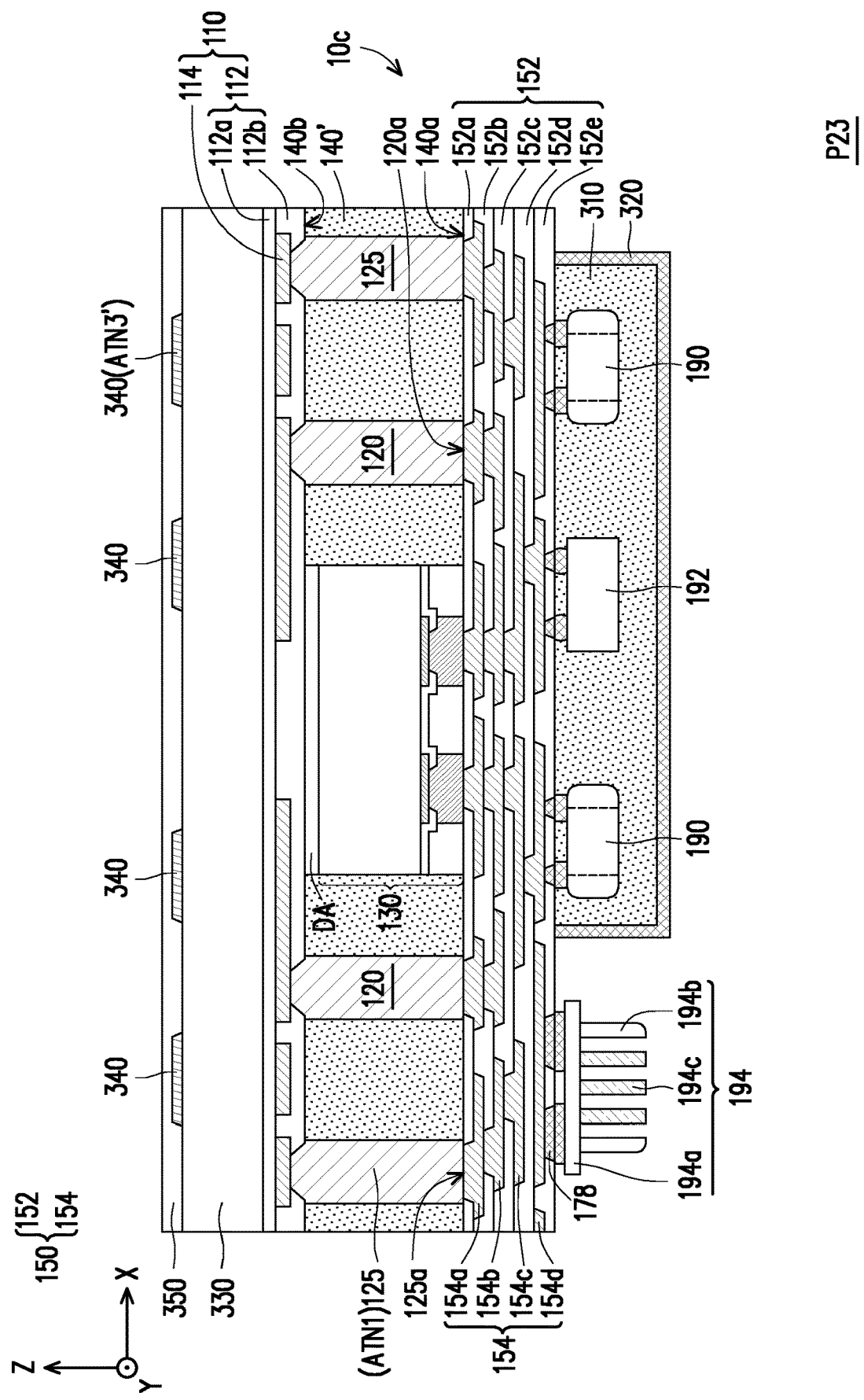
FIG. 39 is a schematic cross sectional view of a package structure according to some exemplary embodiments of the present disclosure.

FIG. 39 is a schematic cross sectional view of a package structure according to some exemplary embodiments of the present disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 37 and FIG. 39 together, the difference is that, for the package structure P23 depicted in FIG. 39, the UBM patterns 172 and the conductive elements 180 are together replaced by connection pads 178, and the organic substrate 30 is omitted from the package structure P23. For example, the connection pads 178 may be land grid array (LGA). In some embodiments, the passive devices 190, the active device 192, the connecting module 194, and the electromagnetic interference shielding layer 320 are in physical contact with the connection pads 178, and the insulating encapsulation 310 is directly formed on the redistribution circuit structure 150. As shown in FIG. 39, for example, the active device 192, the connecting module 194, and the electromagnetic interference shielding layer 320 are electrically coupled to the semiconductor die 130 through the connection pads 178 and the redistribution circuit structure 150. Owing to such configuration, an overall thickness (along the stacking direction Z) of the package structure P23 may further be reduced.

In the disclosure, the first package 10c depicted in FIG. 37, FIG. 38 and/or FIG. 39 may be replaced with any one of the package structures P1-P20. The disclosure is not limited to thereto.

In accordance with some embodiments, a package includes a semiconductor package including a semiconductor die and a first insulating encapsulation, a substrate, and a second insulating encapsulation. The first insulating encapsulation encapsulates the semiconductor die. The substrate includes a redistribution circuitry, wherein the substrate is electrically coupled to the semiconductor package through the redistribution circuitry. The second insulating encapsulation is disposed on and partially covers the substrate, wherein the substrate is sandwiched between the semiconductor package and the second insulating encapsulation.

In accordance with some embodiments, a package structure includes a first package and a second package. The first package includes a first redistribution circuit structure and a semiconductor die disposed on and electrically coupled to the first redistribution circuit structure. The second package includes antennas and conductive joints, wherein the second package is bonded to the first package by connecting the conductive joints to the first redistribution circuit structure, and the antennas are electrically coupled to the semiconductor die.

In accordance with some embodiments, a method of manufacturing package structure includes the following steps, providing a first package including a redistribution circuit structure having connecting regions and a semiconductor die disposed on and electrically coupled to the redistribution circuit structure; providing a second package including antennas and conductive joints; and aligning the conductive joints of the second package to the connecting regions of the first package and bonding the second package on the first package through connecting each of the conductive joints to a respective one of the connecting regions, and the antennas being electrically coupled to the semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
  a first package, comprising:
    a first redistribution circuit structure;
    a semiconductor die, disposed on and electrically coupled to the first redistribution circuit structure, the semiconductor die having a first surface distributed with a plurality of conductive vias;
    antenna elements, embedded in the first redistribution circuit structure and electrically connected to the semiconductor die; and
    an insulating encapsulation, disposed on the first redistribution circuit structure and encapsulating the semiconductor die, wherein the first surface of the semiconductor die is substantially level with a second surface of the insulating encapsulation; and
  a second package, comprising first antennas and conductive joints, wherein the second package is bonded on the first package by connecting the conductive joints to the first redistribution circuit structure, and the first antennas are electrically coupled to the semiconductor die,
  wherein each of the antenna elements is mechanically connected to a respective one of the conductive joints, each of the first antennas comprised in the second package is electrically connected to a respective one of the antenna elements comprised in the first package in a manner of physical connection through the conductive joints.

2. The package structure of claim 1, wherein the first package further comprises:
   through vias, encapsulated in the insulating encapsulation and arranged aside of the semiconductor die, wherein the through vias are electrically coupled to the semiconductor die through the first redistribution circuit structure;
   a second redistribution circuit structure, disposed on the insulating encapsulation and electrically coupled to the semiconductor die through the through vias and the first redistribution circuit structure; and
   conductive elements, disposed on the second redistribution circuit structure and electrically coupled to the semiconductor die, wherein the second redistribution circuit structure is sandwiched between the semiconductor die and the conductive elements,
   wherein the insulating encapsulation is sandwiched between the first redistribution circuit structure and the second redistribution circuit structure, and the first redistribution circuit structure is in contact with the semiconductor die.

3. The package structure of claim 2, wherein the first package further comprises:
   conductive balls, disposed on and connected to the conductive elements, wherein the conductive elements are sandwiched between and electrically connected to the second redistribution circuit structure and the conductive balls.

4. The package structure of claim 1, wherein the first package further comprises:
   a second redistribution circuit structure, disposed on the insulating encapsulation and electrically connected to the semiconductor die;
   through vias, encapsulated in the insulating encapsulation and arranged aside of the semiconductor die, wherein the through vias are electrically coupled to the semiconductor die through the second redistribution circuit structure; and
   conductive elements, disposed on the second redistribution circuit structure and electrically coupled to the semiconductor die, wherein the second redistribution circuit structure is sandwiched between the semiconductor die and the conductive elements,
   wherein the insulating encapsulation is sandwiched between the first redistribution circuit structure and the second redistribution circuit structure, and the first redistribution circuit structure is electrically coupled to the semiconductor die through the through vias and the second redistribution circuit structure.

5. The package structure of claim 4, wherein the first package further comprises:
   conductive balls, disposed on and connected to the conductive elements, wherein the conductive elements are sandwiched between and electrically connected to the second redistribution circuit structure and the conductive balls.

6. The package structure of claim 1, wherein a lateral size of the second package is greater than a lateral size of the first package.

7. The package structure of claim 1, wherein a lateral size of the second package is less than a lateral size of the first package.

8. The package structure of claim 1, further comprising a plurality of dipole antennas in at least one of the first package and the second package.

9. The package structure of claim 1, wherein the first package further comprises connecting structures embedded in the first redistribution circuit structure and electrically connected to the semiconductor die, wherein each of the connecting structures is spaced apart from a metal trace of the first redistribution circuit structure underlying thereto through a gap ranging from 60 µm to 80 µm,
   wherein the first surface is free of the insulating encapsulation, and
   wherein the first redistribution circuit structure is connected to the first surface to the second surface.

10. The package structure of claim 1, further comprising:
    a underfill, disposed in a gap between the first package and the second package and wrapping sidewalls of the conductive joints.

11. The package structure of claim 10, wherein:
    the underfill extends onto a sidewall of the first package; or
    the underfill extends onto a sidewall of the first package and a side of the first package, the side of the first package is opposite to the second package.

12. A package, comprising:
    a package structure as claimed in claim 1, wherein the package structure further comprises conductive elements disposed on the first redistribution circuit structure and electrically connected to the semiconductor die; and
    an organic substrate comprising a redistribution circuitry, wherein the package structure is disposed on and electrically connected to the organic substrate through connecting the first redistribution circuit structure and the redistribution circuitry.

13. A method of manufacturing a package structure, comprising:
    providing a first package comprising a first redistribution circuit structure, a semiconductor die disposed on and electrically coupled to the first redistribution circuit structure and having a first surface distributed with a plurality of conductive vias, antenna elements embedded in the first redistribution circuit structure and electrically connected to the semiconductor die, and an insulating encapsulation disposed on the first redistribution circuit structure and encapsulating the semiconductor die, wherein the first surface of the semiconductor die is substantially level with a second surface of the insulating encapsulation;
    providing a second package comprising first antennas and conductive joints; and
    aligning the conductive joints of the second package to the antenna elements of the first package and bonding the second package on the first package through connecting the conductive joints to the first redistribution circuit structure, and the first antennas being electrically coupled to the semiconductor die, wherein each of the antenna elements is mechanically connected to a respective one of the conductive joints, each of the first antennas comprised in the second package is electrically connected to a respective one of the antenna elements comprised in the first package in a manner of physical connection through the conductive joints.

14. The method of claim 13, further comprising:
    forming dipole antennas in at least one of the first package and the second package, the dipole antennas electrically coupled to the semiconductor die.

15. The method of claim 13, further comprising:

disposing an underfill in a gap between the first package and the second package, wherein:

the underfill extends onto a sidewall of the first package; or the underfill extends onto a sidewall of the first package and a side of the first package, the side of the first package is opposite to the second package.

16. The method of claim 13, further comprising:

providing an organic substrate; and mounting the first package onto a first side of the organic substrate through connectors there-between.

17. A package structure, comprising:

a first package, comprising:
- a first redistribution circuit structure;
- a semiconductor die, disposed on and electrically coupled to the first redistribution circuit structure; and
- a plurality of antenna elements, embedded in the first redistribution circuit structure and electrically connected to the semiconductor die; and a second package, electrically coupled to and bonded to the first package, comprising:
- at least one first antenna, comprising a first antenna element and a second antenna element electrically coupled to and vertically spacing apart from the first antenna element, wherein a projection of the first antenna element and a projection of the second antenna element being aligned to each other in a stacking direction of the first package and the second package; and
- a plurality of conductive joints, connecting to the plurality of antenna elements, wherein in the stacking direction, the projection of at the first antenna element and the projection of the second antenna element are aligned to a projection of a respective one of the plurality of antenna elements.

18. The package structure of claim 17, further comprising:

an underfill, covering sidewalls of the plurality of conductive joints, wherein an air gap is between the first package and the second package.

19. The package structure of claim 17, further comprising:

an underfill, covering sidewalls of the plurality of conductive joints, wherein no air gap is between the first package and the second package.

20. The package structure of claim 17, wherein the plurality of conductive joints comprises a plurality of conductive balls.

* * * * *